United States Patent [19]

Fasang

[11] 4,433,413
[45] Feb. 21, 1984

[54] BUILT-IN APPARATUS AND METHOD FOR TESTING A MICROPROCESSOR SYSTEM

[75] Inventor: Patrick P. Fasang, Mount Laurel, N.J.

[73] Assignee: Siemens Corporation, Iselin, N.J.

[21] Appl. No.: 314,044

[22] Filed: Oct. 22, 1981

[51] Int. Cl.³ .................... G06F 11/00; G01R 31/28
[52] U.S. Cl. .................................. 371/25; 371/16; 364/900
[58] Field of Search ............... 371/16, 25; 364/900; 324/73 R

[56] References Cited

U.S. PATENT DOCUMENTS

| | | | |
|---|---|---|---|
| 4,320,509 | 3/1982 | Davidson | 371/25 |
| 4,334,307 | 6/1982 | Bourgeois et al. | 371/16 |
| 4,339,801 | 7/1982 | Hosaka et al. | 371/16 |
| 4,340,857 | 7/1982 | Fasang | 324/73 R |
| 4,347,608 | 8/1982 | Appiano et al. | 371/16 |

OTHER PUBLICATIONS

H. Nadig, Testing a Microprocessor Product Using a Signature Analyzer, 1978 Semiconductor Test Conference, Cherry Hill, N.J., Oct.-Nov. 1978, pp. 158-169.
A Designer's Guide to Signature Analysis, Application Note 222, Hewlett-Packard, Received in P.T.O., Jan. 6, 1981, pp. 1-50.
Benowitz et al., An Advanced Fault Isolation System for Digital Logic, IEEE Trans. on Computers, vol. C-24, No. 5, May 1975, pp. 489-497.
Gordon et al., Hexadecimal Signatures Identify Troublespots in Microprocessor Systems, Electronics, Mar. 3, 1977, pp. 89-96.

Primary Examiner—Charles E. Atkinson
Attorney, Agent, or Firm—Karl F. Milde, Jr.

[57] ABSTRACT

Built-in test apparatus is provided for testing the overall functional operation of a microprocessor system which has microprocessor, RAM, PROM, address latch, I/O, timer, multiple bus arbitration and other circuits in it. To the microprocessor system are added a pseudo-random pattern generator (PRPG), a signature register (SR), supplemental control logic, serial and parallel I/O port test logic and an LED display. The system PROM is programmed with test instructions. Test input data is provided by the test instructions and the PRPG. Test output data is processed by the SR and the system microprocessor, and the test results are presented on the display.

10 Claims, 31 Drawing Figures

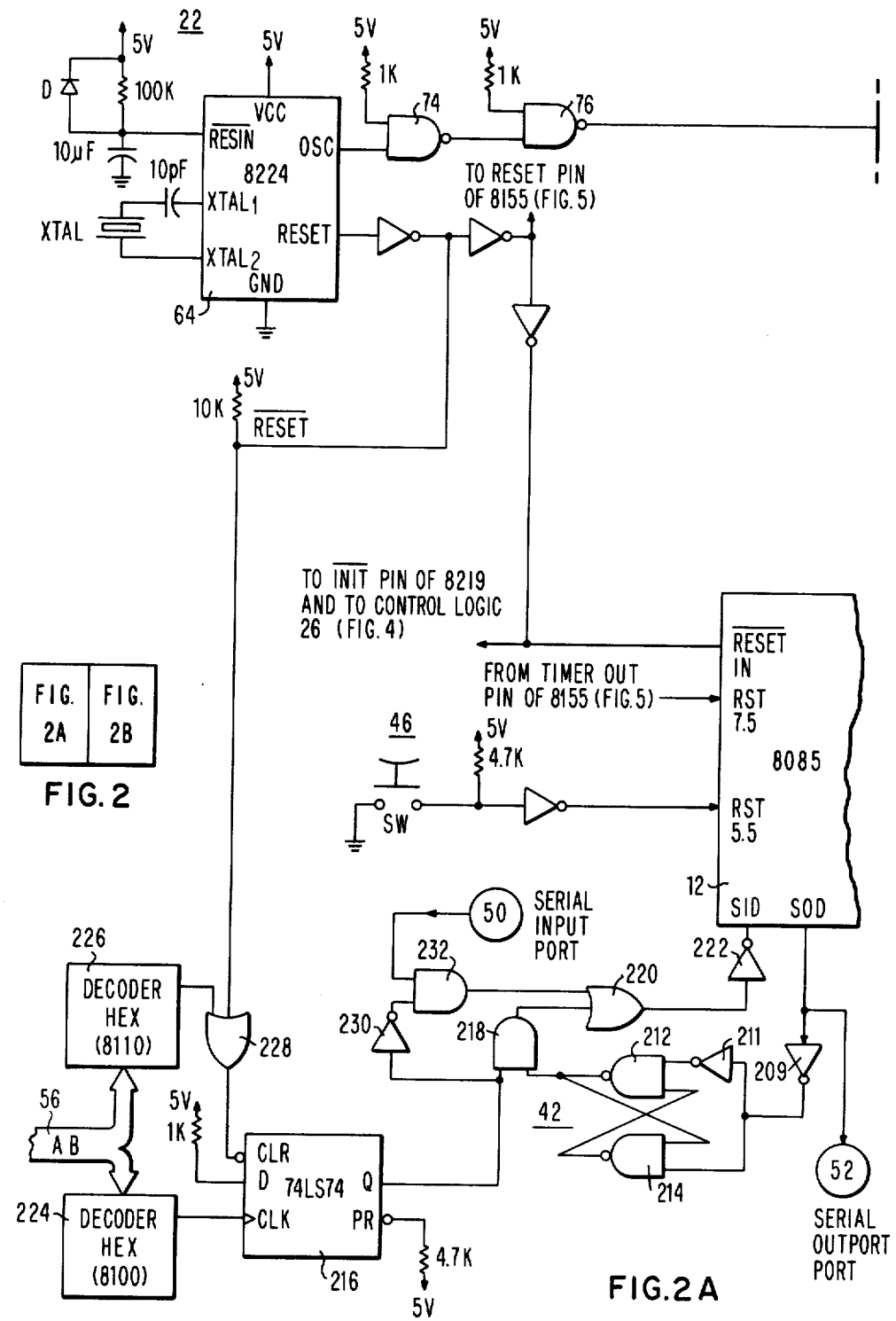

| FIG. 4A | FIG. 4B |

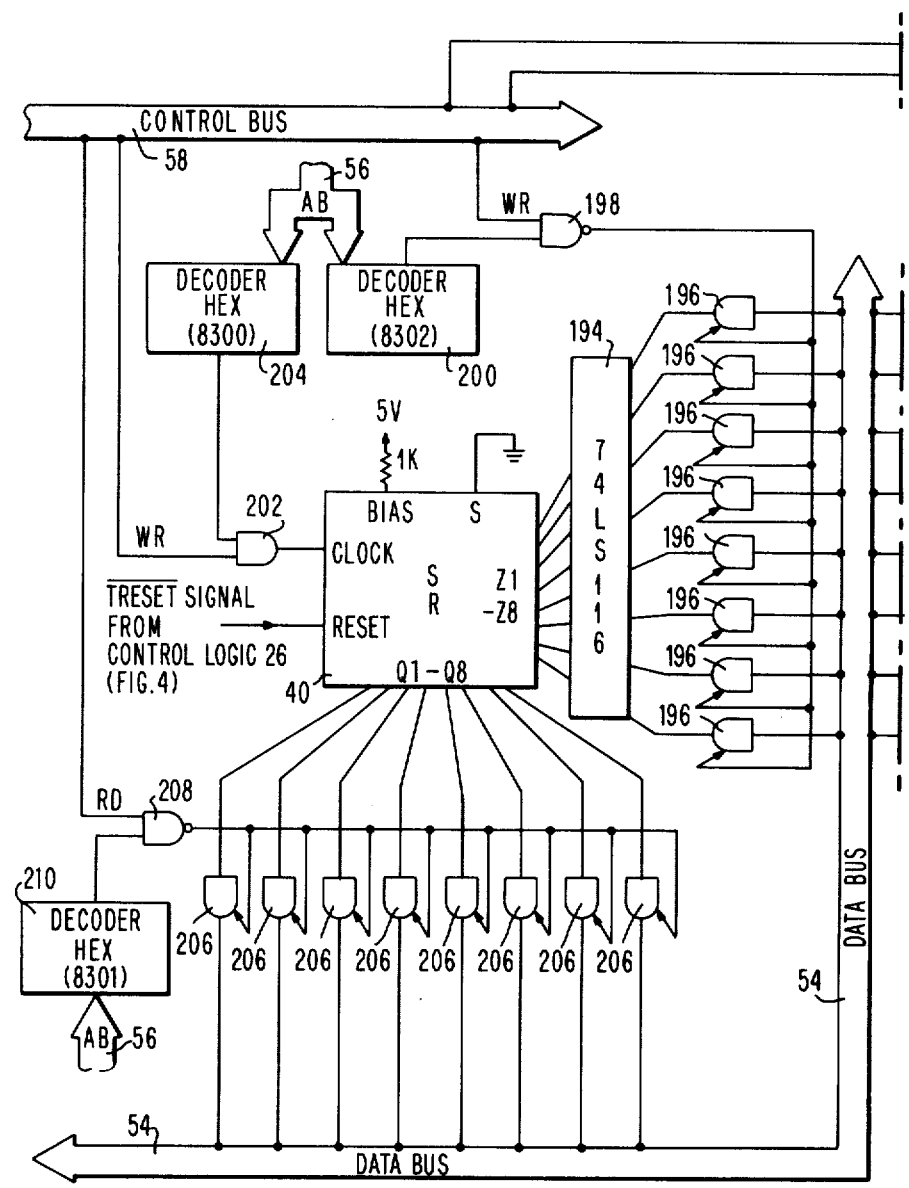
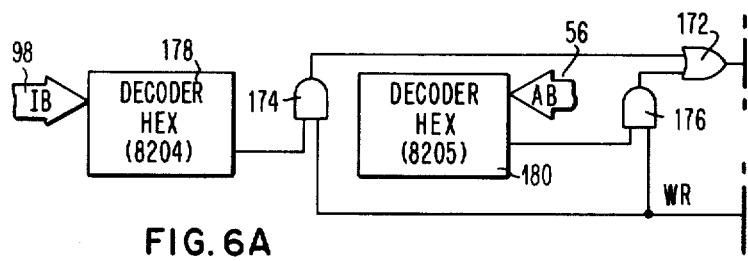
FIG. 6A
FIG. 6

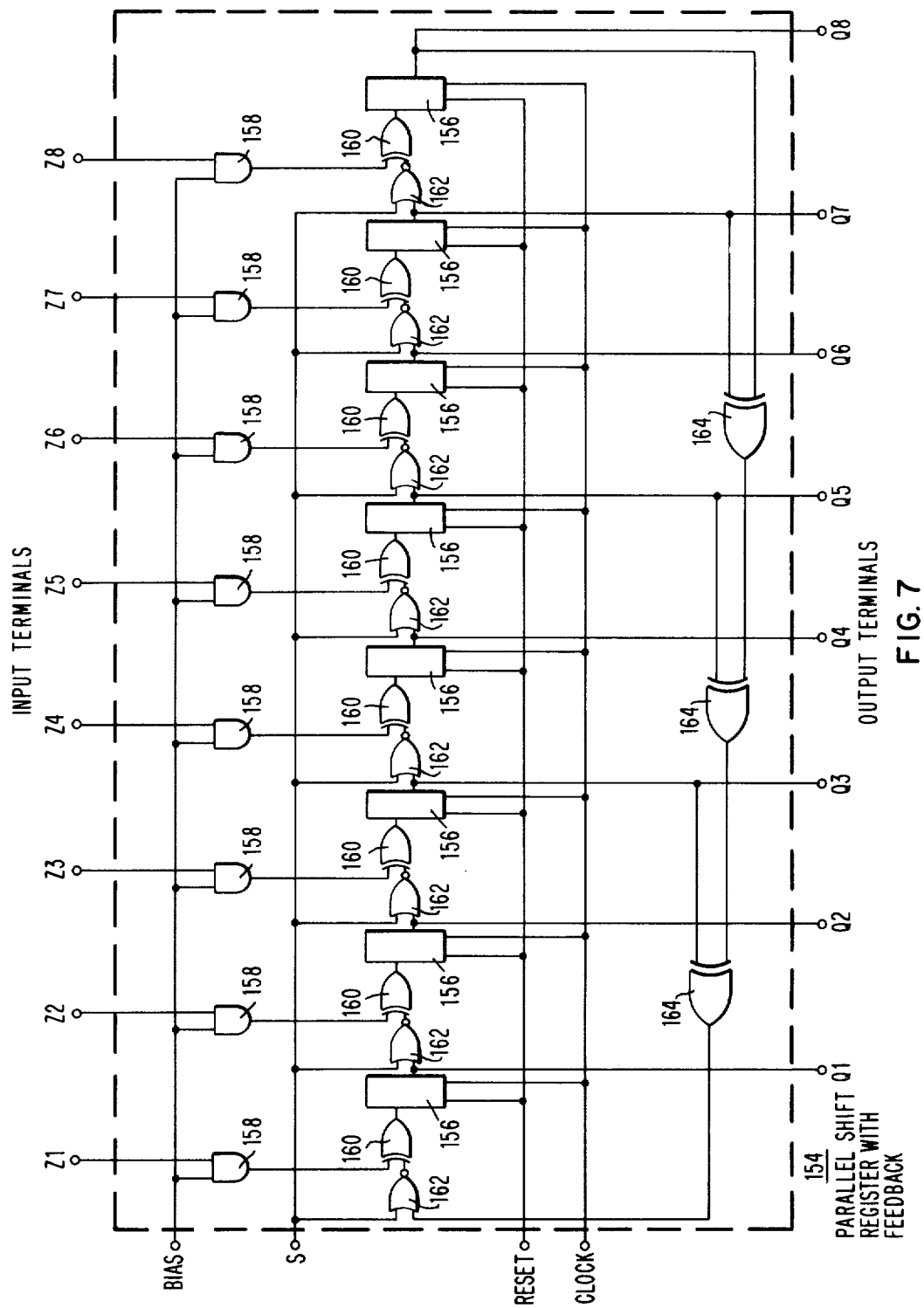

PROM TEST

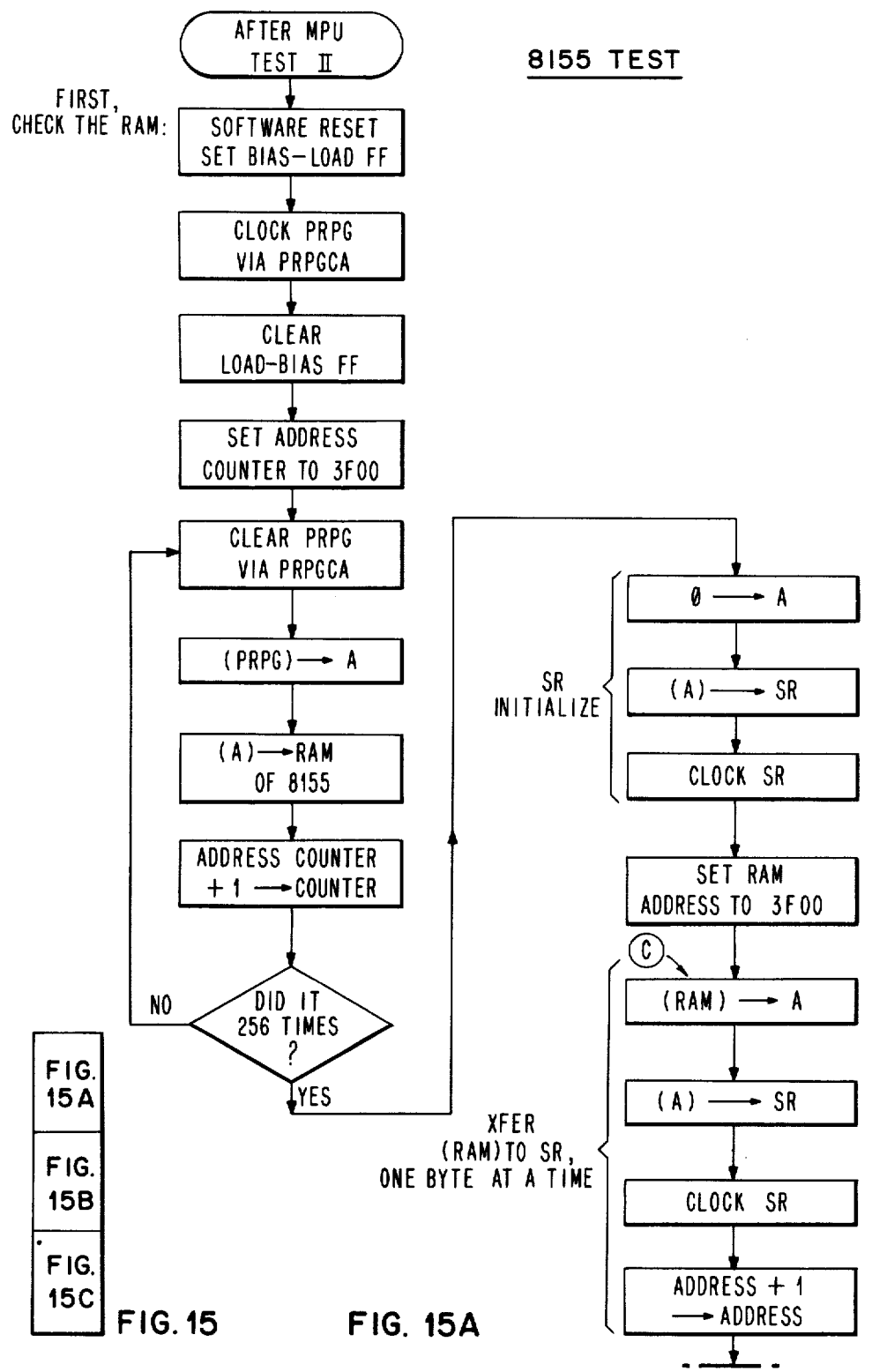

8155 TEST CONTINUED

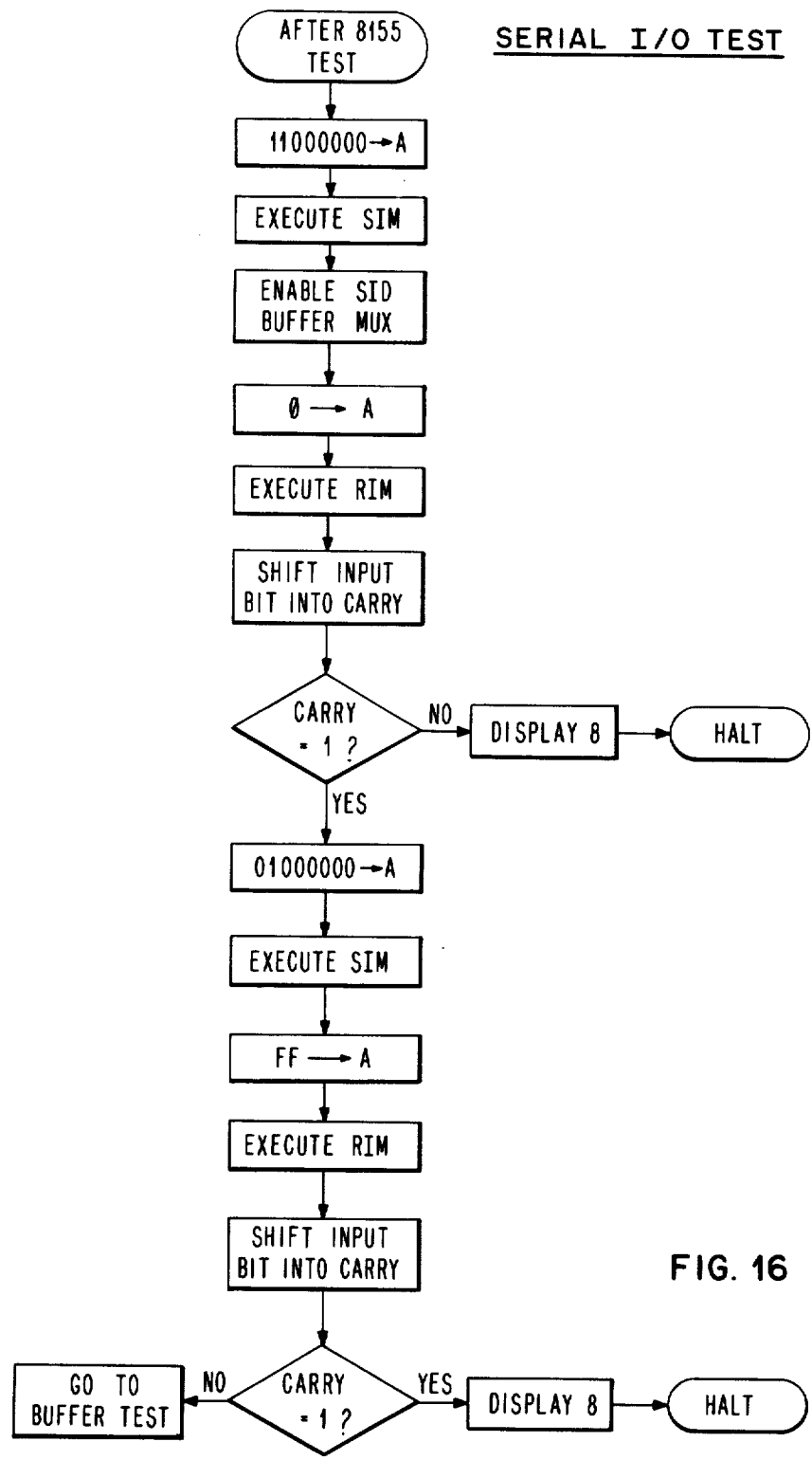
FIG. 16 SERIAL I/O TEST

8219 MULTIBUS TEST

BUILT-IN APPARATUS AND METHOD FOR TESTING A MICROPROCESSOR SYSTEM

BACKGROUND OF THE INVENTION

1. Field of the Invention

This invention relates to an apparatus and a method for testing the functional operation of a microprocessor system.

2. Description of the Prior Art

The functional operation of a microprocessor system involves the manipulation of data in the form of electrical signals which are transferred within the system along a data bus to locations specified by addresses in the form of electrical signals conveyed along an address bus. The operations are under the control of instructions in the form of other electrical signals passing along the data bus with the status of the processor being determined by electrical signals conveyed along a control bus. Microprocessor systems include a plurality of components, such as microprocessor units, read-only and random access storage memories (ROM's and RAM's), serial and parallel input/output data transfer registers, digital control logic circuits, clock pulse generators, bus drivers and so forth. The testing of the functional operation of such components in their system environment requires stepping the system through a sequence of test instructions and verifying that the operations specified by the instructions are performed correctly.

Conventional testing of the functional operation of a microprocessor system is done with off-line external testing equipment. A predesignated sequence of test instructions is communicated to the system from outside, along with designated test data. The response of the system to the test instructions is then monitored by reading the data resulting from the functional operation of the system acting upon the test input data out of the system. Comparison is then made of the output data from the test with reference data representative of the data output of error-free functional operation of the system.

Testing of a microprocessor system in the manner described using external test equipment has certain disadvantages. The data communication between the on-board components of the microprocessor system is very fast. However, the transfer of information across the interface between the external test equipment and the microprocessor system is relatively slow. Thus, using external test equipment, tests must be repeated or the operations looped to give sufficient time for the status of the system to be monitored. Furthermore, most external test equipment receives test result data from the microprocessor system being tested in serial form which complicates the testing of the correctness of parallel transmission of information within the system. Also, since information within the system can be travelling close to the speed of light, there are some tests that would be difficult to perform in real time using external equipment because the input/output processing of information to the test equipment is too slow.

The use of external test equipment to verify the functional operation of a microprocessor system requires that the external test equipment be connected to the system. Thus, tests of microprocessor systems installed in inconvenient or remote locations may not be possible or cannot be performed frequently. Also, the operation of such external equipment may require the degree of sophistication of a skilled technician who may not always be available. External test equipment generally tends to be of a general purpose type and includes capabilities and components that are superfluous for a specific test conducted on a specific microprocessor system.

Software testing routines have been developed for implementation in microprocessor systems whereby the microprocessor can check the accuracy of its information transmission paths. Such tests include parity checks, and the like, which have somewhat limited usefulness. They do not verify the correctness of the functional operations of the total system in the manipulation of actual data to determine whether the correct results are achieved.

A built-in technique for testing the functioning of a logic circuit has been proposed in Koenemann, et al., "Built-In Logic Block Observation Techniques", in Proc. 1979 IEEE Test Conference, Cherry Hill, N.J., IEEE, New York, N.Y., Session 2, pages 37–41. The proposed concept utilizes a circuit called a "built-in logic block observer" or "BILBO". The BILBO has a series of flip-flops arranged in stepping order and also to receive direct inputs, so that the output state of the BILBO depends on both its present inputs and its state history. The output of one BILBO is applied as a data input to a digital logic circuit and the output of the digital logic circuit is applied as the input to a second BILBO. As a sequence of numbers is generated by the first BILBO, the output of the first BILBO is fed to the logic circuit. With each output of the logic circuit an input is fed into the second BILBO which represents the response of the logic circuit to each input received from the first BILBO. At the conclusion of the testing procedure, a single state is available for output from the second BILBO which is derived from the last input and all preceeding inputs to the second BILBO. In this manner, a single output signature is produced that is characteristic of the successive responses of the logic circuit to the entire test sequence. This single output signature can then be compared at the conclusion of the test sequence to the predicted test output signature for an error-free digital logic circuit. The coincidence or disparity of the test output with the predicted output determines whether the circuitry is operating correctly.

The test circuitry proposed by Koenemann, et al. is intended to reside on the same integrated circuit chip with a microprocessor or other primary component such as the microprocessor. The control signal for generating the pseudo-random test data must, however, be received from outside the chip and the second BILBO output must be read out and processed outside the chip in order to evaluate the test results. Further, since the construction of the BILBO proposed by Koenemann does not provide address or control information to the tested circuit, it is unsuitable for diagnosing the functional operation of a total microprocessor system. The testing of the functional operation of a total microprocessor system requires instructions, the generation of addresses as well as test data, and the monitoring of signals as they move throughout the system. The Koenemann device does not provide this.

SUMMARY OF THE INVENTION

The present invention provides built-in apparatus and a method for testing the overall functional operation of a microprocessor system.

In accordance with one aspect of the invention, the apparatus includes means built into the system for specifying a sequence of test instructions to be performed by the system. The apparatus also includes means built into the system for providing test input data to be acted upon by the system under control of the test instructions. Switch means serves to initiate a test. Built-in data acquiring means serves to acquire the test output data resulting from the functional operation of the system as it acts upon the test input data under the control of the specified test instructions. Built-in data processing means serves to process the acquired test output data in order to determine the coincidence or disparity of that data with predetermined or reference data representative of the data that would have been acquired if the functional operation of the system were error-free. Lastly, the apparatus includes on-board means for communicating to the outside world (i.e. outside the system) the coincidence or disparity thus determined.

In a preferred embodiment described in detail below, the built-in testing apparatus includes a read-only memory storage device for specifying the sequence of test instructions; a pseudo-random number generator for providing test input data; a signature register for acquiring and compressing into a test signature test output data that results from the test; a comparator (preferably the microprocessor itself) to determine the coincidence or disparity of the developed test signature with a stored predetermined test signature; and a light emitting diode display which conveys information on the test results to the outside world.

In another aspect of the invention, the means for processing the acquired test results includes means for identifying that part of the system which contains an identified fault (i.e. the part that causes a disparity between the test output data and the reference data), and the communicating means includes means for communicating the identity of that part to the outside world.

In a further aspect of the invention a method is provided for testing the overall functional operation of a microprocessor system. The method includes internally specifying a sequence of test instructions to be performed by the system in response to a test initiation signal from the outside world; internally providing test input data to be acted upon by the system under control of the test instructions; internally acquiring test output data resulting from the functional operation of the system acting upon the generated data under control of the specified test instructions; internally processing the test output data to determine the coincidence or disparity of the test output data with reference data representative of the test output data that would have been acquired if the functional operation of the system were error-free; and communicating the coincidence or disparity determined to the outside world.

There have thus been outlined rather broadly certain objects, features and advantages of the invention in order that the detailed description that follows may be better understood, and in order that the present contribution to the art may be better appreciated. There are, of course, additional features of the invention that will be described more fully hereinafter. Those skilled in the art will appreciate that the conception on which this disclosure is based may readily be utilized as the basis for the designing of other arrangements for carrying out the purposes of this invention. It is important, therefore, that this disclosure be regarded as including all such equivalent arrangements that encompass the spirit and scope of the invention.

BRIEF DESCRIPTION OF THE DRAWINGS

An embodiment of the apparatus of the invention has been chosen for purposes of illustration and description of both the apparatus and the method of the invention, and is shown in the accompanying drawings forming a part of the specification, wherein:

FIG. 7 is a block diagram of the parallel shift register with feedback employed in the system of FIG. 1.

FIG. 16 is a flow-chart of a serial input/output test in the microprocessor system of FIG. 1.

Addresses are designated throughout in hexadecimal notation.

DESCRIPTION OF THE PREFERRED EMBODIMENT

Figure 1:
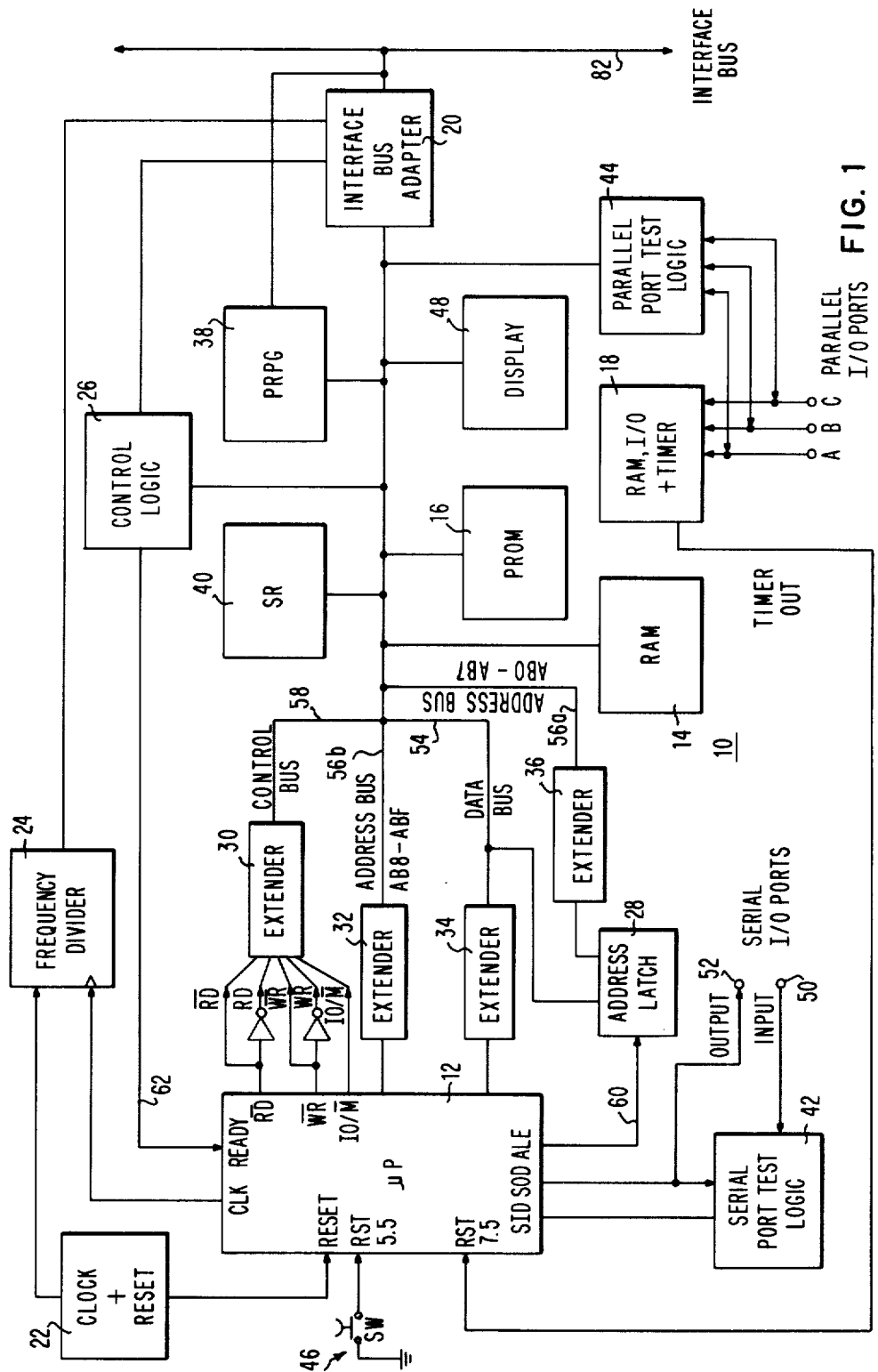
FIG. 1 is a block diagram of a microprocessor system including built-in testing apparatus in accordance with the present invention.

FIG. 1 shows test apparatus in accordance with the present invention built into the environment of a typical microprocessor system 10.

The microprocessor system 10 has the features of a general purpose microcomputer and includes a microprocessor 12 electrically connected by means of address, data and control lines with a random access memory (RAM) storage device 14; a programmable read-only memory (PROM) storage device 16; a combination RAM, I/O and timer element 18 (in the form of an Intel 8155 chip described more fully below); and an interface bus adapter 20. Additional components included in the system 10 are clock & reset circuitry 22, frequency divider circuitry 24, control logic circuitry 26, an address latch 28 and extenders 30, 32, 34 and 36.

Further components are integrated into the microprocessor system 10 in order to implement the present invention. Such components are a pseudo-random pattern generator (PRPG) 38, a signature register (SR) 40, serial port test logic circuitry 42, parallel port test logic circuitry 44, a test initiation switch (SW) 46 and a display 48. The control logic circuitry 26 is also supplemented to provide additional control circuits for testing purposes.

The microprocessor 12 (see FIG. 2) is an Intel 8085 single chip 8-bit N-channel microprocessor. Serial input data (SID) and serial output data (SOD) pins provide the capability for direct serial data communication with the outside world via system serial input and output ports 50 and 52 without the necessity for peripheral components to convert data from serial format to parallel format, and vice versa.

The microprocessor 12 serves as the brain of the microprocessor system 10. The multiplexed address-/data bus line pins $AD_0$–$AD_7$ (FIG. 2) of the microprocessor 12 are connected by means of the extender 34, which takes the form of two parallely connected 4-bit Motorola MC 6889/MC8T28 bidirectional non-inverting bus drivers, to the data lines $DB_0$–$DB_7$ of the system bidirectional data bus 54. The pins $AD_0$–$AD_7$ are also connected via the address latch 28 to provide the lower 8 bits (lines $AB_0$–$AB_7$ indicated by reference numeral 56a in FIGS. 1 and 2) of the system address bus line 56. The address latch 28 may take the form of an 8-bit input/output port, such as an Intel 8212 with its DS1 (device select) and MD (mode) pins connected "low", its DS2 (device select) pin connected "high" and its STB (strobe) pin connected to receive clock signals from the ALE (address latch enable) output pin of the microprocessor 12. The address latch 28 serves to capture the address portion of the multiplexed address/data information transmitted from the $AD_0$–$AD_7$ pins of the microprocessor 12. The captured information is transmitted from the address latch 28 to the system address bus 56 over the extender 36, which is a Motorola MC6882B/MC3482B 8-bit unidirectional non-inverting bus driver or the like. The upper (or most significant) 8 bits of the system address data bus 56 (lines $AD_8$–$AB_F$ indicated by reference numeral 56b in FIGS. 1 and 2) are obtained over the extender 32 directly from the $A_8$–$A_{15}$ address bus pins of the microprocessor 12. The extender 32 is of the same type as the extender 36.

Figure 2B:
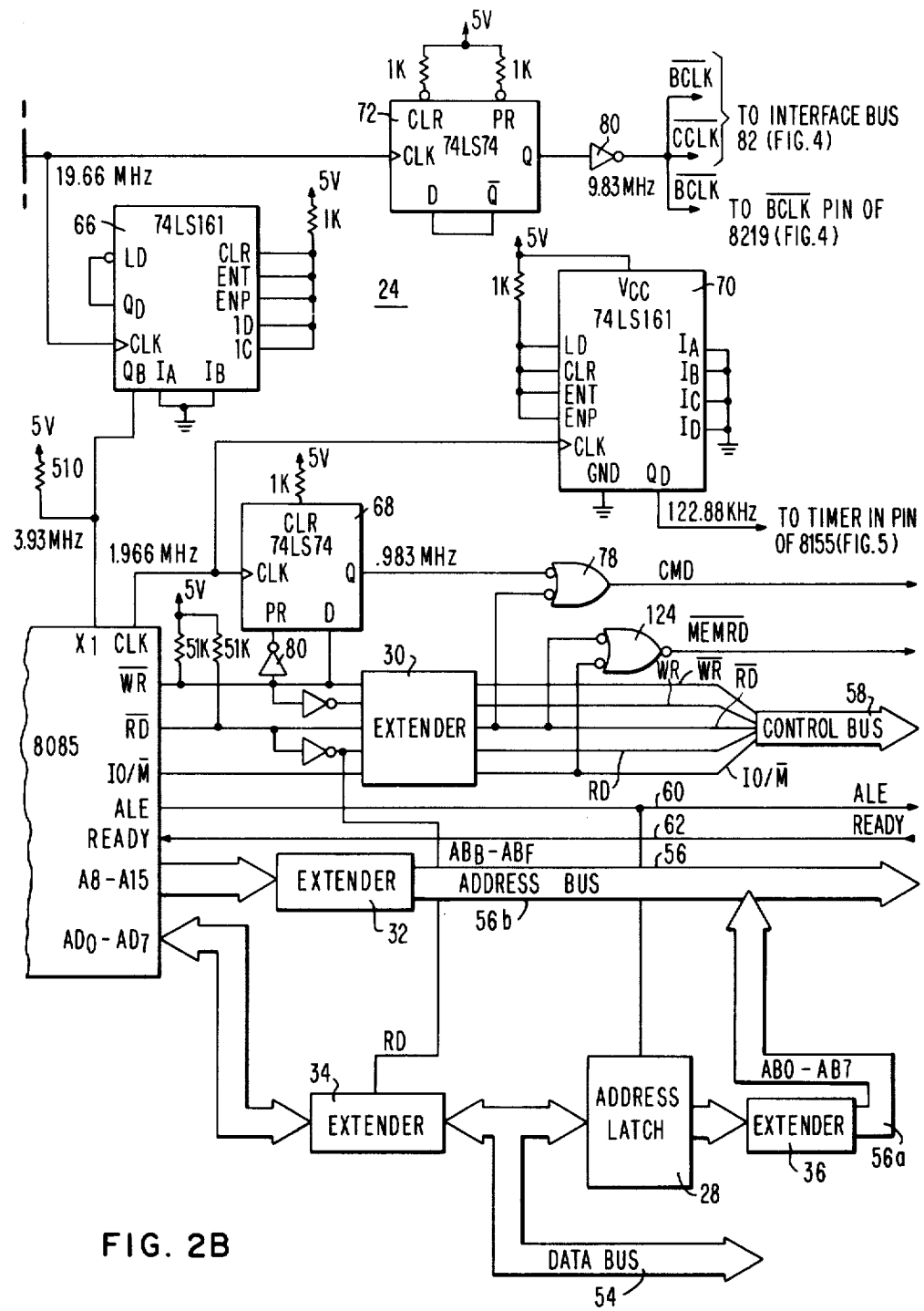
FIG. 2, which consists of FIG. 2A and FIG. 2B, is a block diagram of a portion of the microprocessor system of FIG. 1 including the microprocessor and certain elements connected thereto.

The WR (write control), RD (read control) and IO/M (input/output, memory access machine cycle status indicator) pins of the microprocessor 12 are connected through the extender 30 to provide control signals to the system 10 along the system control bus 58. The extender 30 is a Motorola MC 6882B/MC 3482B 8-bit unidirectional non-inverting driver or similar device. The WR and RD pins of the microprocessor 12 are each connected both directly and by means of an inverter to separate input pins of the extender 30. The extender 30 thus provides WR, WR, RD, RD and IO/U control signal line outputs to the system control bus 58. As shown in FIG. 2, the WR and RD pins of the microprocessor 12 are connected by means of 51 K-ohm pull-up resistors to a 5-volt voltage source.

The ALE pin of the microprocessor 12 in addition to being connected to the address latch 28 is connected to an ALE system control line 60 to provide ALE control signals from the microprocessor 12 throughout the system 10. A READY system control line 62 is connected to the READY pin of the microprocessor 12 and serves to deliver signals from memory and other peripheral devices in the system 10 to the microprocessor 12 to indicate that they are ready to send or receive data. The $X_1$ (crystal) input pin of the microprocessor 12 is connected to receive external clock input signals from the clock & reset circuitry 22 (FIG. 1). The CLK (clock output) pin of the microprocessor 12 is connected to the frequency divider 24 and serves to provide synchronizing clock pulses for the entire system 10. The period of the CLK pin output signal is twice the $X_1$ input period. The RESET IN pin is connected to receive reset signals from the clock & reset circuitry 22. Upon receipt of such signals, the interrupt enable flip-flops of the microprocessor 12 are reset.

The test initiation switch 46 takes the form of a 5-volt voltage source connected through a 4.7 K-ohm resistor and an inverter to the RST 5.5 (restart interrupt) pin of the microprocessor 12. A manual switch SW is connected between ground and the junction of the resistor with the inverter. The RST 5.5 pin is normally at "low"; when the switch SW is depressed, the RST 5.5 pin is brought to a "high" and the test sequence is initiated. The RST 7.5 (restart interrupt) pin is connected to receive the inverted output signals from the timer of the 8155 combination RAM, I/O and timer chip 18 as discussed below in connection with the 8155 chip.

Figure 3:
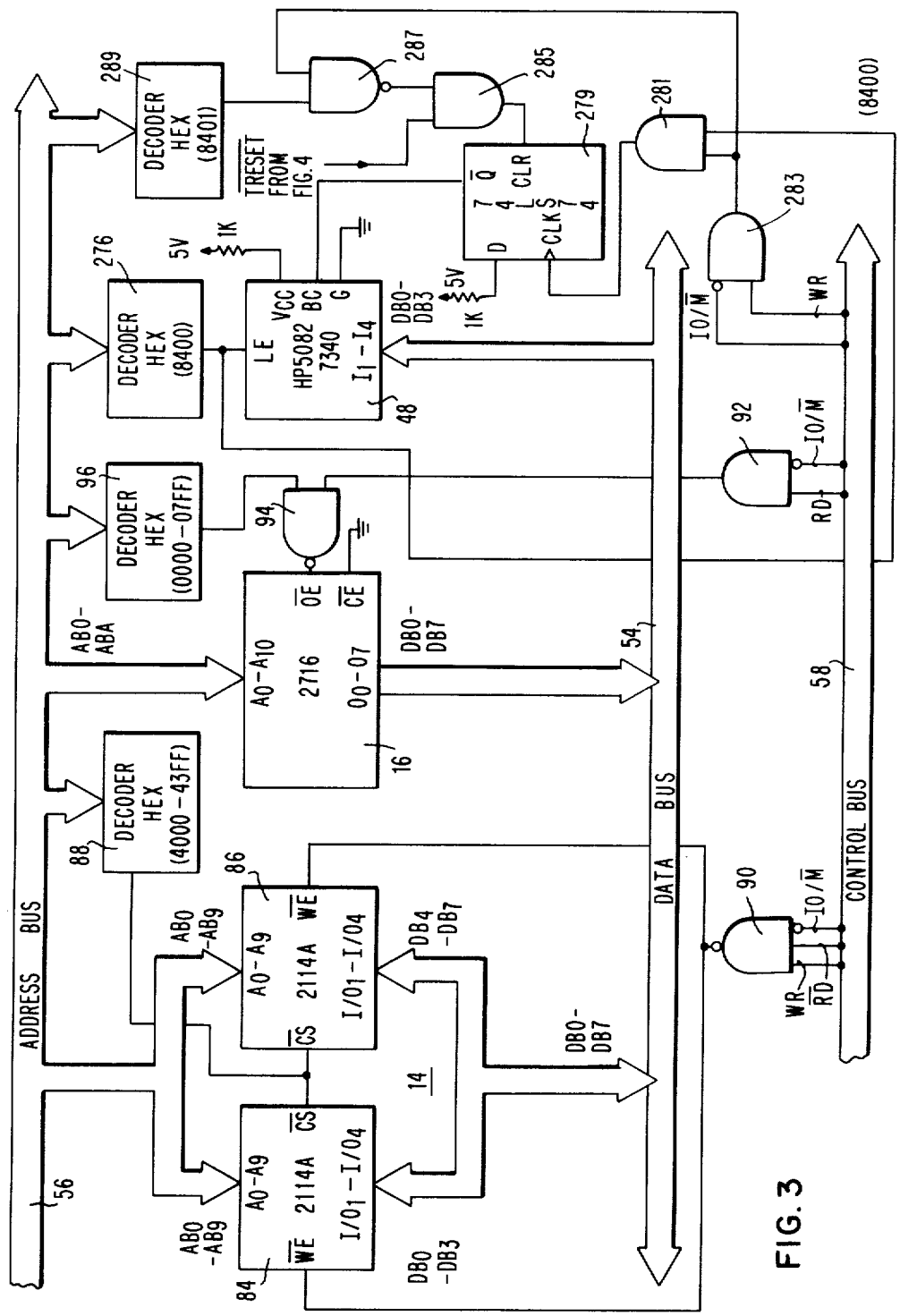
FIG. 3 is a block diagram of the RAM and PROM of the system of FIG. 1 and their associated circuits.

The RAM 14 (FIG. 1) is typical of memory storage devices found in microprocessor systems and is shown in greater detail in FIG. 3. The RAM 14 comprises two Intel 2114A 1024 × 4-bit static RAM chips 84 and 86. The data input/output pins $I/O_1$–$I/O_4$ of the chip 84 are connected for bidirectional data communication to the lower data bus bit lines $DB_0$–$DB_3$ of the system data bus 54; the $I/O_1$–$I/O_4$ pins of the chip 86 are similarly connected to the upper data bus bit lines $DB_4$–$DB_7$. The address input pins $A_0$–$A_9$ of each of the chips 84 and 86 are respectively connected to receive address information from the address lines $AB_0$–$AB_9$ of the system address bus 56. The 1024 word locations in the chips 84 and 86 are assigned the addresses 4000 through 43FF (hexadecimal notation). An address decoder 88 (FIG. 3) of conventional design is connected to the CS (chip select) pin of each chip 84 and 86 serves to decode the address information on the lines of the system address bus 56 and activates the chips when instructions using those addresses are executed. A NAND-gate 90 connected to receive noninverted inputs from the WR and RD lines and an inverted input from the IO/M line of the system control bus 58 connects to the WE (write enable) pins of each chip 84 and 86 to provide read/-write control. Writing into the RAM 14 is inhibited except when WR is "1" and IO/M is logic "0", i.e. except when memory access and write control signals are given by the microprocessor 12. The two Intel 2114A chips 84 and 86 provide a 1K-byte RAM memory storage capacity to the system 10, one chip storing the upper nibble (i.e. upper 4 bits) and the other chip storing the lower nibble (i.e. lower 4 bits) to accommodate 1024 words each having an 8-bit length.

As shown in FIG. 3, the PROM 16 (FIG. 1) comprises an Intel 2716 UV erasable PROM having a 2K-byte storage capacity. The 2048 words are assigned the addresses 0000 through 07FF (hexadecimal notation). The address pins $A_0$–$A_{10}$ of the 2716 chip 16 are connected to receive address information from the address lines $AB_0$–$AB_4$ of the system address bus 56; the output pins $O_0$–$O_7$ are connected to deliver information to the data lines $DB_0$–$DB_7$ of the system data bus 54. The OE (output enable) pin is connected to AND-gate 92, NAND-gate 94 and an address decoder 96. The AND-gate 92 has one input connected to the RD control line and another inverted input connected to the IO/M control line and is connected to provide a first input to theNAND-gate 94 which is "high" when the RD and IO/M control signals from the microprocessor 12 indicate a read out and a memory access operation. The address decoder 96 is of conventional design to provide a second input to the NAND-gate 94 which is "high" when any address 0000 through 07FF is specified by an instruction.

The PROM 16, like the RAM 14, is typical of components found in common microprocessor systems. However, for purposes of implementing the present invention, the PROM 16 is preprogrammed with the program set forth in the Appendix hereto which specifies the particular sequence of test instructions to be performed by the system 10 upon initiation of a test.

Figure 5A:
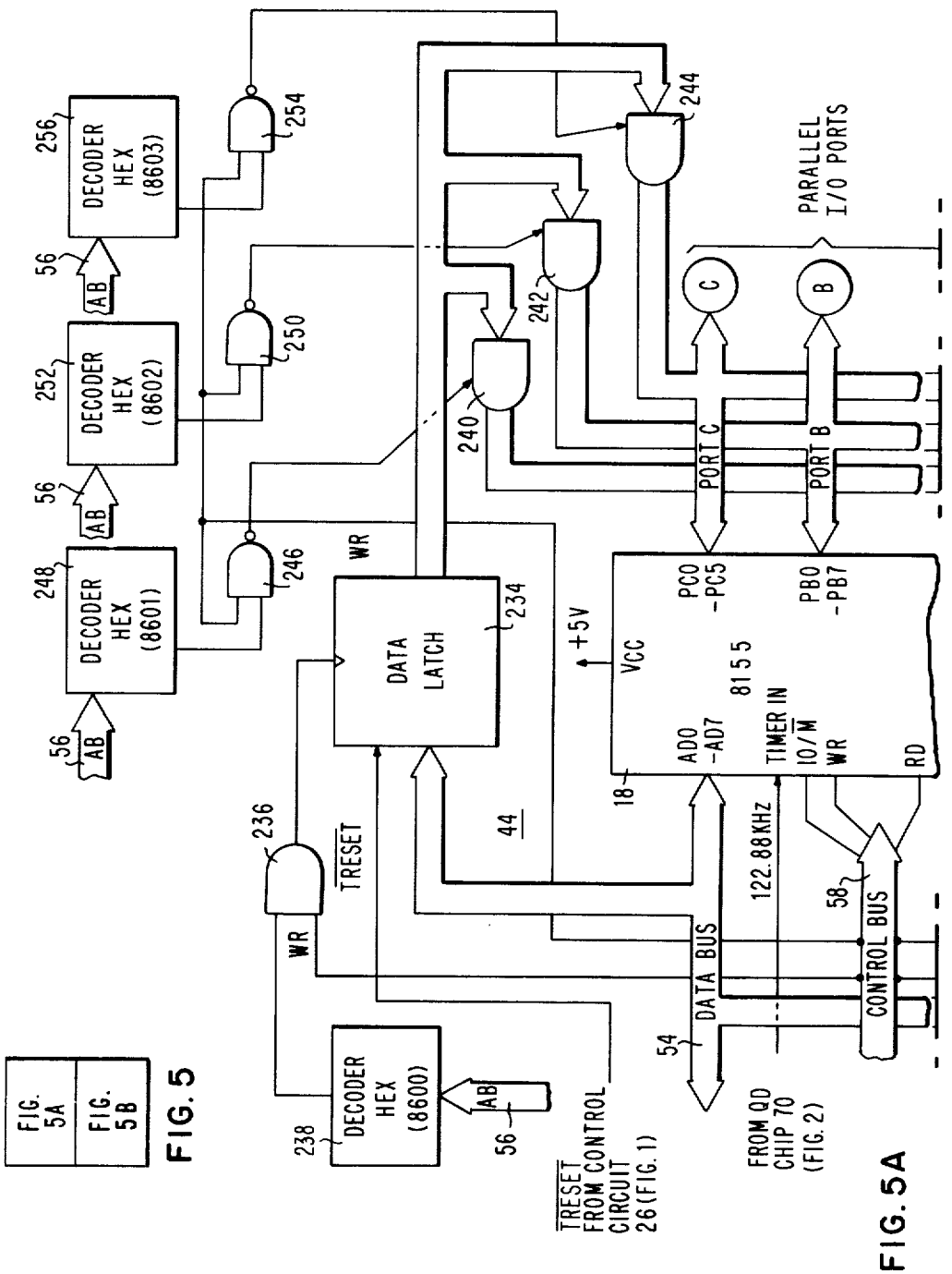
FIG. 5, which consists of FIG. 5A and FIG. 5B, is a block diagram showing a three function Intel 8155 chip which serves as the RAM, I/O and timer element in the system of FIG. 1.
Figure 5B:
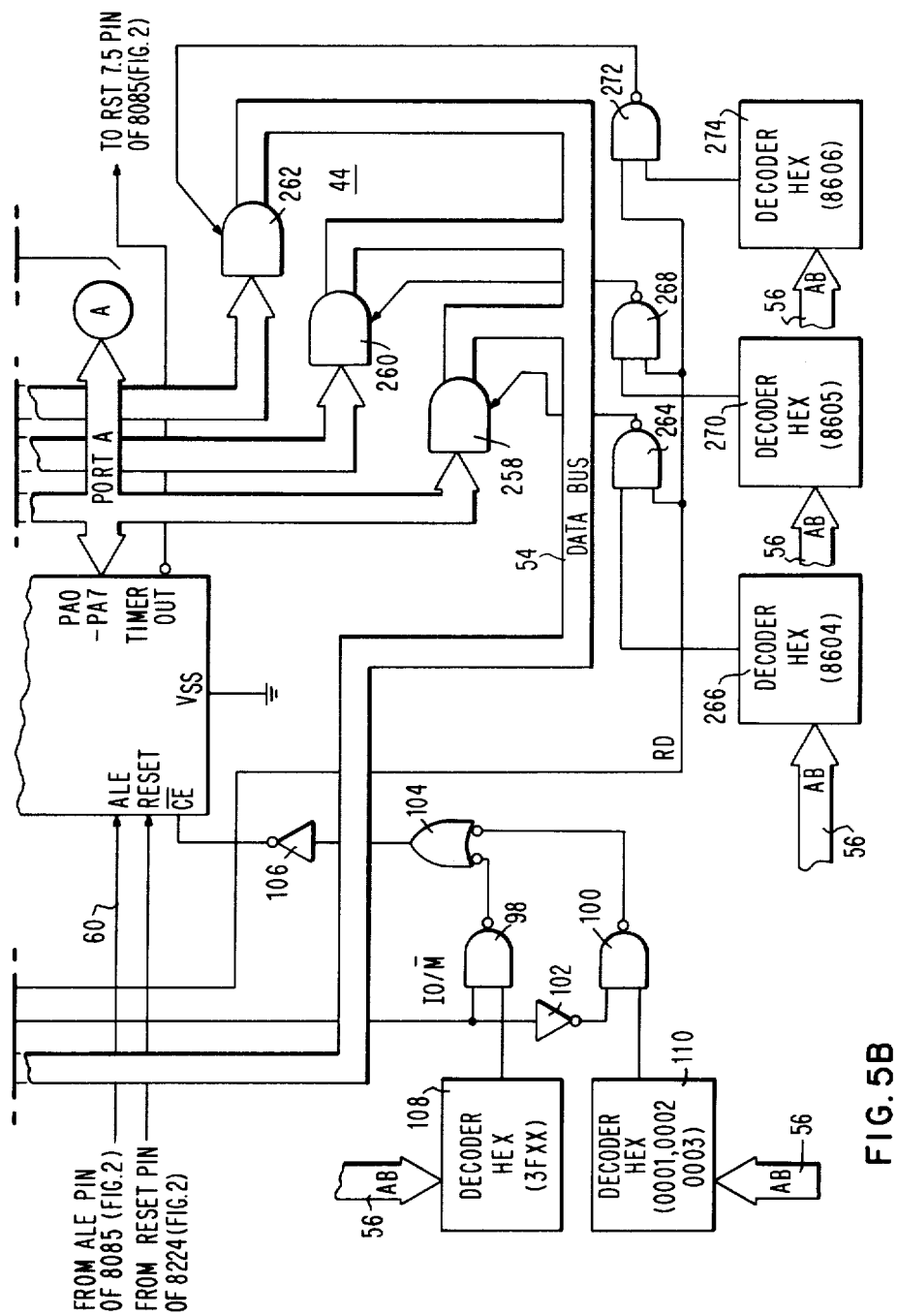

The combination RAM, I/O and timer element 18 (FIG. 1) comprises a three function Intel 8155 chip, as shown in FIG. 5. The chip 18 provides 256 words × 8 bits per word random access memory storage capacity (assigned hexadecimal address locations 3F00–3FFF), three parallel I/O ports A, B, C (assigned the hexadecimal addresses of 0001, 0002 and 0003, respectively) for parallel format data communication between the system 10 and the outside world and a 14-bit binary counter/timer. The $PA_0$–$PA_7$ pins of the chip 18 serve as the 8-bit port A, the $PB_0$–$PB_7$ pins serve as the 8-bit port B, and the $PC_0$–$PC_5$ pins serve as the 6-bit port C. The address/data input pins $AD_0$–$AD_7$ are connected to receive multiplexed address and data information from the $DB_0$–$DB_7$ lines of the system data bus 54. The ALE pin of the 8155 chip 18 is connected to the control line 60 which delivers control signals for the demultiplexing of the address and data information from the ALE pin of the microprocessor 12. The WR, RD and IO/M pins are connected to receive signals from the corresponding lines of the system control bus 58. The TIMER IN pin of the 8155 chip 18 serves as the clock pulse input to the chip 18 and is connected to receive the 122.88 KHz clock pulses from the $Q_D$ pin of the chip 70 (FIG. 2). The RESET pin of the chip 18 is connected to receive the power-up reset signal from the RESET pin of the 8224 chip 64 (FIG. 2).

The CE (chip enable) pin of the chip 18 is connected to a configuration of logic gates 98, 100, 102, 104, 106 and to the address decoder circuits 108, 110 according to conventional techniques so that the 8155 chip 18 is enabled when either of the following conditions exists: (1) the IO/M control line of the system control bus 58 indicates a memory access operation (i.e. IO/M="0") and an address of 3F00 through 3FFF is specified by the system address bus 56 (decoder 108 has a "1" output); or (2) the IO/M control line indicates an input/output operation cycle (IO/M="1") and an address of 0001, 0002, or 0003 is specified (decoder 110 has a "1" output). The decoder 108, 110 are structured to give "0" outputs for all other addresses.

Figures 4, 4B:
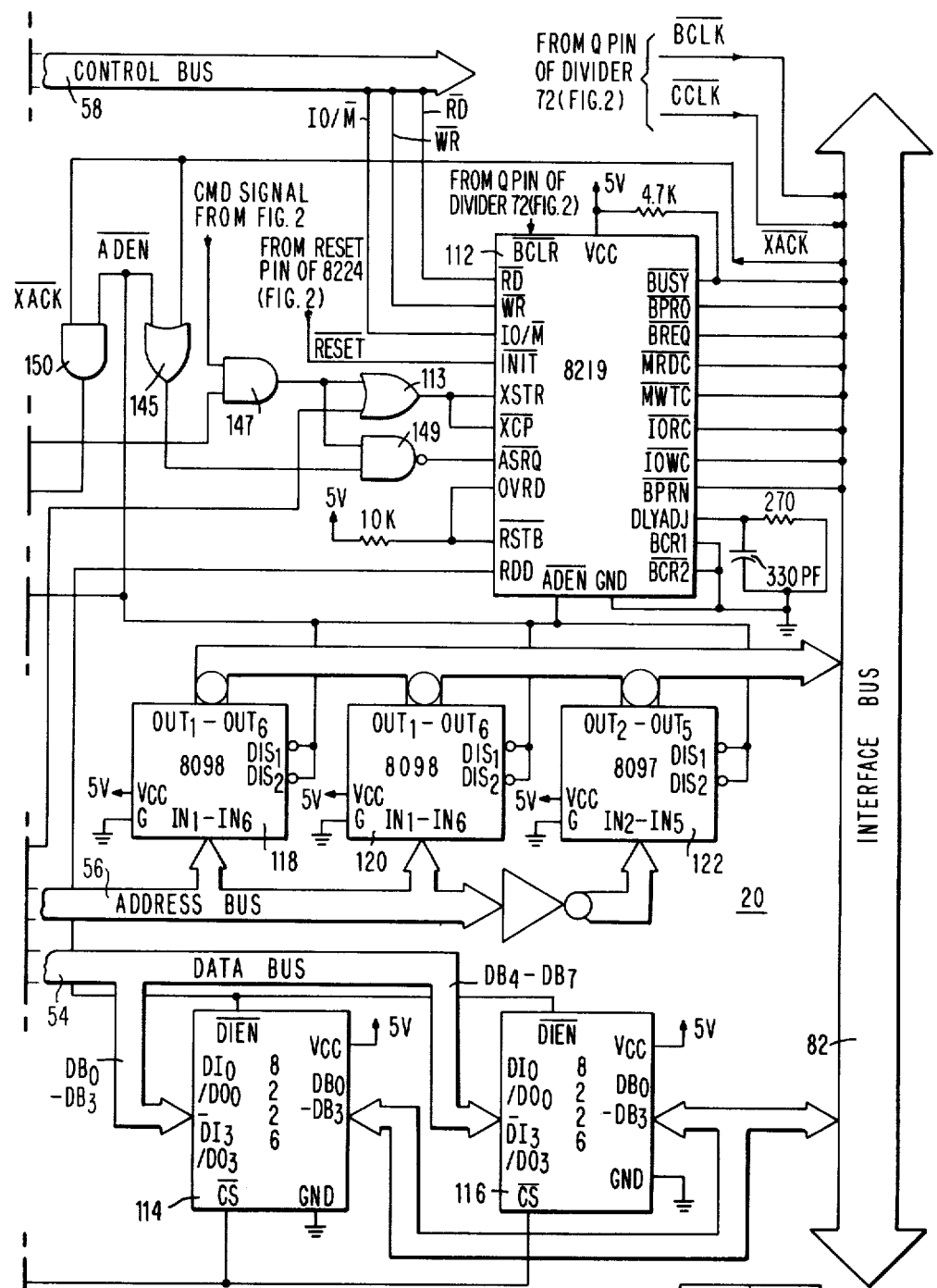
FIG. 4, which consists of FIG. 4A and FIG. 4B, is a block diagram of the interface bus adapter in the system of FIG. 1.
Figure 4A:
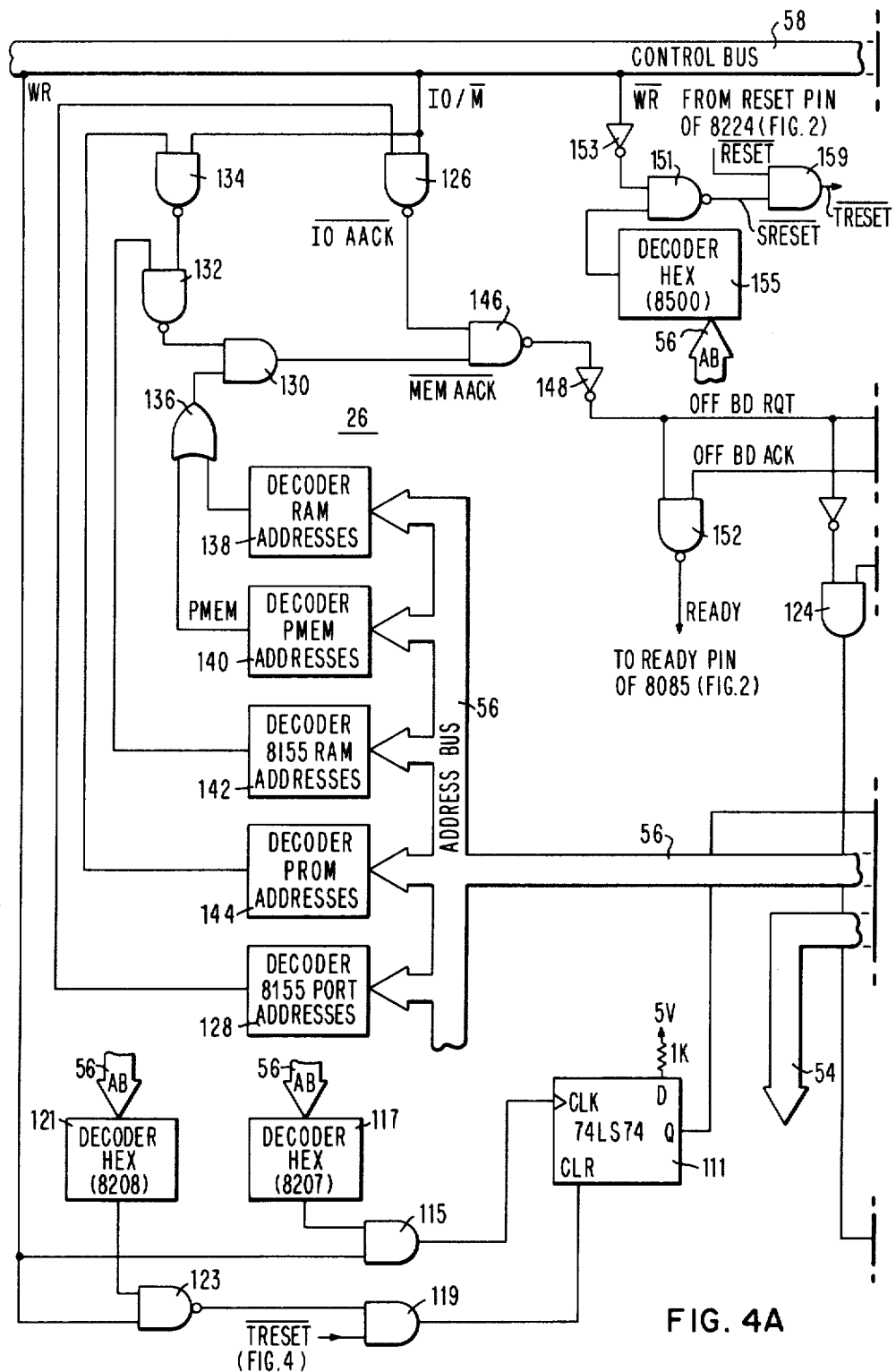

The interface bus adapter 20, shown in FIGS. 1 and 4, allows the microprocessor system 10 to interface with other systems on a common interface bus 82, thereby permitting, for example, the sharing of memory and I/O devices. The adapter 20 (see FIG. 4) comprises the bus arbitration logic, timing logic and output drive logic embodied in an Intel 8219 microcomputer bus controller chip 112; the interface bus data line driving circuitry embodied in two Intel 8226 chips 114, 116; and the interface bus address line driving circuitry embodied in two Intel 8098 chips 118, 120 and one Intel 8097 chip 122.

As illustrated in FIG. 4, the WR, RD, and IO/M pins of the 8219 chip 112 are connected to the corresponding lines of the system control bus 58. The INIT (initialize) pin is connected to receive the inverted power-up reset signal from the RESET pin of the 8224 clock chip 64 (FIG. 2). The XSTR (transfer-start-request) and XCP (transfer complete) pins are coupled together to receive signals from the control logic circuitry 26 (see below) that indicate that a data transfer cycle is requested to start and that a data transfer cycle has been completed. The ASRQ (asynchronous bus request) pin is connected to receive interrupt signals from the control logic circuitry 26. The OVRD (override) and RSTB (request-strobe) pins are tied through a 10 K-ohm resistor to the 5-volt voltage source. The BCR1, BCR2 (bus control request) pins are connected to ground in the illustrative system 10, because no master device requests will be given to control the interface bus 82. The BREQ (bus request), BUSY (bus busy), BPRN (bus priority in), BPRO (bus priority out), MRDC (memory read control), MWTC (memory write control), IORC (I/O read control), and IOWC (I/O write control) pins of the chip 112 are all connected directly to the interface bus 82. The DLYADJ (delay adjust) input pin is connected by means of a parallel coupling of a 330 pF capacitor and a 270-ohm resistor to ground to adjust the required set-up and hold time of address to control signal. The BCLK (bus clock) pin is connected to receive the inverted 9.83 MHz clock pulses from the Q pin of the divider 72 of FIG. 2, discussed below. The ADEN (address and data enable) output pin of the chip 112 is connected to deliver enabling signals to the address bus drivers 118, 120, 122 and the data bus drivers 114, 116 and also to deliver signals to the control logic circuitry 26 (FIGS. 1 and 4).

The XSTR and XCP pins, coupled together as described above, are also connected to receive signals from the noninverting Q pin output of a flip-flop 111 (FIG. 4) through an OR-gate 113. The flip-flop 111 is of a 74LS74 type. Its CLK pin is connected to an AND-gate 115, an address decoder 117 (for decoding the address 8207) and the WR control line of the system control bus 58 so that the flip-flop 111 is clocked for a write instruction of address 8207. The CLR pin of the 8219 flip-flop 111 is connected to an AND-gate 119, an address decoder 121 (for decoding the address 8208), a NAND-gate 123, the WR control line of the bus 58, and the TRESET output of the AND-gate 159 (FIG. 4) to clear the 8219 flip-flop 111 for either a low TRESET signal state or a write instruction of address 8208.

The two 8226 chips 114 and 116 are 4-bit parallel bidirectional bus drivers/receivers. Chip 114 is connected to serve as a direct bidirectional interface between the lower order bit lines $DB_0$–$DB_3$ of the system data bus 54 and the corresponding lines of the interface bus 82; chip 116 is connected as an interface between the higher order bit lines $DB_4$–$DB_7$ of the bus 54 and the corresponding lines of the interface bus 82. The $DI_0$–$DI_3$ data input pins of each chip 114 and 116 are tied to the corresponding $DO_0$–$DO_3$ data output pins to provide bidirectional operation. The CS (chip select) pins of each chip 114 and 116 are connected to receive device select signals from an AND-gate 124 which enables the 8226 chips when an off-board request (see discussion below) is made (OFF BD RQT="1") and the address data enable signal from the 8219 chip is present (ADEN="0"). The DIEN (data in enable direction control) pins of the chips 114 and 116 are connected to the RDD (read data direction) pin of the 8219 chip 112 and serve to control the direction of data flow.

The address line drivers 118, 120, 122 shown in FIG. 4 function similarly to the data line drivers 114, 116 and buffer the address data from the address lines $AB_0$–$AB_F$ of the system address bus 56 to the corresponding lines of the interface bus 82. The address lines $AB_0$–$AB_5$ are connected to the input pins of the driver 118; the lines $AB_6$–$AB_9$ and $AB_E$, $AB_F$ are connected to the input pins of the driver 120; and the lines $AB_A$–$AB_D$ are connected to (four of) the input pins of the driver 122. The address lines of the interface bus 82 are connected to the corresponding output pins of the drivers 118, 120, 122.

The clock & reset circuitry 22, together with the frequency divider circuitry 24, generates the basic system clock signals and also the power-up reset signal for the microprocessor system 10. As shown in FIG. 2, the circuitry 22 comprises an Intel 8224 clock generator and driver chip 64. A crystal XTAL of 19.6608 MHz frequency in series with a 10pF capacitor is connected between the XTAL 1, XTAL 2 pins of the chip 64. The RESIN (reset input) pin of the chip 64 is connected to a 5-volt voltage source through a parallel coupling of a 100 K-ohm resistor and a diode D and is connected to ground through a 10 µF capacitor. The diode D and the capacitor serve to shape the signal transmitted to the RESIN pin by the 5-volt voltage source at system power-up (i.e. the time at which the system is turned on). At power-up the state of the signal received at the RESIN pin of the chip 64 provides a power-up reset signal to the system 10 at its RESET (reset output) pin. A basic system clock pulse of 19.66 MHz is delivered at the OSC (oscillator output) pin of the chip 64.

The divider circuitry 24 of the system 10 comprises frequency divider circuits 66, 68, 70 and 72 which serve to reduce the frequency of the basic system clock signal received from the clock & reset circuitry 22 to produce other usable frequencies.

The divider 66 is a 74LS161 synchronous 4-bit counter connected to serve as a divide-by-5 circuit (see FIG. 2). The LD (load) pin is coupled to receive inverted input signals from the $Q_D$ (data output D) pin; the CLR (clear), ENT (enable T), ENP (enable P), $I_C$ (data input C), $I_D$ (data input D) and $Q_B$ (data input B) pins are all coupled through a 1K-ohm resistor to the 5-volt voltage source. The CLK pin of the divider 66 is connected to receive clock pulses from the OSC pin of the clock generator 8224 chip 64 which are shaped (squared-up) by the action of the NAND-gates 74 and 76 (see FIG. 2). The $Q_B$ (data output B) pin is connected to deliver a 3.93 MHz output signal to the $X_1$ (crystal) pin of the microprocessor 12. A 510-ohm pull-up resistor is connected between the $Q_B$ pin of the chip 66 and the 5-volt voltage source.

As was mentioned above, the CLK (clock output) pin of the microprocessor 12 will deliver clock pulses having twice the period of clock pulses delivered to the $X_1$ (crystal) input pins of the microprocessor. Thus, since the $X_1$ pin of the 8085 chip 12 is connected to receive 3.93 MHz clock pulses from the 74LS161 divide-by-5 circuit 66, the CLK pin of the 8085 chip 12 will deliver a 1.966 MHz signal. The CLK pin is connected to the CLK input pins of divider circuits 68 and 70.

As shown in FIG. 2, the divider circuit 68 comprises a 74LS74 flip-flop connected in a divide-by-2 configuration to provide a 0.983 MHz output from its Q (noninverted output) pin to be inverted as a first input to an OR-gate 78 for development of a CMD control signal (discussed further below). The D input pin of the divider 68 is connected to the WR pin of the 8085 chip 12; the PR (preset) input pin of divider 68 is connected to receive the output WR of an inverter 80 whose input is connected to the WR pin of the 8085 chip 12. The CLR (clear) pin of the divider 68 is connected through a 1K-ohm resistor to the 5-volt voltage source. The divider 70 comprises a 74LS161 synchronous 4-bit counter, the LD (load), CLR (clear), ENP (enable P) and ENT (enable T) pins of which are connected through a 1K-ohm resistor to the 5-volt voltage source and the four input pins $I_A$–$I_D$ of which are grounded, so that 1.966 MHz pulses received at the CLK pin will deliver 122.88 KHz pulses at the $Q_D$ (data output D) pin which is connected to the TIMER IN pin of the 8155 chip 18 (see FIGS. 1 and 5).

The divider circuit 72 comprises a 74LS74 flip-flop connected in a divide-by-2 configuration. The CLR (clear) and PR (preset) pins are each connected through a 1K-ohm resistor to receive the inverted input from the 5-volt voltage source (i.e. connected "low"). The D input pin is tied to the inverting output Q pin. Thus, 19.66 MHz clock pulses received at the CLK pin from the OSC pin of the 8224 chip 64 (FIG. 2), generate 9.83 MHz clock pulses at the noninverting output Q pin of the divider 72. The Q pin of the divider 72 is connected through an inverter 80 to deliver this 9.83 MHz signal to the BCLK and CCLK lines of the interface bus 82 and the BCLK signal to the BCLK pin of the 8219 chip 18 (FIGS. 1 and 4).

The control logic circuitry 26 comprises logic circuitry for developing control signals for use in the functional operations of the microprocessor system 10. Such control signals include CMD (command), MEM RD (memory access read), I/O AACK (input/output acknowledge), MEM AACK (memory address acknowledge), OFF BD RQT (off-board request), OFF BD ACK (off-board acknowledge), READY which have utility in the operation of system 10 separate from the test procedure. Additional control signals developed for use in the testing process are the P-MEM (pseudo memory address acknowledge) and TRESET (power-up and software reset) signals.

The circuitry for development of the CMD signal is shown in FIG. 2. The Q noninverting output pin of the divide-by-2 circuit 68 is connected as an inverted input to the OR-gate 78. The RD control line of the system control bus 58 is connected as a second inverted input to the OR-gate 78. The CMD signal is the output of the OR-gate 78 and has a value="1" only when a read operation and a 0.983 MHz clock pulse are both present.

The MEM RD signal is developed, as shown in FIG. 2, at the output of a NAND-gate 124 which is connected to receive inverted inputs from the RD and IO/M control lines of the system control bus 58. MEM RD has a value "0" when memory access and read operations are being performed.

The IO AACK signal is developed at the output of a NAND-gate 126 (FIG. 4). An address decoder 128 connected to decode information from the system address bus 56 has an output of logic "1" whenever the address lines specify one of the addresses (0001, 0002, 0003) of one of the system parallel I/O ports A, B, C of the 8155 chip 18, discussed above with reference to FIG. 5. The output of the decoder 128 is connected as one input to the NAND-gate 126; the other input of the NAND-gate 126 is connected to receive signals from the IO/M control line of the system control bus 58. The IO AACK signal is "0" whenever an IO operation specifies the address of one of the system parallel I/O ports A, B, C (i.e. when IO/M = 1 and the address = 0001, 0002 or 0003).

The MEM AACK signal is developed by circuitry comprising AND-gate 130, NAND-gates 132 and 134, OR-gate 136 and address decoders 138, 140, 142 and 144. The address decoders comprise conventional decoding circuitry for decoding the addresses specified by the system address bus 56. Decoder 138 has an output of "1" when the address bus 56 specifies one of the addresses 4000 to 43FF of the RAM 14, the decoder 140 has an output of "1" for any of the pseudo-memory addresses (PMEM = 1 described further below), the decoder 142 has an output of "1" for any of the 8155 chip 18 on-board RAM location addresses 3F00 to 3FFF, and the decoder 144 has an output of "1" for any of the PROM location addresses 0000 to 07FF. The gates 130, 132, 134, 136 are connected as shown in FIG. 4 to receive the outputs of the decoders 138, 140, 142, 144 and the IO/M signal from the system control bus 58 so that the output of the AND-gate 130 (MEM AACK signal) has a value of "0" whenever a memory location (in the RAM 14, the 8155 chip 18 or the PROM 16) or a pseudo-memory location (discussed below) is specified and a memory access operation is performed (i.e. IO/M = "0").

The OFF BD RQT signal is developed by a NAND-gate 146 and an inverter 148 connected in known ways so that the output of the inverter 148 (OFF BD RQT signal) is "1" when there is neither (a) an input/output operation with a specified on-board I/O port address location (the system serial output ports 50 and 52 are accessed directly by the 8085 microprocessor 12); nor (b) a memory access request with a specified on-board memory or pseudo-memory address location. Stated another way, the gate 146 and the inverter 148 are connected so that OFF BD RQT = 1 when both I/O AACK = 1 and MEM AACK = 1.

The OFF BD ACK signal is developed at the output of an AND-gate 150 which is connected to receive inputs from the XACK line of the interface bus 82 and from the ADEN pin of the interface bus arbitration chip 112. When both the XACK (transmission acknowledge) signal is "1", and the ADEN (address/data enable) signal is "1", the OFF BD ACK signal will be "1" to indicate that an off-board operation involving the interface bus 82 is to be completed.

The CMD signal output of the OR-gate 78 (FIG. 2) and the OFF BD RQT signal output of the inverter 148 (FIG. 4) are connected as inputs to an AND-gate 147 (FIG. 4). The output of the AND-gate 147 is connected to provide the interface bus transmission start and transmission complete signals to the XSTR and XCP pins of the 8219 chip 112. The output of an OR-gate 145 (which receives inputs from the ADEN pin of the 8219 chip 112 and the XACK line of the interface bus 82) and the output of the AND-gate 147 are connected as inputs to a NAND-gate 149. The output of the NAND-gate 149 is connected to provide signals to the ASRQ pin of the chip 112. A SRESET (software reset) signal is developed at the output of a NAND-gate 151. The NAND-gate 151 is connected to receive input signals from an inverter 153 (which inverts the WR signal from the system control bus 58) and an address decoder 155 (for decoding the address 8500 which is specified by the test program to reset system 10 components for test purposes). The elements 151, 153 and 155 are connected so that SRESET = 0 for a write instruction with an address 8500. An AND-gate 159 is connected to receive the SRESET output of the NAND-gate 151 and the RESET inverted output of the RESET pin of the 8224 chip 64 (FIG. 2) and provide a TRESET (total reset) output signal for resetting various system 10 components. TRESET = 0 for either a power up reset (RESET = 0) or a software reset (SRESET = 0) command.

The READY signal is developed at the output of a NAND-gate 152 from the OFF BD RQT and OFF BD ACK signals (FIG. 4). The NAND-gate 152 is connected so that it will deliver a "1" to the READY pin of the 8085 microprocessor 12 (FIG. 2) whenever a memory or a peripheral device is ready to send or receive data. If the READY signal is "0" the microprocessor 12 will wait a specified number of clock cycles for the READY signal to become "1" before completing a read or write cycle. As developed by the control logic circuitry 26 (FIG. 4), the READY signal will be "1" except when both the OFF BD RQT signal is "1" and the OFF BD ACK signal is "1".

The P-MEM address acknowledge signal is developed by the address decoder 140 shown in FIG. 4, which has an output of "1" whenever any of the on-board pseudo-memory address locations specified by the test program (listed in the Appendix) appears on the address lines of the system address bus 56. The pseudo-memory address locations are test program addresses that cause events of the system 10 for testing purposes and are distinguishable from "real" memory addresses that are used to access the locations of the RAM 14, the on-board RAM of the 8155 chip 18 and the PROM 16.

The pseudo-memories are the following locations whose addresses are specified in the test program listing (see Appendix): ESID, DSID, SETB, PRPGM, PRPGD, PRPGCA, CLRB, SRC, SRD, SRLFD, EDIS, DDIS, SRESET, DMUXFL, DMUXA, DMUXB, DMUXC, OUTA, OUTB and OUTC. The PRPGCM location is not considered a pseudo-memory location because it represents the clocking of the PRPG 38 (discussed below) by means of the interface bus 82 which is an off-board activity.

Figure 6B:
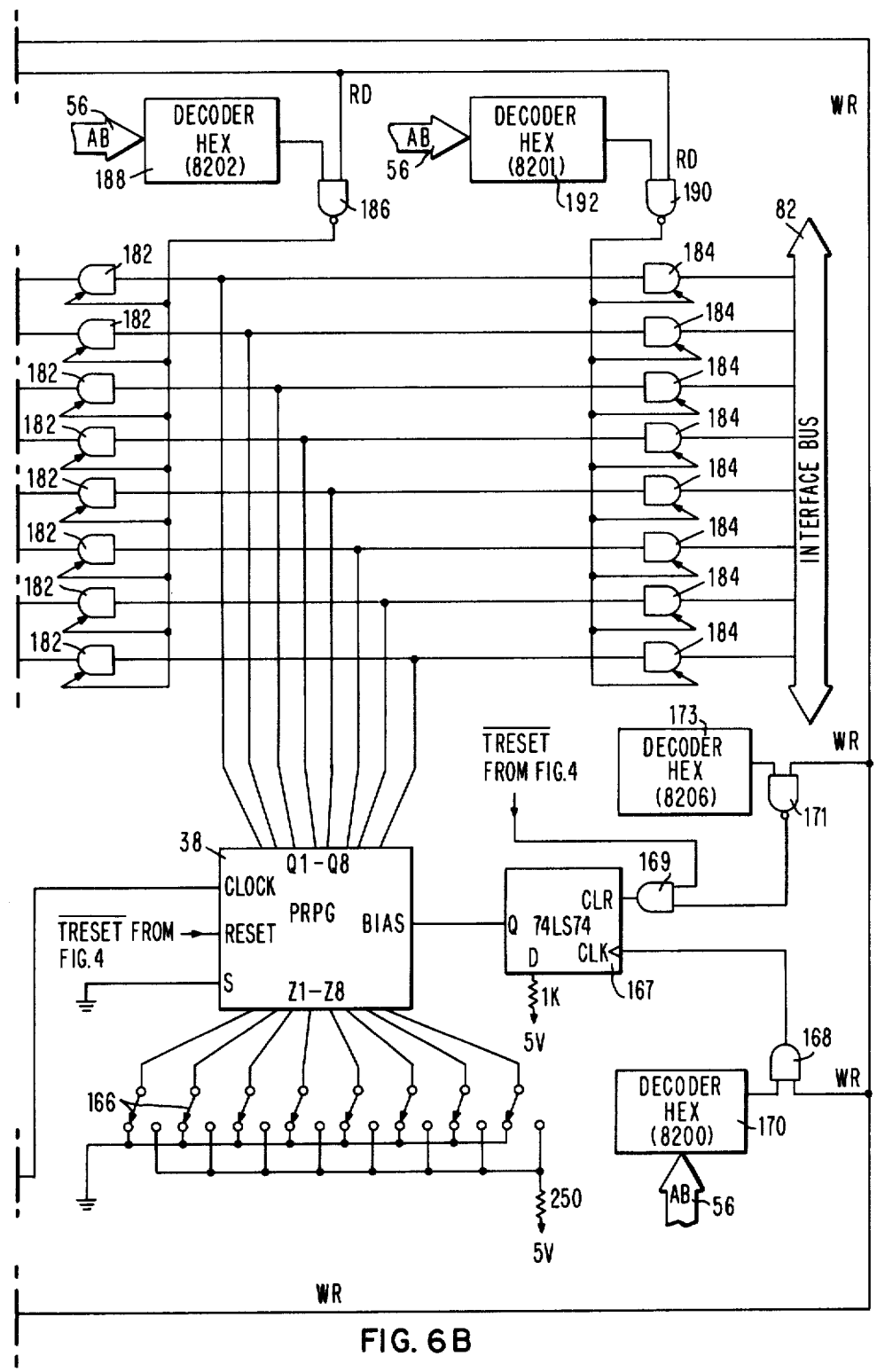
FIG. 6, which consists of FIG. 6A and FIG. 6B, is a block diagram of the pseudo random pattern generator in the system of FIG. 1.

A pseudo-random pattern generates (PRPG) 38, shown in FIGS. 1 and 6, is incorporated into the microprocessor system 10 to generate test data to be acted upon by the system 10 under direction of the test instructions specified by the test program (listed in the Appendix) which is stored in the PROM 16. The PRPG 38 comprises an 8-bit parallel shift register 154 with feedback having the configuration shown in FIG. 7, whose construction is similar to that of the "built-in logic block observer" or "BILBO" proposed in the Koenemann, et al. article referenced above and which is further described in applicant's copending U.S. Patent Application Ser. No. 277,992, filed June 26, 1981 (which is a continuation of U.S. Patent Application Ser. No. 139,207, filed Apr. 11, 1980, and now U.S. Pat. No. 4,340,857).

The parallel shift register with feedback 154, shown in FIG. 7, has eight flip-flops 156 connected to receive parallel input signals from the input terminal pins $Z_1$ to $Z_8$ through the AND-gates 158 and exclusive OR-gates 160 upon the occurrence of a logic "1" state at the BIAS pin. Serial feedback between the flip-flops 156 is provided by the NOR-gates 162 and exclusive OR-gates 164. Synchronous reset and clocking input signals to the flip-flops 156 are received at the RESET and CLOCK pins, respectively, of the register 154. The 8-bit output signal of the register 154 is delivered at the output terminal pins $Q_1$ to $Q_8$. The 8-bit output of the register 154 is a function of the current 8-bit parallel input signal delivered to the pins $Z_1$ to $Z_2$ and the past history of the states of the flip-flops 156.

The PRPG 38 pin connections are shown in FIG. 6. In this illustrative embodiment, the parallel input pins $Z_1$ to $Z_8$ are each connected to receive "0" level signals by connection to ground or "1" level signals by connection to the 5-volt voltage source through a 250-ohm resistor, depending on the positions of manually settable switches 166. The 8-bit number specified by the positions of the switches 166 will specify the bias number that is entered into the PRPG 38 when a "1" state signal is received at the BIAS pin. FIG. 6 shows the switches 166 set to deliver an 8-bit binary bias number of 00000000 to the PRPG 38. As will be appreciated by those skilled in the art, this arrangement can be modified so that the input states of the pins $Z_1$ to $Z_8$ are specified by information received from connection to the data lines $DB_0$ to $DB_7$ of the system data bus 54.

The BIAS pin is connected to the noninverting output Q pin of a flip-flop 167. The bias flip-flop 167 is of a 74LS74 type. Its CLK pin is connected to an AND-gate 168, whose inputs are received from the WR control line of the system control bus 58 and the output of an address decoder 170. The decoder 170 is designed to give an output "1" when the address on the system address bus 56 is 8200. The D pin of the flip-flop 167 is connected through a 1K-ohm resistor to the system 5-volt voltage source. Thus, the PRPG 38 will be clocked and an 8-bit number appearing at the pins $Z_1$ to $Z_8$ of the PRPG 38 will be entered when a write operation having the 8200 address is specified. This occurs for the PRPG clocking instruction specified in the test program (see Apendix) which is described further below. The CLR pin of the bias flip-flop 167 is connected to an AND-gate 169, a NAND-gate 171, an address decoder 173 (for decoding the address 8206), the WR control line of the bus 58 and the TRESET signal output of the AND-gate 159 (FIG. 4), to clear the flip-flop for either a low TRESET signal state or a write instruction of address 8206.

The S pin of the PRPG 38 is connected to ground. The RESET pin is connected to receive the TRESET signal from the control logic circuitry 26 (see FIG. 4). The CLOCK pin is connected to clock the flip-flops 156 (FIG.7) of the PRPG 38. This is accomplished by connection to the output of an OR-gate 172 which receives one input from a two-input AND-gate 174 and another input from a two-input AND-gate 176 (FIG. 6). An address decoder 178 is connected to deliver a "1" to the AND-gate 174, whenever the test program PRPG clocking instruction with the address 8204 is executed; an address decoder 180 is connected to deliver a "1" to the AND-gate 176 whenever the PRPG clocking instruction with the address 8205 is executed (see Appendix). The other input to both the AND-gates 174 and 176 is connected to receive the WR signal from the system control bus 58.

The output pins $Q_1$ to $Q_8$ of the PRPG 38 are connected on the one hand to the data lines $DB_0$ to $DB_7$ of the system data bus 54 and on the other hand to the corresponding data lines of the interface bus 82. Connection between the pins $Q_1$ to $Q_8$ and the buses 54 and 82 is through tri-state AND-gates 182, 184 which isolate the PRPG 38 from the system 10, except when the gates 182, 184 are active. The gates 182 are connected, as shown in FIG. 6, to a NAND-gate 186, an address decoder 188 (constructed to be "1" when the address is 8202) and the RD control line of the system control bus 58, so that the 8-bit output number at the pins $Q_1$ to $Q_8$ is delivered to the lines of the system data bus 54 for a read instruction with the address 8202. The gates 814 are connected to a NAND-gate 190, an address decoder 192 (constructed to be "1" when the address is 8201) and the RD control line of the bus 58, to deliver the PRPG 38 output number to the interface bus 82 for a read instruction with the address 8201. This tri-state gate connection technique makes the PRPG 38 transparent to the system 10 except during testing procedures.

The signature register (SR) 40 (FIGS. 1 and 6) serves as a means for acquiring test result data representing the results of the functional operation of the system 10 under control of the test instructions. The SR 40 is used to capture parallel data, process the data and give a signature or residue number which represents the compressed data for all data information previously entered into the signature register (since the last time it was cleared).

As seen in FIG. 6, the SR 40 takes the form of an 8-bit parallel shift register with serial feedback, like the register 154 discussed above in connection with FIG. 7. Since the SR 40 serves to collect test results, its BIAS terminal is set to "1" by connection through a 1K-ohm resistor to the 5-volt voltage source. The S pin is connected to ground. Input information to the input terminal pins $Z_1$ to $Z_8$ of the SR 40 is delivered from the output pins of a 74LS116 8-bit parallel register 194 connected to serve as a data latch The input pins of the latch 194 are connected to receive signals through tri-state AND-gates 196 from the data lines $DB_0$ to $DB_7$ of the system data bus 54. The gates 196 are connected to a NAND-gate 198, an address decoder 200 (wired to give a "1" for an address of 8302) and the WR control line of the system control bus 58, so that information from the system data bus 54 is latched into the data latch 194 for transmission to the pins $Z_1$ to $Z_8$ of the SR 40 for a write instruction of address 8302.

The clock pin of the SR 40 is connected to clock the flip-flops 156 (see FIG. 7) of the SR 40 for a write instruction with an address 8300 (described further below in connection with the test instruction program). This is accomplished by connecting the CLOCK pin of the SR 40 to the output of an AND-gate 202 which receives inputs from an address decoder 204 (for decoding address 8300) and the WR control line of the system control bus 58.

The RESET pin of the SR 40 is connected to receive the TRESET control signal from the control logic circuitry 26 shown in FIG. 4. The output pins $Q_1$ to $Q_8$ of the SR 40 are connected through tri-state AND-gates 206 to deliver the test result signals to the data lines $DB_0$ to $DB_7$ of the system data bus 54 for evaluation by the microprocessor 12. The gates 206 are activated when a read instruction of address 8301 is given by the test program stored in the PROM 16 (see Appendix). This is accomplished by connection of the AND-gates 206, as shown in FIG. 6, to a NAND-gate 208, an address decoder 210 (for decoding the 8301 address) and the RD control line of the system control bus 58. The tri-state gates 196, 206 render the SR 40 transparent to the normal (non-testing) operations of the system 10.

Use of the SR 40 provides a single output number representative of the results of an entire sequence of test instructions. The output of the SR 40, like that of the PRPG 38, is a function of both the current input and the history of its previous states. Thus, the correct processing by the system 10 of many different test instructions can be determined by evaluation of the SR 40 output at only a few key check points. If the output at such check points coincides with the predicted output for error-free operation, the correct processing of the entire sequence of instructions is verified.

The details of the serial port test logic circuitry 42 (FIG. 1) are shown in the lower left corner of FIG. 2. The circuitry 42 operates to capture test data transmitted in serial format from the SOD pin of the 8085 microprocessor 12 and to transmit test data in serial format to the SID pin of the microprocessor 12.

As previously stated, the SOD pin of the microprocessor 12 functions as a system serial output port 52 for transmitting data in serial format directly to the outside world. An inverter 209 and an inventor 210 coupled to two NAND-gates 212, 214 (arranged in a data latch configuration) serve to capture the information transmitted by the microprocessor 12 to the system serial output port 52. The noninverting Q output pin of a 74LS74 flip-flop 216 is connected with the output of the latched NAND-gates 212, 214 to provide input signals to an AND-gate 218. The output of the gate 218 is connected through an OR-gate 220 and an inverter 222 to deliver the latched data to the SID pin of the microprocessor upon clocking of the flip-flop 216 by signals received from an address decoder 224 designed to give an output "1" for an address 8100.

An address decoder 226 (to decode address 8110) is connected through an OR-gate 228 to provide an inverted signal input to the CLR (clear) pin of the flip-flop 216. The inverted power-up reset signal (RESET) from the reset pin of the 8224 clock and reset chip 64 is also connected as an input to the OR-gate 228, and thus to provide an inverted signal input to the same CLR pin. The flip-flop 216 is thus cleared both at power-up and upon receipt of an instruction address 8110 to provide an output at its Q pin which by connection with an inverter 230 and an AND-gate 232 (FIG. 2) permits passage of (non-test) signals received at the system serial input port 50 (connected as an input to the AND-gate 232) to be transmitted through the OR-gate 220 and inverter 222 to the SID pin of the microprocessor 12. The PR (preset) pin of the flip-flop 216 is connected to receive the inverted input from the 5-volt voltage source through a 4.7 K-ohm resistor.

The parallel port test logic circuitry 44 (FIG. 1) is shown in greater detail in FIG. 5. The circuitry 44 provides the capability to send test data from the system data bus 54 to any of the system parallel I/O ports A, B, C as if the test data were being received from the outside world. The circuitry 44 also permits the sending of data from any of the ports A, B, C to the system data bus 54 as if the data were being transmitted to the outside world.

The simulation of data transmission from the outside world is accomplished by latching the test data from the system data bus 54 and then transmitting it to the selected port A, B or C. A data latch circuit, such as an 8-bit 74LS116 parallel register 234 (FIG. 5), is connected to receive an 8-bit input from the lines $DB_0$ to $DB_7$ of the system data bus 54, when clocked by the output of an AND-gate 236 in response to inputs from an address decoder 238 (for decoding address 8600) and the WR control line of the system control bus 58 (i.e. it is clocked for a write instruction with an address of 8600). The 8-bit data latch output is then connected to each of the ports A, B, C through tri-state AND-gates 240, 242 and 244, respectively. The selection of the port A, B, C is made by the selective activation of the different gates 240, 242 and 244. The gates 240 are connected to a NAND-gate 246, an address decoder 248 (for decoding address 8601) and the WR control line of the system control bus 58 for activation by a write instruction having an address 8601. The gates 242 are connected to a NAND-gate 250, an address decoder 252 (for decoding address 8602) the the WR control line of the system control bus 58 for activation by a write instruction having an address 8602. The gates 244 are connected to a NAND-gate 254, an address decoder 256 and the WR control line of the system control bus 58 for activation by a write instruction having an address 8603. The data latch 234 is connected to reset by receipt of the TRESET control signal from control circuitry 26 (FIG. 4).

The parallel port test logic circuitry 44 for accomplishing the simulation of data transmitted from ports A, B, C to the outside world is similar. The pins of each output port A, B C are connected through tri-state AND-gates 258, 260 and 262, respectively, to the lines of the system data bus 54. Selection of which port A, B or C is transmitting data to the system data bus 54 is determined by which gates 258, 260 or 262 are active. The gates 258 are connected to a NAND-gate 264, an address decoder 266 (for decoding address 8604) and the RD line of the system control bus 58 for activation by a read instruction having an address 8604. The gates 260 are connected to a NAND-gate 268, an address decoder 270 (for decoding address 8605) and the RD line of the system control bus 58 for activation by a read instruction having an address 8605. The gates 262 are connected to a NAND-gate 272, an address decoder 274 (for decoding address 8606) and the RD line of the system control bus 58 for activation by a read instruction having an address 8606. Each of the tri-state AND-gate symbols 240, 242, 244 for input simulation port selection and each of the tri-state AND-gate symbols 258, 260, 262 for output simulation port selection shown in FIG. 5 represents a plurality of tri-state AND-gates synchronously connected to the individual port lines $PA_0$-$PA_7$, $PB_0$-$PB_7$ and $PC_0$-$PC_5$ of ports A, B and C like the tri-state AND-gates 182, 184, 196 and 206 in FIG. 6.

The display 48 (FIG. 1) takes the form of a light emitting diode (LED) display, such as the HP5082-7340 hexadecimal indicator illustrated in FIG. 3. The display 48 serves to display the identification number of the entity or sub-block within the system 10, if any, that is determined by the test results to be defective. The LED display illuminates to show a single hexadecimal digit for identification purposes. Table 1, shows the various identification numbers of the hexadecimal display and an interpretation of which part of the test sequence of the program listed in the Appendix caused a detected error.

TABLE 1

| | Display Identification Numbers |
|---|---|
| I.D. Number | Defective Sub-block |
| 1 | Kernel: 8085, Buses, Display and PROM |
| 2 | PRPG |
| 3 | SR |
| 4 | PROM |
| 5 | RAM |
| 6 | 8085: MPU II Test |
| 7 | 8155 |
| 8 | Serial I/O |
| 9 | 8219 Interface Access Arbitrator |
| 0, A-F | unused in described embodiment |

The HP5082-7340 display 48 has on-board decoder/-driver and memory features. The $I_1$–$I_4$ (input) pins are connected, as shown in FIG. 3, to receive signals from the data lines $DB_0$–$DB_3$ of the system data bus 54. Inputs received from the bus 54 are decoded into 16 states (0–9 and A–F). The LE (latch enable) pin is connected to receive signals from an address decoder 276 (for decoding address 8400). For an instruction with the address 8400, the input signals from the data lines $DB_0$–$DB_3$ are decoded and latched into the on-board memory for display until a new number is loaded.

The BC (blanking control) pin of the display 48 is connected to receive signals from the inverting output Q pin of the display flip-flop 279 of the type 74LS74. The D pin of the flip-flop 279 is connected through a 1K-ohm resistor to the 5-volt system voltage source. The CLK pin of the flip-flop 279 is connected to AND-gates 281, 283, the address decoder 276 (for address 8400), and the IO/M, WR control lines of the bus 58 to clock the flip-flop 279 for turning on the display 48 for a write instruction of address 8400. The CLR pin is connected to an AND-gate 285, a NAND-gate 278, an address decoder 289 (for decoding the address 8401), the TRESET output of the AND-gate 159 (FIG. 4) and the output of the AND-gate 283 (which has an input from the WR and an inverted input from the IO/M control lines), so that the flip-flop 279 is cleared and the display 48 is turned off for a write instruction of 8401.

The address decoders 88, 96, 108, 110, 117, 121, 128, 138, 140, 142, 144, 155, 170, 173, 178, 180, 188, 192, 200, 204, 210, 224, 226, 238, 248, 252, 256, 266, 270, 274, 276 and 289 are of conventional design. Schematic representations of the decoder 96 (FIG. 3) and the decoder 204 (FIG. 6) are shown, by way of example, in FIGS. 8A and 8B, respectively.

Figure 8A:
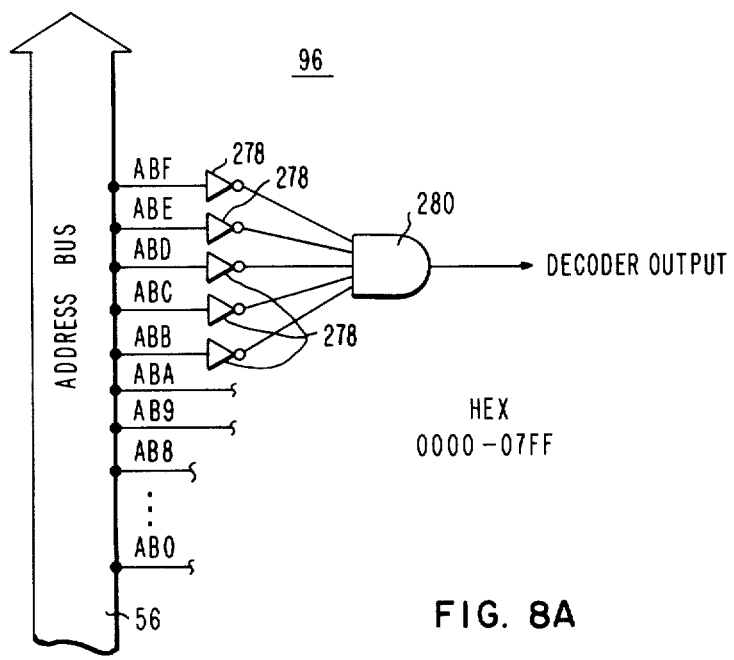
FIG. 8A and FIG. 8B are schematic diagrams of decoders shown in FIG. 3 and FIG. 6, respectively.

The decoder 96 serves to provide a "1" output for any of the addresses 0000 to 07FF of the memory locations of the PROM 16 (FIGS. 1 and 3). For these addresses, the first hexadecimal digit (defined by the address lines $AB_C$–$AB_F$ of the system address bus 56) is always 0 ($AB_C$–$AB_F$ are all low or logic "0") and the second hexadecimal digit (defined by the address lines $AB_8$–$AB_B$) may have any value from 0 to 7 ($AB_B$ is logic "0", $AB_B$–$AB_A$ can be logic "0" or "1"). The values of the third (defined by lines $AB_4$–$AB_7$) and fourth (defined by $AB_0$–$AB_3$) digits vary from 0 to F ($AB_0$–$AB_7$ can be logic "0" or "1"). The decoder 96 is thus constructed to give a "1" output whenever all the address lines $AB_B$–$AB_F$ is "0". This is shown in FIG. 8A by connecting the address lines $AB_B$–$AB_F$ each through an inverter 278 to provide inputs to an AND-gate 280, and leaving the address lines $AB_0$–$AB_4$ unconnected. The output of the AND-gate 280 will be "1" whenever all the inputs to the inverters 278 are all "0".

Figure 8B:
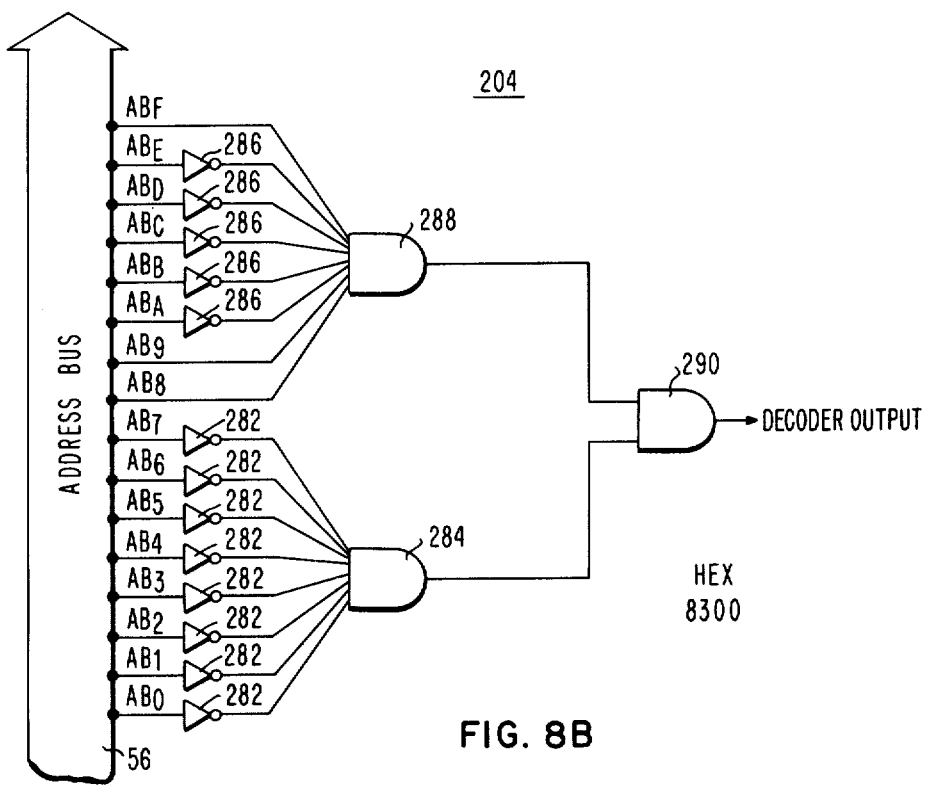

The decoder 204 (FIGS. 6 and 8B) provides a "1" output to the AND-gate 202 (FIG. 6) for an address 8300 which serves to clock the SR 40 as described above. For the address 8300 (1000 0011 0000 0000 in binary notation), the address lines $AB_0$–$AB_F$ of the system address bus 56 will have the following states: $AB_0$–$AB_7$=0; $AB_8$, $AB_9$=1; $AB_A$–$AB_E$=0; and $AB_F$=1. The decoder 204 is thus constructed to give a "1" output when the address lines $AB_0$–$AB_F$ have these states. This is shown in FIG. 8B by connecting the lines $AB_0$–$AB_7$ through inverters 282 as inputs to an AND-gate 284; lines $AB_A$–$AB_E$ through inverters 286 and lines $AB_8$, $AB_9$ and $AB_F$ directly (without inverting) as inputs to an AND-gate 288; and the outputs of AND-gates 284 and 288 as inputs to an AND-gate 290. The output of the AND-gate 290 will be "1" only when the address specified by the address lines $AB_0$–$AB_F$ is 8300. Those skilled in the art will appreciate that the circuits represented in FIGS. 8A and 8B can be constructed by various well-known techniques using commercially available AND-gates, NAND-gates, OR-gates, NOR-gates and inverters in accordance with individual preferences. The decoder outputs can be readily inverted, if necessary, to obtain the complementary output signal ("0" instead of "1") if desired.

Table 2 lists the address location assignments of the system 10 that are decoded by the various decoders. The alphabetical characterizations in parentheses refer to characterizations in the test instruction program listing (see Appendix).

TABLE 2

| System Address Allocations | | | |
|---|---|---|---|
| Address | Description | Decoder | FIG. |
| 0001,0002,0003 | parallel I/O ports A, B, C | 110,128 | 4,5 |
| 0000-07FF | 2716 chip 16 PROM | 96,144 | 3,4 |
| 3F00-3FFF | 8155 chip 18 RAM | 108,142 | 4,5 |
| 4000-43FF | 2114A chips 84,86 RAM | 88,138 | 3,4 |
| 8100 (ESID) | enable SID buffer mux | 224,140 | 2,4 |
| 8110 (DSID) | disable SID buffer mux | 226,140 | 2,4 |
| 8200 (SETB) | load input into PRPG 38 | 170,140 | 4,6 |
| 8201 (PRPGM) | PRPG 38 output to interface bus 82 | 192,140 | 4,6 |
| 8202 (PRPGD) | PRPG 38 output to data bus 54 | 188,140 | 4,6 |
| 8204 (PRPGCM) | clock PRPG 38 via interface bus 82 | 178 | 6 |
| 8205 (PRPGCA) | clock PRPG 38 via address bus 56 | 180,140 | 4,6 |
| 8206 (CLRB) | clear bias flip flop 167 | 173,140 | 4,6 |
| 8207 (PRPGEM) | enable 8219 FF 111 | 117,140 | 4,6 |
| 8208 (PRPGDM) | disable 8219 FF 111 | 289,140 | 3,4 |
| 8300 (SRC) | clock SR 40 | 204,140 | 4,6,8B |
| 8301 (SRD) | SR 40 output to data bus 54 | 210,140 | 4,6 |
| 8302 (SRLFD) | load SR40 from data bus 54 | 200,140 | 4,6 |
| 8400 (EDIS) | turn on display 48 | 276,140 | 3,4 |
| 8401 (DDIS) | turn off display 45 | 289,140 | 3,4 |
| 8500 (STRESET) | software reset of control circuit 26 | 155,140 | 4 |
| 8600 (DMUXFL) | load latch 234 from data bus 54 | 128,130 | 4,5 |
| 8601 (DMUXA) | transfer latch 234 | 248,140 | 4,5 |

TABLE 2-continued

| Address | System Address Allocations Description | Decoder | FIG. |
|---|---|---|---|
| 8602 (DMUXB) | data to 8155 port A transfer latch 234 | 252,140 | 4,5 |
| 8603 (DMUXC) | data to 8155 port B transfer latch 234 | 256,140 | 4,5 |
| 8604 (OUTA) | data to 8155 port C transfer 8155 port A data to data bus 54 | 266,140 | 4,5 |
| 8605 (OUTB) | transfer 8155 port B data to data bus 54 | 270,140 | 4,5 |
| 8606 (OUTC) | transfer 8155 port C data to data bus 54 | 274,140 | 4,5 |

The structures of the various decoders can be combined to avoid duplication of circuitry. For example, decoders 88, 96, 108 and 110 can also serve as the decoders 138, 144, 142 and 128, respectively. The pseudo-memory address decoder 140 (which develops the P-MEM signal, discussed above, may be constructed to use the outputs of the decoders 155, 170, 180, 188, 192, 200, 204, 210, 224, 226, 238, 248, 252, 256, 266, 270, 274 and 276 and provide a "1" output whenever any of those decoders has a "1" output. Also, portions of the decoders can be combined so that, for instance, the decoding of common first and second digits (e.g. 8300, 8301 and 8302) is performed by structure common to several decoders (e.g. 200, 210 and 204).

The program for defining the sequence of test instructions to be performed by the system 10 for testing its functional operation is listed in the Appendix. The self-test program is written in the Intel 8085 assembly language and approximately 700 bytes of the PROM 16 memory locations are used. The remaining ROM storage space of the PROM 16 are used non-testing purposes. The flow charts, FIGS. 9-17, give an overview of the testing process. Comments have been included with the program listing in the Appendix for ease in understanding.

Generally, the testing sequence for testing the functional operation of the microprocessor system 10 using the built-in apparatus, proceeds as follows:

1. The power supply is turned on. This action activates the clock & reset circuit 22 which generates a reset signal that clears all of the flip-flops in the system, including the flip-flops of the PRPG 38 and SR 40. Turning on the power supply automatically causes the microprocessor 12 to vector to the first PROM 16 memory location address 0000 (see Appendix).

2. The instruction in the PROM 16 memory location cell 0000 is fetched by the microprocessor 12, the microprocessor 12 executes it and enters a wait-for-interrupt mode. When the test initiation switch SW 46 (FIG. 2) is pressed, a logic "0" is generated which is fed into the RST 5.5 interrupt input pin of the microprocessor 12. This action causes the microprocessor 12 to go to the PROM memory location 002C which is the initial address of the stored testing program. In the described embodiment, the testing program is stored in the PROM 16. The testing program may, however, be stored within the system 10 in any other suitable device, whether on-board or off-board the microprocessor 12.

The testing program listed in the Appendix is divided into a plurality of subsections, referred to herein as modules. The first module of the program (the sequence of which is shown in the flow diagram FIG. 9) performs the most fundamental test and is called "Kernel Test" The kernel test checks the microprocessor 12 to determine whether it is sufficiently functionally operable to perform under the control of a few simple instructions. This module also checks for proper functioning of the data, address and control buses 54, 56, 58 as well as the display 48 which serves to display detected faults. If the system satisfactorily performs the first test module, the display 48 will display in sequence the hexadecimal numbers 0-F. If this does not occur, there is a detect in the basic functional operation of the "kernel" of system 10, i.e. in the microprocessor 12, the buses 54, 56, 58, the display 48 or the PROM 16. This defect is indicated to the outside world by a numeral "1" appearing on the display 48. If the first module is satisfactorily completed, program execution moves on to a PRPG test module outlined in the flow chart FIG. 10.

In the PRPG test, the PRPG 38 is first loaded with a known bias word. Then the PRPG is clocked 255 times. At the end of the 255th time, the contents of the PRPG 38 are transferred to the accumulator of the microprocessor 12. The contents of the microprocessor 12 are then compared with a known value stored in the PROM 16. This known value is the result of an independent computation, not done by the test apparatus. If the two values agree, the PRPG 38 is diagnosed as fault-free; if not, a PRPG fault is indicated by a numeral "2" on the display 50 (see Table 1).

Figure 11:
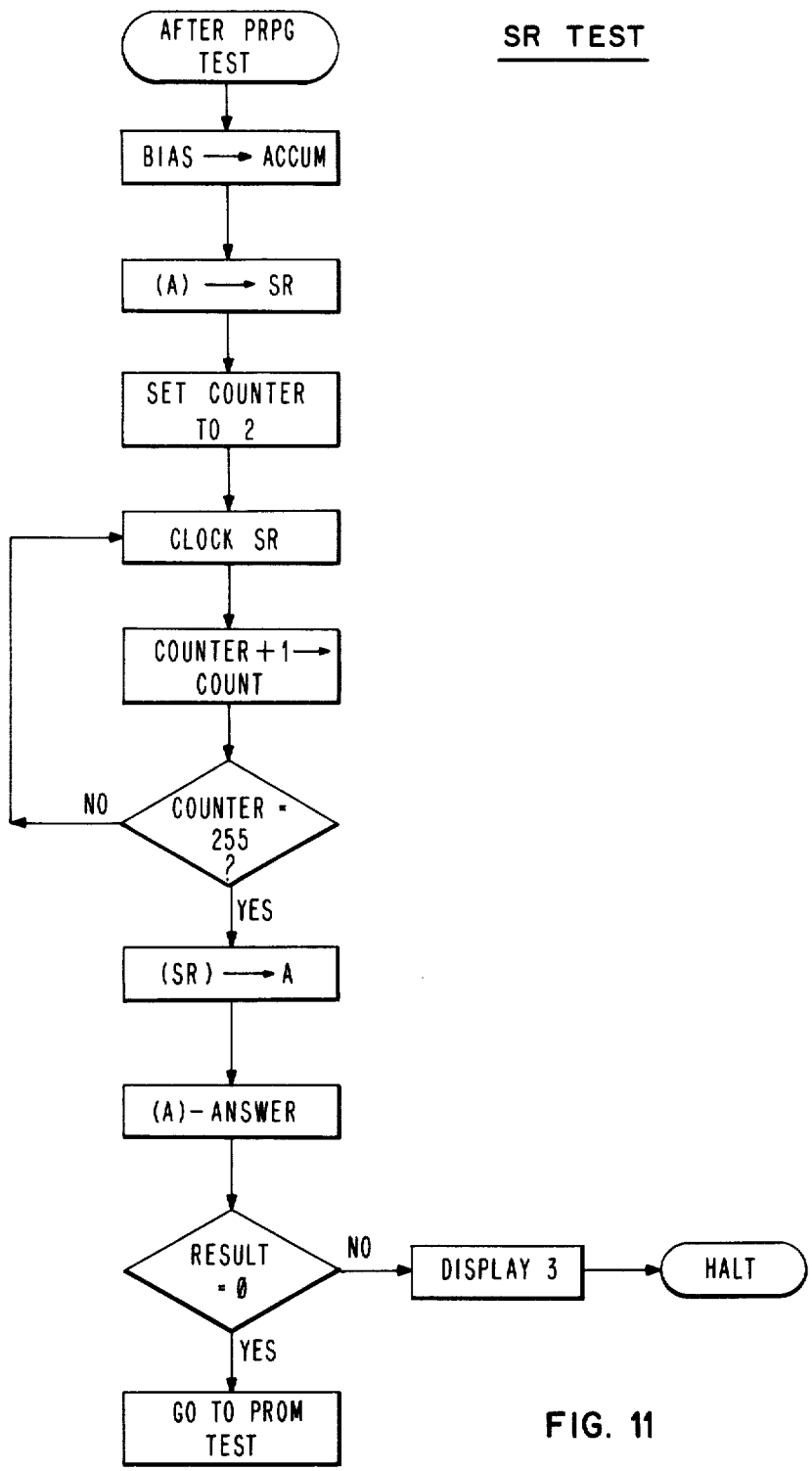
FIG. 11 is a flow-chart of a signature register test in the microprocessor system of FIG. 1.
Figure 12:
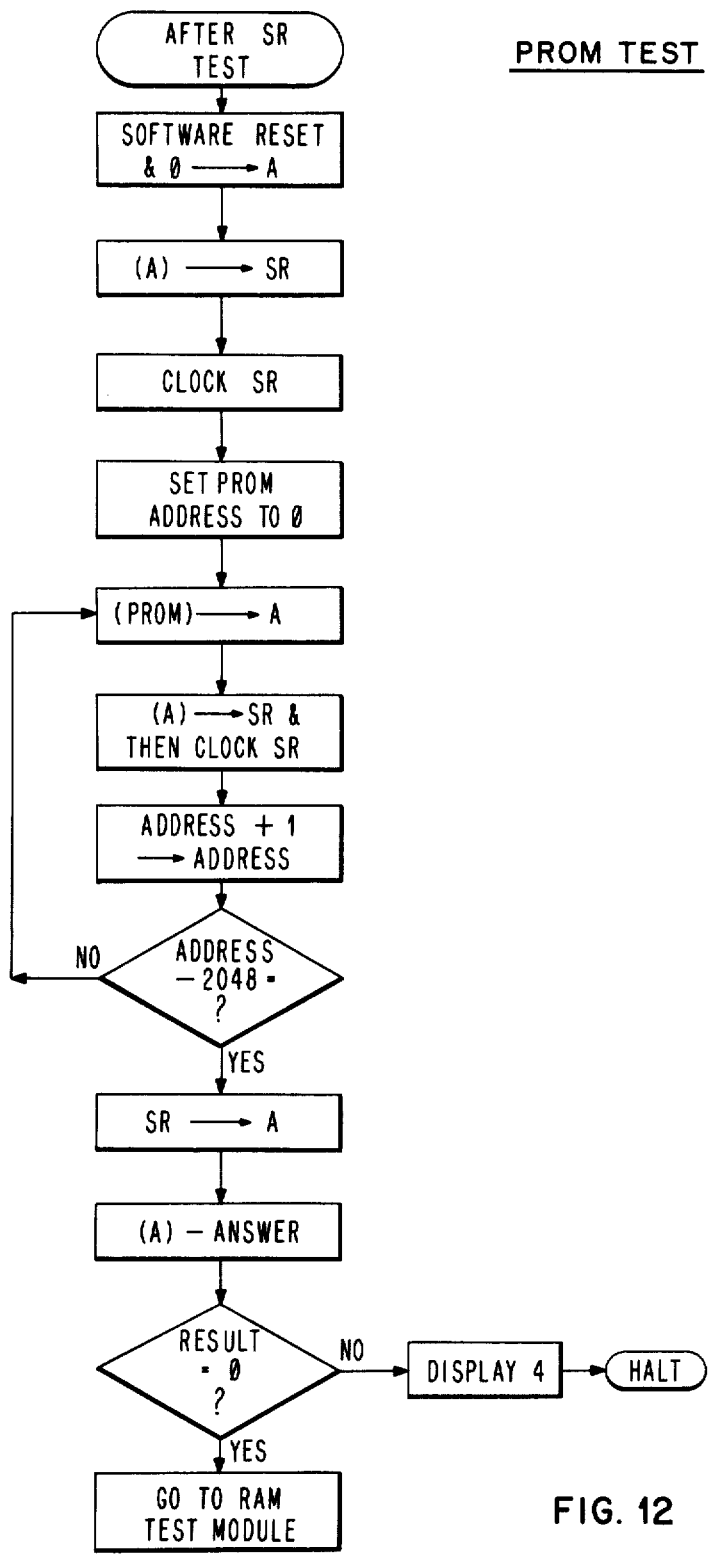
FIG. 12 is a flow-chart of a PROM test in the microprocessor system of FIG. 1.

3. Satisfactory completion of the PRPG test module advances program execution to a signature register (SR) test module. The flow chart for this test sequence is shown in FIG. 11. In this module, the SR 40 is first loaded with a known bias word. Then it is clocked 255 times. The same procedure used in testing the PRPG 38 is used in testing the SR 40.

4. After satisfactory completion of the SR test module, program execution is advanced to a PROM test module, program execution is advanced to a PROM test module for conducting a functional operational test of the PROM 16. The flow chart for this module is given in FIG. 12. In this module, the first 2,047 bytes of the PROM 16 are transferred one byte at a time to the SR 40 which is clocked each time. After 2,047 clock pulses, the contents of the SR 40 are transferred to the accumulator of the microprocessor 12 for comparison with the contents of cell 2,048 of PROM 16. If the two numbers agree, the PROM is diagnosed to be good; if not, the PROM is diagnosed as bad.

5. Program execution is then advanced to a RAM test module for testing the RAM 14. The testing sequence is illustrated by the flow chart FIGS. 13A and 13B. In this testing sequence, the first 256 bytes of the RAM 14 are filled with 256 numbers of test data generated by the PRPG 38. The second 256 bytes of the RAM 14 are filled with the same 256 PRPG 38 numbers to which the current memory location address has been added (i.e. PRPG + current address). The third 256 bytes of the RAM 14 are filled with PRPG + current address and the fourth 256 bytes of the RAM 14 are filled with PRPG + current address. Next, all 1-K bytes of the RAM 14 are transferred to the SR 40, one byte at a time and the SR 40 is clocked after each byte. The signature in the SR 40 after all 1-K bytes have been transferred into it is then transferred to the accumulator of the microprocessor 12 for comparison with a known answer stored in the PROM 16. (If the two numbers agree, the RAM 14 is diagnosed as good. Otherwise the RAM is diagnosed as bad.)

6. After satisfactory completion of the RAM test, program execution is passed on to the "MPU II Test" module. The test sequence of this module is illustrated by the flow chart FIG. 14. In this module, representative instructions from all types of instructions in the microprocessor 12 instruction repertoire are executed. Intermediate results are checked with known good answers. If the computer value differs from the known good answer, the MPU of the microprocessor 12 is designated as bad. If they agree, the MPU is designated as not bad.

Figure 15B:
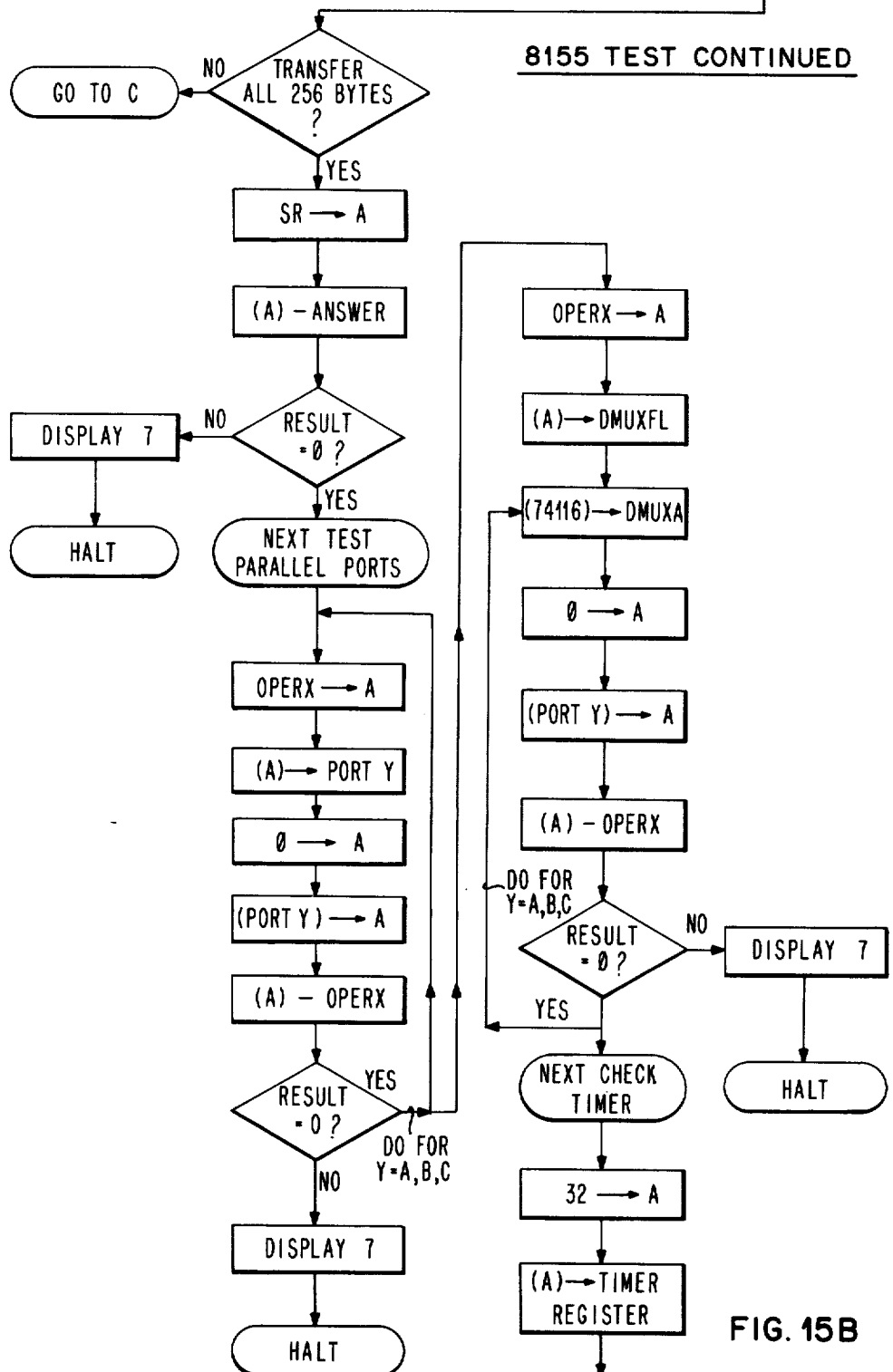
FIG. 15, which consists of FIGS. 15A, 15B and 15C, is a flow-chart of a test of an Intel 8155 integrated circuit in the microprocessor system of FIG. 1.
Figure 15C:
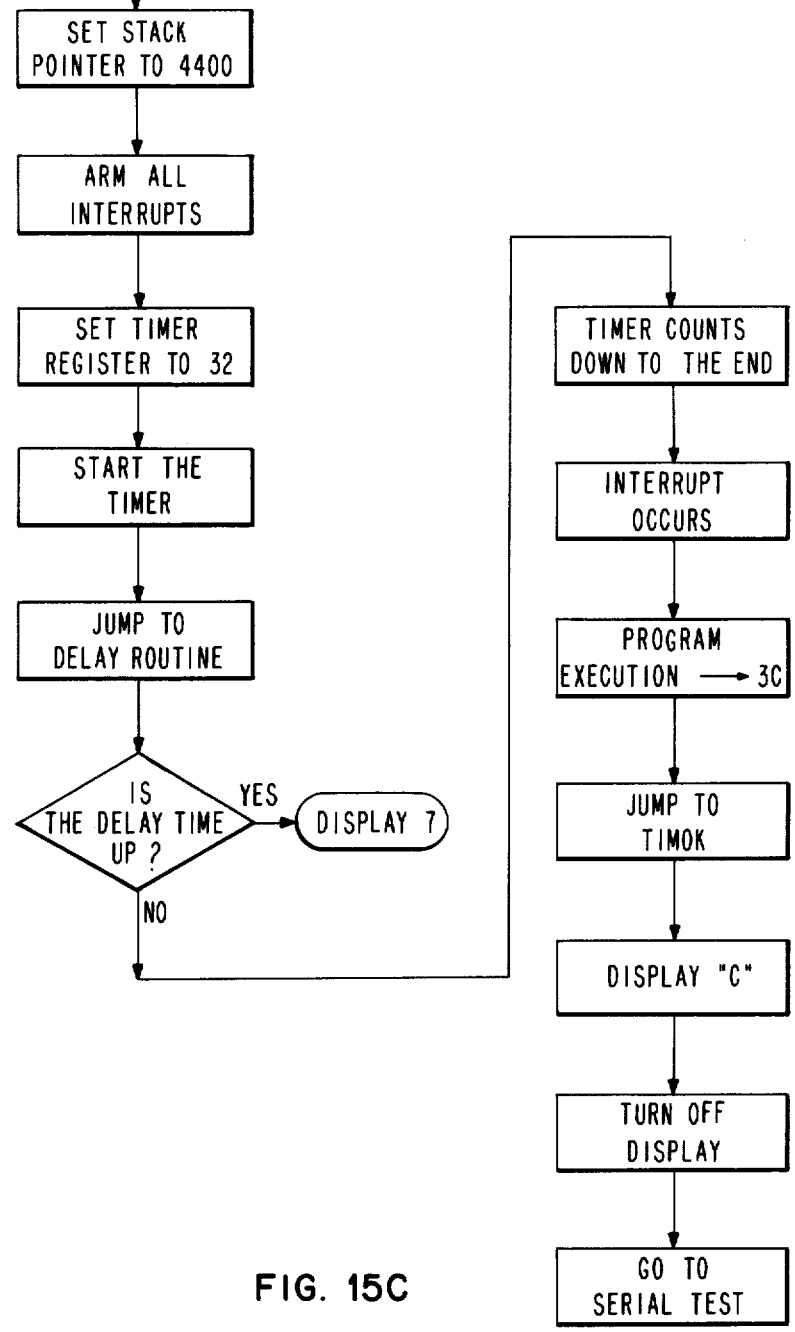

After the "MPU II Test", the 8155 test module sequence charted in FIGS. 15a-15c is performed. In this module, the on-board RAM located within the 8155 chip 18 (FIG. 5) is tested first. The procedure for testing the internal RAM is identical to that used in testing the external RAM 14, described above. Next, the three parallel ports A, B and are tested. The three ports are tested first as input ports and then as output ports. Test data is used which will detect a "stuck-at-0" or a "stuck-at-1" fault on any of the port data paths. Thereafter, the count-down timer of the chip 18 is tested.

First, a known number is loaded into the 8155 timer register. The timer is then clocked and while the timer is counting down, program execution is passed on to a delay-time loop routine. As written in the program listed in the Appendix hereto, if the timer is working correctly, the timer should "time out" before the delay-time routine gets out of its loop. Upon counting down to the end value, the timer issues an interrupt signal which is fed to the RST 7.5 interrupt input pin of the microprocessor 12 (FIG. 2). This action causes the program execution to go to the address 003C. From 003C, program execution is transferred to a subroutine which displays the hexadecimal digit "C" on the display 48. This display indicates that the timer is good; if no "C" is displayed, the timer is designated as bad.

When the preceeding test module has been completed satisfactorily, program execution moves onto the serial I/O test module sequence shown in flow chart FIG. 16 In this module, a "1" and a "0" are placed, one number at a time, in the most significant bit of the accumulator and are sent out to the SOD pin of the microprocessor 12 (FIG. 2). This data is captured by the serial port test logic circuitry 42 and returned to the microprocessor 12 by means of the SID pin of the microprocessor 12. In each case, the captured data is compared with what was earlier transmitted. If there is coincidence, the serial port is designated as good; otherwise it is designated as bad.

Figure 17:
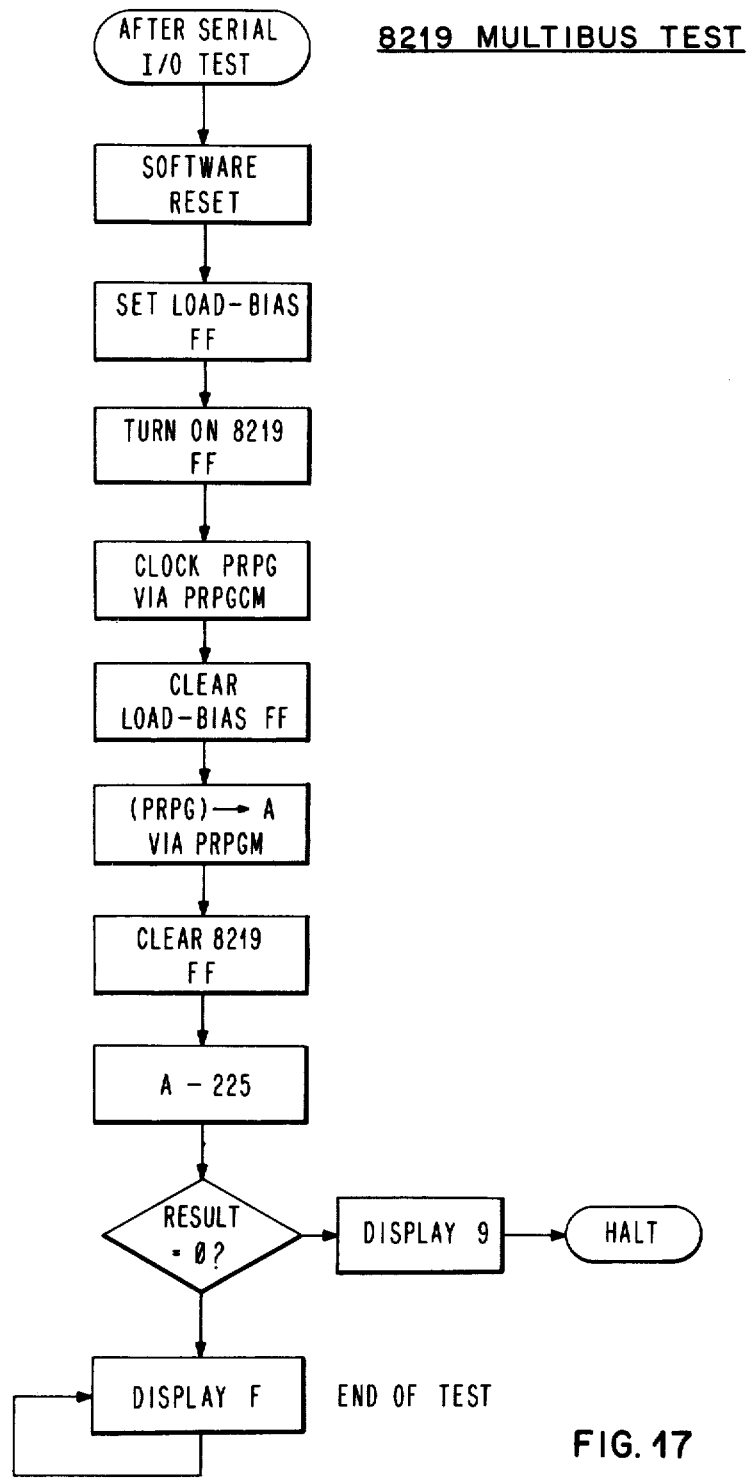
FIG. 17 is a flow-chart of an Intel 8219 multibus test in the microprocessor system of FIG. 1.

7. The next test module is an 8219 Multibus access arbitrator (MAA) test module, the flow of which is shown in FIG. 17. In this module, the PRPG 38 is clocked by the address lines of the interface bus 82 (FIGS. 4 and 6). Then the output of the PRPG 38 is transferred to the accumulator of the microprocessor 12 by means of the data lines of the interface bus 82. The contents of the accumulator are compared with a predicted good answer. If they agree, the 8219 chip 112 is designated as good; if not, the 8219 is designated as bad. "Multibus" refers to an Intel interface bus system.

8. When the 8219 test module has been executed satisfactorily and no fault has been detected, the display 48 is instructed to display an "F" for "fine", to indicate that the tested overall functional operations of the microprocessor system 10 were performed correctly.

The detailed instructions for each module of the test program listed in the Appendix are stored in the PROM 16 at the address locations designated in Table 3.

| Test Module PROM 16 Address Locations | | |
|---|---|---|
| Test Module | Address Locations | Flow Chart FIG. |
| Kernel | 008A-00CB | 9 |
| PRPG | 00CC-00F2 | 10 |
| SR | 00F3-013B | 11 |
| PROM | 013C-016B | 12 |
| RAM | 016C-01CB | 13A,13B |
| MPU II | 01CC-024A | 14 |
| 8155 | 024B-033F | 15A-15C |
| Serial I/O | 0340-0360 | 16 |
| 8219 Multibus | 0361-0383 | 17 |

At system power up, the pointer of the microprocessor 12 in the microprocessor system 10 will automatically go to the PROM 16 location 0000 which will initialize a set of instructions which will load the interrupt circuits of the microprocessor 12 so that it will honor a test sequence interrupt request. The program jumps to the location 0080 (INIT) which sets a stack pointer to a location 4400. This makes sure that later on when use of the stack is desired, the microprocessor will know which location to address. The number 4400 is arbitrarily chosen to suit the preferences of the program designer. Thereafter, a decimal number 18 (00011000 in binary) is loaded into the accumulator and an instruction SIM is executed. The SIM instruction serves to arm all of the interrupts. Specifically, this tells the microprocessor 12 to honor any subsequent interrupt signals that come to the microprocessor. If this is not done, the microprocessor will ignore interrupts.

When a test sequence interrupt occurs, the program automatically goes to a location 002C. The switch SW 46 serves as the switch means for actuating the test sequence and is connected to the RST 5.5 interrupt input pin of the microprocessor 12 as described above. When manually closed, swich SW 46 initiates the test program and begins the testing sequence which continues either until successful test completion or until a defective element of the system 10 is identified.

At location 002C, the program jumps to an instruction labelled BEGIN which is located at program location 008A. At this location the stack pointer is again initialized to loca- a location address 4400. This is done by putting 4400 into the stack pointer register.

The correspondence between the flow charts 8-17 and the program instruction locations is shown in Table 3.

The kernel test is specified by the PROM locations 008A through 00CB. Referring to the flow chart FIG. 9 for the kernel test, following power-up, the number corresponding to the binary representation of the decimal number 18 is loaded into the accumulator and thereafter an instruction called SIM is executed. This clears the microprocessor 12 RST 7.5 flip-flop and arms the interrupt of the system. What this means specifically is that the interrupt switch is turned on so that the microprocessor will honor all subsequent interrupt requests. The kernel test itself does not begin until an interrupt occurs.

The system as described in this embodiment is an off-line test so that the system 10 is not performing any application functions at the time a test interrupt occurs by the manual depression of the start test switch 46. It will, however, be appreciated by those skilled in the art that the detailed embodiment described can be modified so that the test can be performed while interrupting on-line operations, whereby the application program is interrupted so that the testing can be done. This might be done, for example, by giving the operation one set of priorities and the test another set of priorities.

When the interrupt (RST 5.5 pin) occurs and the kernel test is begun at PROM location 008A, the first task to be performed in the testing sequence is to have the microprocessor perform a very simple operation, such as adding two numbers. As listed in the source statement in the Appendix, the two numbers have been chosen in such a way that the first operand consists of 10101010 and the second operand consists of 01010101. This offers the advantage that every data line is checked to see that it is not stuck on a logic value of "0" or "1". The first bit makes sure that the first bit is not stuck at a logic "0", the second bit makes sure that the second bit is not stuck at a logic "1", and so forth. The second operand is chosen to have the complementary value, i.e. it begins with "0" and then alternates for each bit position. The combination of the two operands ensures that every line in the data bus is not stuck at a logic "0" or a logic "1"

When the specified operation is executed, the result is a sum which because of the operands chosen is FF in hexadecimal notation, or in other words, every bit will be a logic "1". The purpose here is to make sure that the microprocessor is not dead. If the microprocessor is dead or nonfunctional, it will not add the two specified numbers and give a result of FF. In addition to ensuring that the microprocessor 12 is able to add two numbers, this simple test verifies that each line of the data bus which is external to the microprocessor 12 and which is connected to the PROM 16 is not stuck at a logic "0" or logic "1" value. The instructions that tell the microprocessor 12 to perform the simple addition are specified by the PROM 16. For this reason, it is important to initially test the communication link between the PROM 16 and the microprocessor 12. The specified sequence of instructions for each test module of the complete test sequence resides in the firmware of the PROM 16.

In the source statement listed in the Appendix, the first operand 10101010 is the number that corresponds to the variable which is called "OPER 1" shown in location 008D. For ease in reading the program, instead of using binary numbers, variable names have been used such as "OPER 1", "OPER 2", etc., as the specified test data. In the table beginning on line 548 of the source statement, the hexadecimal (H) or binary (B) values of the various variables are listed. For example, at line 579 the variable "OPER 1" is set equal to the binary numeral 10101010. Likewise, at line 580 the variable "OPER 2" is set equal to the binary numeral 01010101.

Figure 9:
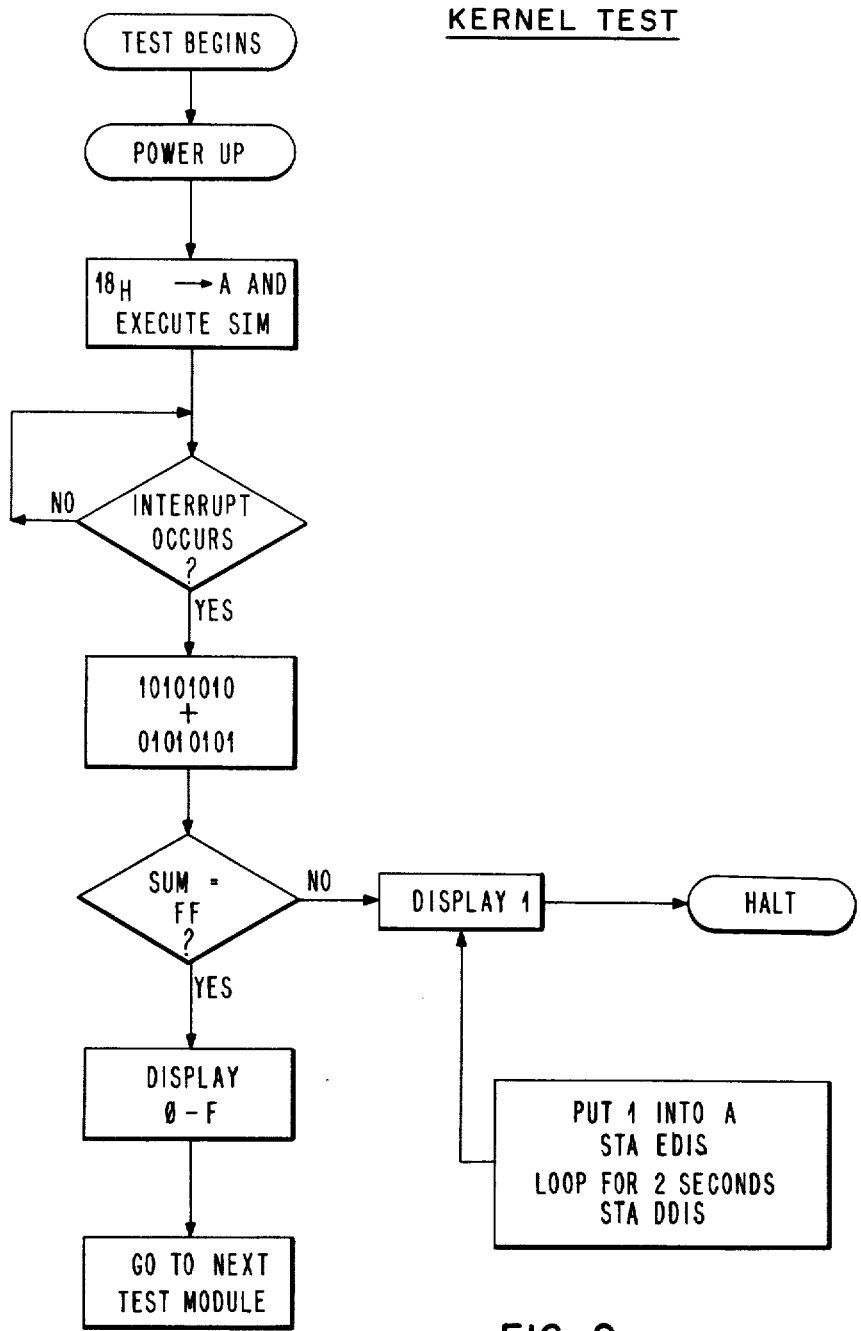
FIG. 9 is a flow-chart of a kernel test of the microprocessor system of FIG. 1.

As shown in the flow chart for the kernel test, FIG. 9, if the sum of the simple addition performed by the microprocessor 12 is not coincident with the predetermined sum FF (representative of the data which would be acquired if the functional operation of the system for the simple addition were error free), the numeral "1" will be displayed on the LED display 48 to indicate that the fault location lies with the hardware performing the kernel test (see Table 1).

If the sum does not equal FF as predicted, a "1" is put into the accumulator and thereafter the instruction "STA EDIS" is performed where "EDIS" stands for enable the display. Specifically "EDIS" has a value or address which is obtained from line 564, where "EDIS" has the address 8400. This address selects or enables the LED display 48. After the display 48 has been turned on, it must be left on long enough so that the displayed numeral can be seen. This is accomplished by instructions which cause the displayed numerals to be looped for two seconds at the end of which time the numerical display is discontinued. This is accomplished by the instruction "DDIS" which stands for "disable display". "DDIS" has an address 8401. If the simple arithmetic test was failed, the numeral "1" is stored on the display and the instruction is given for the test program to go to the initialization sequence "INIT" to ready the test apparatus to permit the restart by manual depression of the start test switch 46.

If the simple addition of the two operands 10101010 and 01010101 correctly results in the predetermined number FF, the program performs the lamp test specified by the test instructions in location 00A0 to 00CB. As specified in these instructions, the LED display 48 is stepped through each of the 16 hexadecimal characters to ensure the proper working of the display 48. This ensures that errors detected in the other test program modules can be properly identified.

Figure 10:
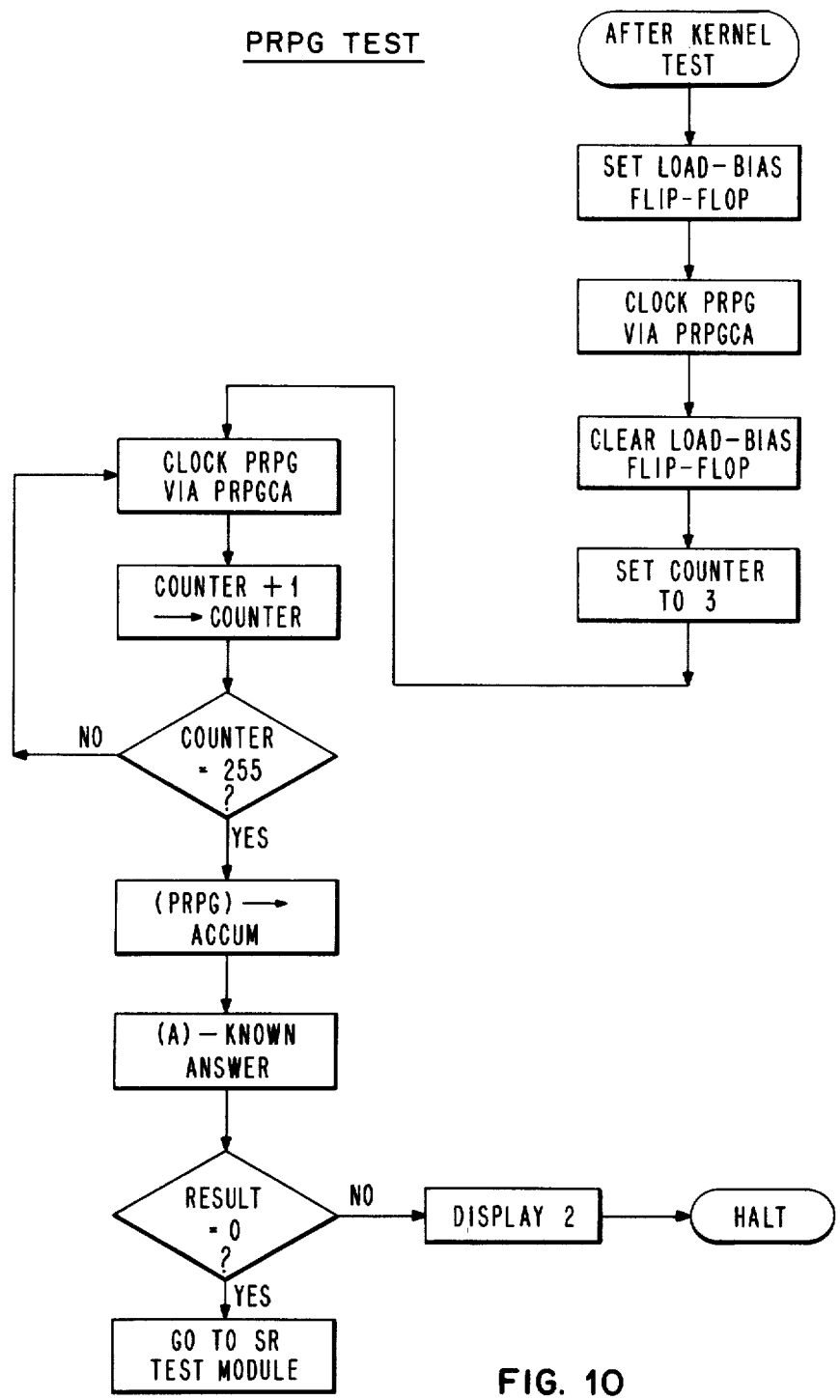
FIG. 10 is a flow-chart of a pseudo random pattern generator test in the microprocessor system of FIG. 1.

Once all 16 hexadecimal numerals have been displayed on the display 48, the program jumps (step 00B3) to the PRPG test which is illustrated by the flow diagram FIG. 10.

The PRPG 38, as discussed above, is a data generator to provide data to the microprocessor system 10 to be acted upon by the system under control of the test instructions specified by the PROM 16 in some of the test modules. Thus, before tests are conducted which utilize the data generated by the PRPG 38, that element is tested to determine whether the data is being correctly generated. The PRPG test sequence is specified by the PROM 16 locations 00CC to 00F2.

As shown in the flow chart for the PRPG test, FIG. 10, the first step is to load a bias number into a flip-flop. The bias number is a number which is put into the flip-flops 156 (FIG. 7) of the PRPG 38 so that it will start from a known condition (i.e. a known random condition). That known condition is determined by the bias number that is put into the register. In this case, the number loaded into the PRPG 38 is 00 (location 00CC).

Thereafter, the PRPG 38 is clocked. The clocking is performed by simulating the storing of information into a memory location. In this case, the memory location is "PRPGCA" which is an abbreviation for PRPG-clocked address lines. This particular name is defined at line 557 (Appendix) and corresponds to the pseudo-memory locations address 8205. Thus, when something is stored in the location 8205, in effect the PRPG 38 is being clocked. After this is done, the load bias flip-flop is cleared, i.e. additional bias numbers are not put into the PRPG 38. This is done by executing the instruction (location 00D7) "CLRB" which clears the load bias flip-flop. CLRB is defined at line 558 and has an address 8206.

Next, the counter is preset to "3". Every clocking step (location 00D4) clocks the PRPG 38 one time. In loading the bias number from the bias flip-flop into the PRPG 38 one clocking step was already performed. Thus, the counter is preset to "3" so that when the count of the counter reaches 256, the PRPG will in effect have only been clocked an additional 255 times. The PRPG 38 is then clocked (location 00DC) an additional 255 times by means of a loop which clocks the PRPG 38 by means of the "PRPGCA" instructions, increments the counter by "1" each time and then checks to determine whether the counter has reached 256. If 256 has been reached, the program continues out of the loop, if 256 has not been reached, the program will loop again until that condition has been met.

When the counter indicates that 256 clockings of the PRPG have been performed (including the original loading of the bias value), the contents of the PRPG registers are loaded into the accumulator by executing the instruction LDA (load the accumulator) from the PRPG (location 00E3). The address for the location "PRPGD" is defined at line 555 as 8202. Thereafter, the contents of the accumulator are compared with a known or predetermined number. If they agree, then the result is "0". This means that the PRPG is operating correctly. On the other hand, if the contents of the accumulator do not agree with the reference data this indicates that the PRPG 38 is not working correctly and the program will display the identification number "2" on the display 48.

If the PRPG test is successfully completed, the program will automatically move to the part of the program which tests the signature register SR 40. The signature register test is very similar to the PRPG test in that a bias number is loaded into the accumulator and then that number is transferred into the signature register 40. The counter is set to "2" and the SR 40 is then clocked 256 times. After that, the contents of the SR 40 are transferred to the accumulator of the microprocessor 12 for comparison of the final signature register output with a predetermined ideal output. This is done by the instruction in the program (location 012C), indicated by "LDA SRD". The predetermined output of the SR 40 for an initially loaded bias number of "0" is the decimal value "127". If the actual answer agrees with the decimal value "127", the SR test is successfully completed and the program continues. If there is a disparity between the acquired test result and the predetermined test result, the test indicates a fault in the functional operation of the signature register 40 and a "3" is presented as an output on the LED display 48. This indicates to the outside world that the SR test module was unsuccessfully completed.

The portion of the test program which tests the PROM 16 is listed in the source statement given in the appendix at locations 013C through 016B. The first test instruction serves to reset all of the flip-flops. The PROM 16 will be used to define the test sequence for running more sophisticated tests of the more complex circuitry in the microprocessor system 10. Thus, before such more elaborate tests are performed, the PROM 16 itself must be tested to determine that it is in proper functioning order. This test is thus performed before some of the more extensive tests are conducted.

The software reset is performed by executing the instruction "SRESET" which has an address defined at lines 566 of the program. After that, the contents of the microprocessor accumulator (which are "0" since all circuits have been cleared by the reset) are transferred to the SR 40 by the instruction "STA SRLFD" (location 014A). The SR 40 is next clocked by executing the instruction "STA SRC". The PROM 16 address is then set to 0000, for example by making a pointer and causing it to point to the first location of the PROM 16. The contents of the PROM at the set location 0000 are then entered into the accumulator. This proceeds for all contents of the PROM, one byte at a time, with the contents of the accumulator each time being transferred into the SR 40 and with the signature register being clocked each time. In effect, the contents of the PROM are transferred one byte at a time into the SR 40, with the clocking causing the signature register to process the information. The address is then incremented and a check is made to see if the end address has been reached. If the end address is not reached, the next contents of the PROM 16 transferred to the signature register in the same way.

When the last location of the stored information from the PROM 16 has been sent to the SR 40, the contents of the SR 40 are transferred into the accumulator by executing the instruction "LDA SRD" (location 015D). The answer is then compared with a known answer. In this case, the answer is predetermined and corresponds to the predicted contents of the SR 40 after successive transfers into the SR 40 of the contents of the PROM 16. If the final contents of the accumulator do not agree with the predetermined number which would be in the accumulator at this stage of the test if the PROM is functioning correctly, the numeral "4" is displayed and held on the display 48. If the result of the PROM test coincides with the predetermined result, this indicates that the PROM test module has been successfully completed and the test program proceeds to the RAM test module found at locations 016C through 01CB.

Figures 13, 13A:
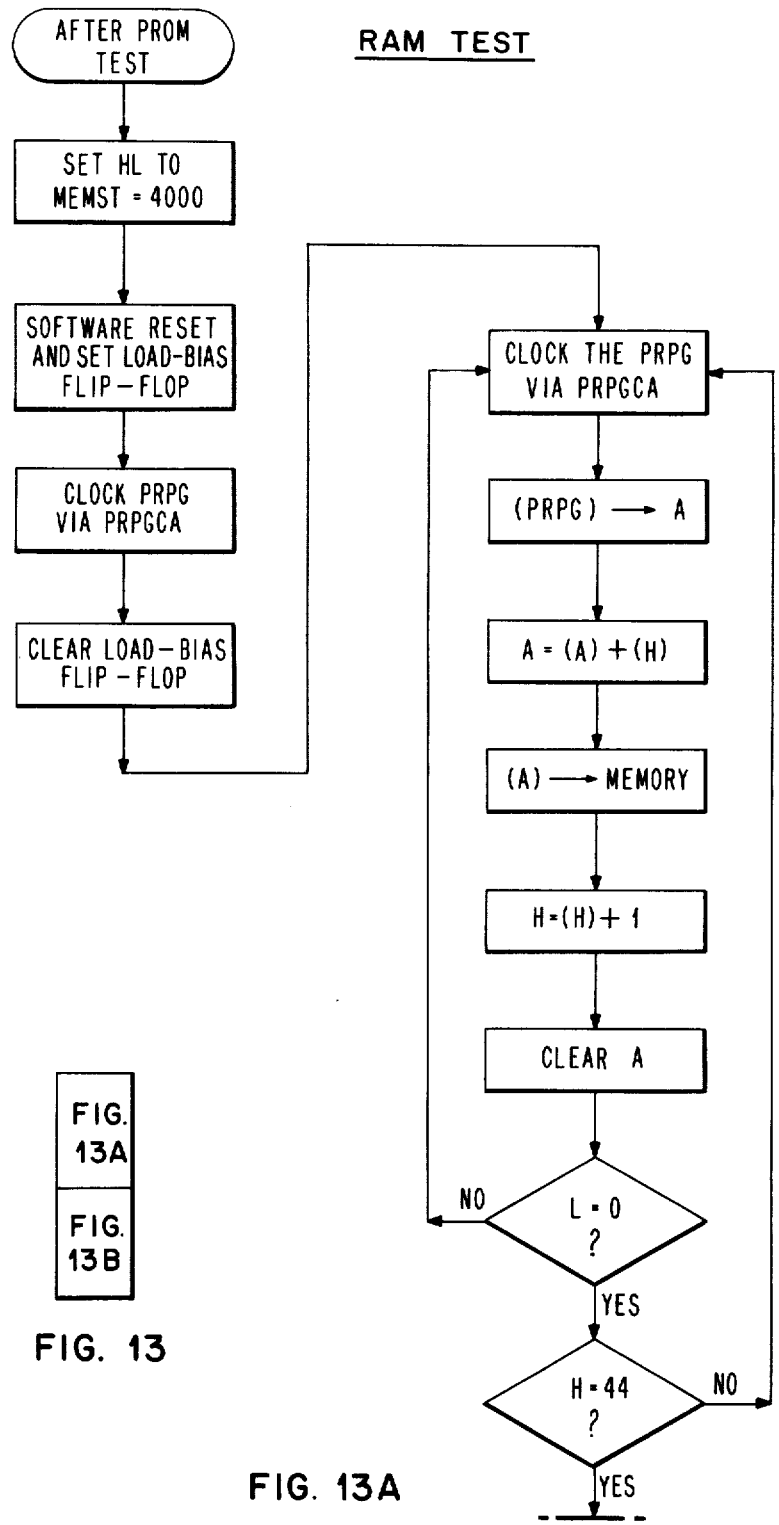
FIG. 13, which consists of FIG. 13A and FIG. 13B, is a flow-chart of a RAM test in the microprocessor system of FIG. 1.
Figure 13B:
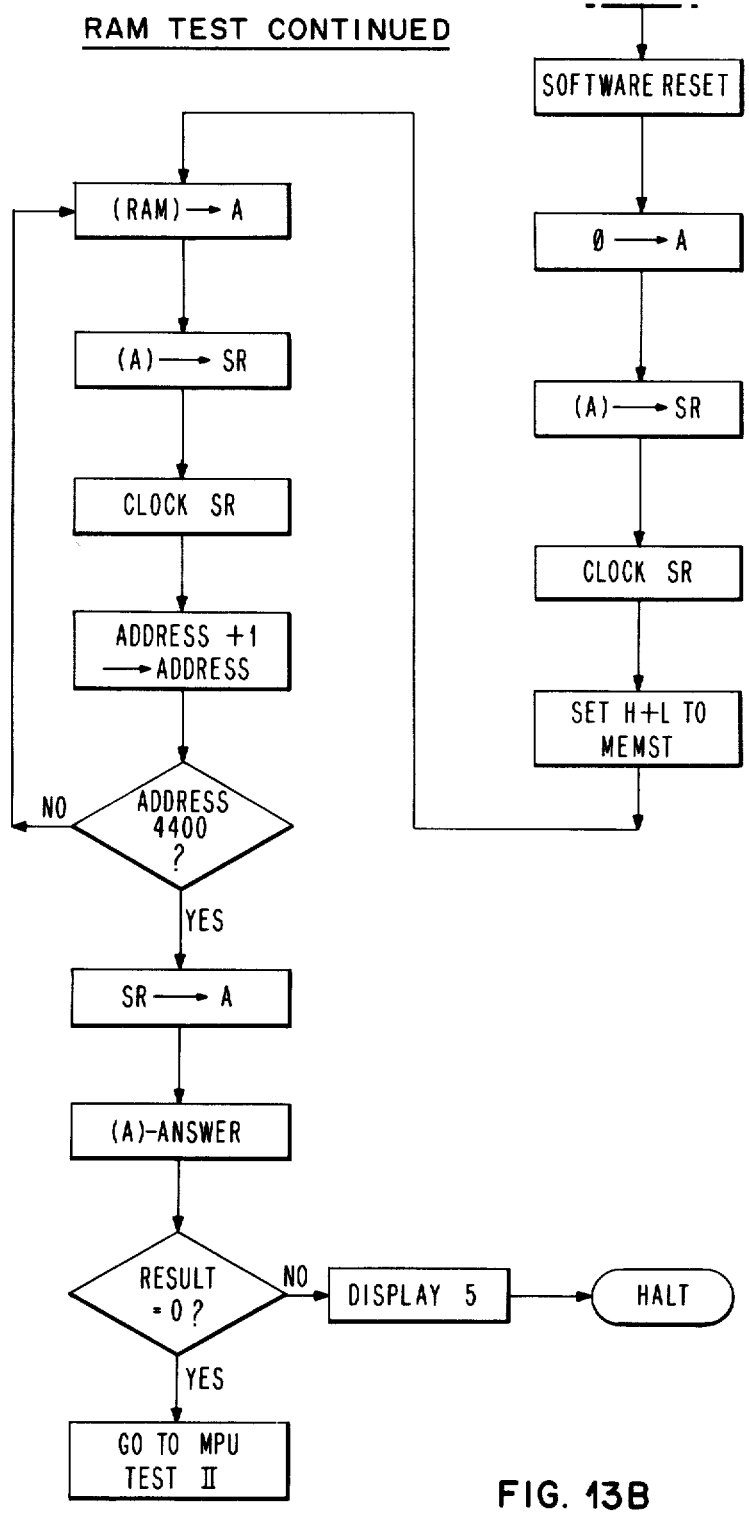
Figure 14:
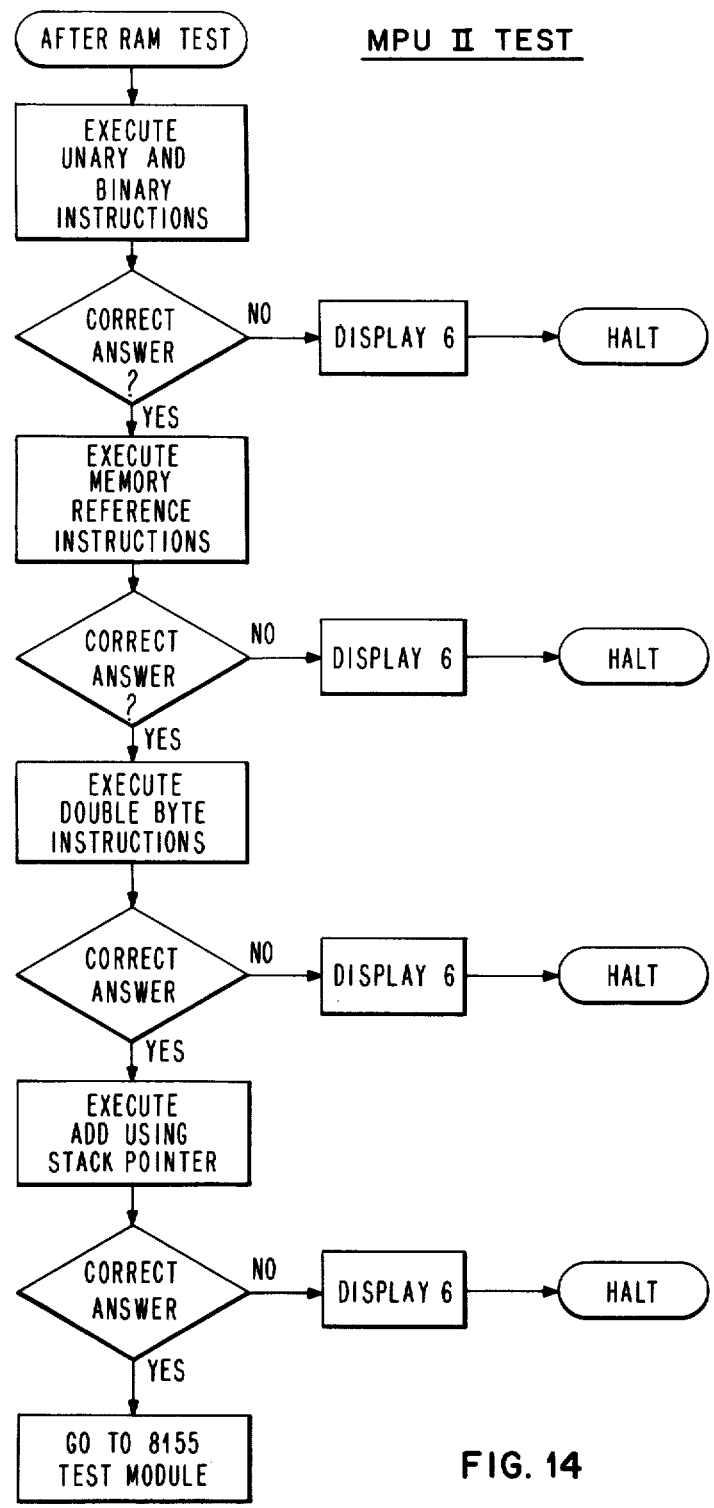
FIG. 14 is a flow-chart of an MPU II test in the microprocessor system of FIG. 1.

As shown by the flow diagrams FIGS. 13A and 13B, the RAM test is begun by setting the pointer register to the beginning location of the RAM 14 which is the address location 4000. Thereafter, a software reset is performed and a bias word is loaded into the flip-flop of the PRPG 38. The PRPG 38 is then clocked (as previously described) with the load bias flip-flop being cleared. The PRPG 38 is then clocked again, in a loop, with the contents of the PRPG being transferred to the accumulator of the microprocessor 12. The contents of the accumulator for each loop, plus the contents of the address pointer, are transferred into the corresponding memory storage element of the RAM 14. The memory is 1K-bytes long, the PRPG 38 is only 256 bytes for 256 clockings. The address information must therefore be stored together with the data in the memory storage locations of the RAM 14 to differentiate the information that is stored in the first 256 bytes, the second 256 bytes, the third 256 bytes and the fourth 256 bytes, so that the same information is not stored in the same 256 byte locations. The contents of the pointer register correspond to the address location. Thus, for the first number that is retrieved from the PRPG 38, the first location of the RAM 14 (4000) which is now in the pointer register is added to the contents of the PRPG and the sum is stored in the first location. This procedure is repeated for locations 4001, 4002, etc.

After each transfer from PRPG into the memory location of the RAM 14, the pointer register "H" is incremented so that it points to the next sequential location in the RAM 14. The accumulator is cleared and then the lower half of the pointer register is checked to see whether or not it is "00". If the lower half of the pointer register has not yet decremented to the value "00", then the procedure is continued through the loop to clock the PRPG again, and so forth.

When the contents of the lower part of the stack register equal "00", a second check is performed to see whether or not the upper half of the pointer register is equal to "44". The reason for this check is that the RAM 14 begins its address location at the address 4000 and ends at the address location 43FF (designation in hexadecimal). The next incrementation after the hexadecimal designation 43FF is 4400. Thus, the higher order bits are checked to see whether the pointer correctly points at the end of the memory storage process to the address location 4400. Once the information has been stored in the RAM 14, the reading of information from the RAM 14 is checked.

This begins with a software reset and the clearing of the accumulator of the microprocessor 12. The contents of the accumulator are then put into the SR 40 (location 019F). The SR 40 is clocked and the pointer register is then set to the beginning of the memory location, in this case to address location 4000. Next, the contents of each location in the memory are successively transferred to the accumulator and from the accumulator into the SR 40. final contents of the SR 40 after this has been done for every memory location of the RAM 14 can then be checked to see if the reading operation is correctly performed.

Thus, the contents of the RAM 14 to which the stack pointer points at any particular moment are loaded into the accumulator of the microprocessor 12. The accumulator contents are then transferred to the SR 40. The signature register is clocked, the address is incremented and a determination is made as to whether or not the incremented address is at the location 4400 which indicates that the read operation is complete.

When the read operation is complete, the result of the processing and compressing of successive inputs from the RAM 14 into the SR 40 is read as a single number into the accumulator of the microprocessor 12, where it is compared with a known predetermined answer. If the final output of the SR 40 (transferred into the accumulator of the microprocessor 12) agrees with the predetermined answer a "0" result is shown, the comparison is being made by subtraction. The known answer with which the test result is compared is read from the PROM 16. If the answers agree, the test proceeds; if the answers do not agree, the numeral "5" is displayed on the display 48.

The microprocessor MPU II test is listed in the test program (see Appendix) at locations 01CC through 024A. This test is a more elaborate test of the microprocessor 12 than the earlier simple test which was conducted under the control of the test instructions in the kernel test module. In the MPU II test, unary and binary instructions are first executed to see whether or not the correct predicted answer is obtained. A unary instruction is one which involves one operand only. One example is an instruction to form the complement of a number. The instruction to form the complement of the hexadecimal number "FF" would give as the result the numeral 00. A binary operation or a binary instruction involves two operands. One example is an instruction to add two numbers. In order to add, both an operand 1 and an operand 2 have to be specified. If the correct answers to this part of the test are successfully obtained, the MPU II test sequence continues. If not, the numeral "6" is displayed on the display 48. The comparison is made between the answer obtained in the microprocessor accumulator by the requested instructions with a predetermined answer stored in the PROM 16.

Next, memory reference instructions are executed (location 01FB) to either retrieve an operand from a memory location or to store a result in a memory location. The test results are compared with predetermined test results to determine the successful functional operation of the microprocessor system 10 for these instructions. If the instructions are successfully performed, the test continues; otherwise, the numeral "6" is displayed.

Thereafter, double-byte instructions are executed (location 0221) by the microprocessor 12 which are instructions that involve an operand that is 16 bits long. Such instructions require that the microprocessor 12 fetch the instruction in two memory cycle times in order to get the two bytes. The test results are compared with stored predetermined test results for correctness. An incorrect result will cause the display of the numeral "6" on the display 48; a correct result will permit the program to proceed. An example double byte instruction is given at location 0027 of the program (see Appendix) in which an operation called "DAD B" is performed. This requests that the contents of the H and L registers be added to the contents of the B and C register. The result is a 16-bit word which is composed with a predetermined answer.

Then, double-byte add instructions using a stack pointer are performed. This is to verify that the stack pointer and also the stack are operating correctly. If this is done correctly, the test sequence proceeds to the 8155 test module instructions; if not, the numeral "6" is displayed on the display 48.

The flow charts for the 8155 test instruction sequence at locations 024B through 033F are set forth in FIGS. 15A-15C. The 8155 test begins with a software reset procedure and a bias setting of the bias-load flip-flop, similar to what has been previously described with respect to other test modules. The PRPG 38 is then clocked by means of the "STA PRPGCA" instruction. The load-bias flip-flop is then cleared and the address pointer is set to the location 3F00, which is the beginning address of the 8155 chip 18 RAM. As noted above, the 8155 chip 18 includes RAM, I/O elements and a timer. The RAM of the chip 18 has 256 bytes of memory location.

After the pointer has been set to the first location in the RAM of the 8155 element 18, the PRPG 38 is clocked, with the contents of the PRPG 38 being transferred into the accumulator following each clocking. For each clocking, the contents of the accumulator obtained from the PRPG 38 are transferred into the RAM of the 8155 element 18, following which the address pointer is incremented to give the next location of the RAM of the 8155 element 18. The procedure is repeated until the RAM of the 8155 element 18 has been addressed 256 times for storage of the output of the PRPG 38 into successive locations of the 8155 RAM. In other words, the contents of the PRPG are transferred into a particular location in the 8155 RAM, the PRPG 38 is clocked and the step is repeated for each of the 256 locations.

After information has been stored in all 256 locations of the 8155 RAM, the accumulator is cleared, the contents of the accumulator (i.e. "0") are transferred into the SR 40 Location 0274), the SR 40 is clocked and the RAM pointer is set again to the 3F00 address of the 8155 RAM.

A procedure is then followed to write the contents of the 8155 RAM just read into the 8155 RAM, out of the 8155 RAM and into the SR 40 for processing and compressing into a single test result signature which can be verified. Thus, as for other test sequences described above, the SR 40 offers the advantage that a single test result is established for verification with a predetermined test result, the single test result being characteristic of the responses of the microprocessor system 10 to each of a plurality of steps in the testing sequence. In other words, one comparison operation can be performed rather than 256 comparison operations. After all 256 bytes of information have been sequentially written out of the 8155 RAM 18 to the SR 40, the contents of the signature register are transferred to the accumulator of the microprocessor 12 where they are compared with a predetermined answer. The comparison is done as before, by a substraction operation where the result "0" indicates coincidence between the actual test results and the predicted or predetermined test results. If the result is other than "0", a numeral "7" is displayed on the display 48 and is held there. Otherwise, the test continues to the next set of instructions.

The next sequence of instructions tests the parallel port I/O operations of the 8155 chip 18 (FIG. 15B). First, the ports are tested for functional operation as outputs (locations 0291-02E2). Then the ports are tested as inputs (locations 02E3-0307). An operand OPERX ("OPER 1", "OPER 2", "OPER 3" or "OPER 4" in the listing) is transferred to the accumulator of the microprocessor 12. Then, the contents of the accumulator are transferred into one of the ports A, B or C of the 8155 chip 18 via the data bus 54 and the pins $AD_0-AB_7$ (see FIG. 5). The selection of port A, b or C is determined by the port address 0001, 0002 or 0003 which is also transmitted to the pins $AD_0-AD_7$ of the chip 18. The test data sent to the port A, B or C is then transferred to the data bus 54 from the pins $PA_0-PA_7$, $PB_0-PB_7$ or $PC_0-PC_5$, respectively, of the chip 18 with the pseudo-memory locations "OUTA", "OUTB" and "OUTC" (having addresses 8604, 8605 and 8606, respectively) directing the read out operation (i.e. selecting which tri-state AND-gates 258, 260 or 262 are active). The entry of data into the chip 18 and the reading out of the ports is done for each of the ports A, B and C. The read out data is analyzed after each step to determine coincidence with the data sent to the chip 8155 ports. If there is a disparity, the display 48 will display the hexadecimal character "7". If there is coincidence, the input function of ports A, B and C is tested.

In testing the input function of the ports A, B and C, an operand (OPERX) is again loaded into the accumulator to port A, B or C. First, the contents of the latch 234 are transferred to port A with an instruction specifying the pseudo-memory location 8601 ("IN PORTA") The accumulator is then loaded with the numeral 0 to ensure that no information is currently in the accumulator (i.e. to clear the accumulator). The contents of port A are then transferred back into the accumulator through the pins $AD_0-AD_7$ of the chip 18 (FIG. 5). Then a comparison is performed between the information ("OPERX") sent to the port (via the latch) and the information received back from the port (via the chip itself). If the information agrees, the test is successful and proceeds further. If the information does not agree, a fault in the parallel port of the 8155 element 18 is indicated by a numeral "7" which is displayed on the LED display 48.

The 8155 continues with a check of the correct functioning of the timer. The timer is checked by loading a number (in this case "32") into the accumulator of the microprocessor 12 and then transferred into the timer register in the 8155 chip 18. The stack pointer is set to the address location 4400 following which the interrupts are armed. The timer register is then set to the same number (arbitrarily chosen in this case) and the timer is started, causing it to count down "32", "31", "30" 0 . . . . At this time, the program execution is instructed to jump to a separate delay routine which is set so that it will come to its end at a predetermined time (sooner than the time that would be required for the count-down timer to count to "0"). If the delay routine gets to the end before the microprocessor 12 is interrupted by the timer, something is wrong with the timer. On the other hand, if the microprocessor is interrupted prior to the time that the delay routine is concluded, this indicates that the timer of the 8155 device 18 is working correctly. The timer has been purposely set to count down from a value which for correct operation will cause the timer to reach "0" before the delay routine is completed.

Correct functioning of the timer means that an interrupt signal will be directed to the RST 7.5 pin of the microprocessor 12 to direct program execution to the location 003C. The contents in location 003C tell the microprocessor to jump to a location or a memory address called "TIMROK" which indicates that the timer is functioning properly. A routine which instructs the display 48 display the letter "C" for two seconds on the display 50. If the timer did not function correctly (i.e. the delay routine was up before interrupt occurred), the numeral "7" is shown on the display 48 to indicate to the outside world that the timer of the 8155 chip 18 functions incorrectly.

The next test performed is a test of the serial input/output functioning of the system and makes use of the serial port test logic 42 shown in FIGS. 1 and 2. In the serial I/O test, a binary number "11000000" is loaded into the accumulator. The most significant bit ("1") is available as serial output data and the next most significant list ("1") serves to arm the serial output data port, i.e. it tells the microprocessor 12 that information is available which should be sent to the outside world. The instruction "SIM" is then executed, which causes the most significant bit to be sent out of the SOD pin of the microprocessor 12 and latched into the serial I/O test circuitry 42. Thereafter, the flip-flop 216 (FIG. 2) is set so that the latched SOD output data can be returned to the SID pin. Next, the accumulator is cleared and the instruction "RIM" is executed which serves to fetch the data from the SID pin and bring it into the accumulator of the microprocessor 12. Thereafter, that input bit is shifted into the carry register and it is checked to see whether it is a numeral "1" or numeral "0". It will be appreciated by those skilled in the art that the procedure just described is Intel specific and that different or other test sequences can be developed to test the corresponding functions and other functions of a microprocessor 12 of other manufacture which may be utilized in microprocessor systems, such as the microprocessor system 10 described herein.

If the test of the serial I/O functional operation of the Intel 8085 microprocessor 12 has been correctly performed, the numeral "1" will appear in the carry register. If this is not the case, a numeral "8" is caused to be displayed by the display 48 and further testing is halted. If the number received at the SID pin is "1", the test continues.

Next, the serial I/O functioning of the Intel 8085 microprocessor 12 is verified by sending out a "0". By testing the I/O operation of the microprocessor 12 in this manner, assurance is given that the serial ports are not stuck in a "0" or "1" status when the instruction "SIM" is executed. Next the hexadecimal number "FF" is loaded into the accumulator. This number puts all "1"'s into the accumulator of the microprocessor 12.

Whereas in the first part of the test, a "1" was sent out and the accumulator was cleared, in this part of the test a "0" is sent out and the accumulator is set with a number which has all its bits as "1". The "0" that is sent out on the serial I/O port is then recaptured into the accumulator and its correct retrieval is verified by comparison. The input bit is then shifted into the carry register and verified to see whether it is a "1". Since a "0" was sent out, if the carry register indicates "1", the serial data communication operation of the microprocessor 12 was functioning incorrectly and a numeral "8" is displayed on the display 48. If, however, the carry bit indicates a "0", the serial data communication operation was successful and the test sequence moves to the next mode which tests the Interface Bus Adapter 20.

The last test instructions serve to test the 8219 Interface Bus Adapter 20 and are stored in the PROM 16 at locations 0361-0399. The adapter 20 allows accessing of the interface bus. In order to be able to do this properly, control address and data information must be capable of being transmitted through the 8219 multibus chip. The software is reset to clear all flip-flops for the test. The load bias flip-flop is set to deliver a bias number to the PRPG 38. The 8219 flip-flop is then turned on. The 8219 flip-flop makes sure that the 8219 is enabled throughout the time that the test is being performed. The PRPG 38 is then clocked once, the load bias flip-flop is cleared and the output of the PRPG 38 is delivered to the accumulator in the microprocessor 12. This is accomplished via the "PRPGM" which stands for "PRPG Multibus". Earlier, the information was delivered from the PRPG through PRPGCA where C stood for clock and A stood for address. In the earlier case, the information was not transmitted through the interface bus. "Multibus" is the trade name of an interface bus manufactured by Intel.

For the present illustrative embodiment, the interface bus captures the information from the PRPG 38 and brings it back to the interface adapter 20. It will be appreciated by those skilled in the art that the Multibus terminal of the Interface Adapter 20 can be replaced by any multiple signal bus which may be found in a microprocessor system 10. The test ensures that the interface bus arbitration circuitry is functioning correctly.

The 8219 flip-flop is cleared once the data has been received from the PRPG 38 via the interface bus 82 ("PRPGM"and then the contents of the accumulator of the microprocessor 12 are compared with the number "255" which is the predetermined output of the PRPG after it is clocked. If the result and the reference output coincide, the test is successful. If there is a disparity a numeral "9" is displayed to indicate a fault in the adapter 20.

After all tests are successfully completed, the character "F" is displayed on the display 48 to indicate the successful completion of the test without the indication of any error. Should the test fail at any part to match the test output data with the reference data, a numeral will be displayed on the display 48 which corresponds to the portion of the test that is unsuccessfully completed.

The built-in apparatus for testing the functional operation of the microprocessor system 10 in accordance with the invention as described above, provides compact, dedicated on-board testing apparatus for performing high speed operational tests, with limited fault location diagnosis. The built-in testing apparatus described offers the capability of having direct access to the accumulator and other arithmetic logic circuitry of the microprocessor for correct operation verification anywhere, at any time, without the need for external testing equipment. Because the test apparatus is on-board together with the microprocessor system, the transmission of information in parallel within the system can be done very rapidly, without the need for looping which is necessary to read the information to external testing equipment in serial fashion. Since the entire test apparatus is self-contained within the microprocessor system, factory and field testing is performable without the need for expensive external test equipment designed for general testing and without the need for sophisticated testing knowledge. There are no unnecessary parts in the built-in equipment.

It should be appreciated that while the testing technique described in detail for illustrative purposes above is an "off-line" test technique, it may be possible to extend the same principles to perform "on-line" testing during system "dead" time or by interrupting low priority operations. Furthermore, while the system described in detail above utilizes an Intel 8085 microprocessor as the fundamental component, the principles of the invention can be applied to microprocessor systems consisting of other components. The invention, in other words, has general application to any microprocessor system.

Furthermore, while the display described is a light emitting diode hexadecimal display capable of diagnosing fault location to only a limited degree, those skilled in the art will appreciate that the display can be implemented to provide much more detailed fault location diagnosing information. The choice of a light emitting diode as a display means is made in the described embodiment for ease of implementation. However, as can be appreciated, the display means 48 may serve to capture the test information and interface to provide the diagnostic results to a printer or transmit the same to some external remote location, such as over the telephone line to a service center. Likewise, test initiation may be performed remotely over the telephone, or otherwise.

Having thus described the invention with particular reference to a preferred form of built-in testing apparatus, it will be obvious to those skilled in the art to which the invention pertains, after understanding the invention, that various other changes and modifications may be made therein wihout departing from the spirit and scope of the invention as defined by the claims appended hereto.

APPENDIX

```
LOC  OBJ        LINE       SOURCE STATEMENT 0000              1 ORG    0000H
                  2 ;
                  3 ;
                  4 ;      MICROBIT SELF-TEST PROGRAM
                  5 ;
                  6 ;      COPYRIGHT 1981 BY P. P. FASANG, SIEMENS CORPORATE RESEARCH & TECHNOLOGY
                  7 ;
                  8 ;      PROGRAM DESIGNED BY P. P. FASANG
                  9 ;      PROGRAM CODED BY D. PIERANTOZZI
                 10 ;      VERSION 1
                 11 ;      REVISION 21, JUNE 3, 1981
                 12 ;
                 13 ;      SKIPPING OF DATE IS DUE TO A LOSS OF FILE IN BAD DISK
                 14 ;
                 15 ;***********************************************************
                 16 ;
                 17 ;      6TH TRY WITH A PROM: THIS VERSION TO DETERMINE PROM TEST SR VALUE.
                 18 ;      WE CAN RUN THIS PROGRAM WITH INTERRUPT UNDER THE CONTROL OF ICE85.
                 19 ;
                 20 ;***********************************************************
                 21 ;
                 22 ;      THIS REVISION PERFORMS ALL OF THE FOLLOWING TESTS CORRECTLY:
                 23 ;
                 24 ;              TEST INITIATION VIA PUSH-BUTTON INTERRUPT;
                 25 ;              KERNEL
                 26 ;              LAMP
                 27 ;              PRPG
                 28 ;              SR
                 29 ;              PROM
                 30 ;              RAM
                 31 ;              MPU2
                 32 ;              8155 - RAM, PARELLEL I/O PORTS, AND COUNT-DOWN TIMER
                 33 ;              SERIAL I/O PORTS
                 34 ;              8219 TEST
                 35 ;
                 36 ;***********************************************************
                 37 ;
                 38 ;
                 39 ;      MEMORY MAP FOR INTERRUPT VECTORS
                 40 ;
0000 C38000      41        JMP    INIT          ;POWER ON SEQUENCE
002C             42        ORG    002CH         ;TEST BUTTON IS PUSHED ?
002C C38A00      43        JMP    BEGIN         ;TEST PROGRAM STARTS AT BEGIN.
003C             44        ORG    003CH         ;THIS VECTOR IS USED BY THE TIMER.
003C C32503      45        JMP    TIMROK        ;IF GET HERE, TIMER IS OK
                 46 ;
0080             47        ORG    0080H         ;CELL 80 IS CHOSEN ARBITRARILY.
0080 310044      48 INIT:  LXI    SP,4400H      ;SET STACK POINTER TO 4400 (IN RAM)
                 49 ; <<<< THIS VERSION DOES NOT USE SPRESET HERE!! >>>
0083 3E18        50        MVI    A,018H        ;PUT 00011000 INTO ACC TO
0085 30          51        SIM                  ;CLEAR RST 7.5 FF & ARM INTERRUPTS
0086 FB          52        EI                   ;ENABLE INTERUPTS
0087 C38700      53 SELF:  JMP    SELF          ;DO SELF LOOP SO WE CAN SEE ON SCOP
                 54 ;
                 55 ;
                 56 ;      WHEN BUTTON IS PUSHED, VECTOR TO PROM LOCATION 002C
                 57 ;
                 58 ;
                 59 ;
                 60 ;      KERNEL TEST: VERIFY THAT MPU CAN ADD 2 NUMBERS
```

```
                61 ;
008A 310044     62 BEGIN:  LXI    SP,4400H       ;INITIALIZE STACK POINTER
008D 3EAA       63         MVI    A,OPER1        ;READ DATA PURPOSELY FROM PROM TO VERIFY
008F 0655       64         MVI    B,OPER2        ;DATA, ADDRESS, AND CONTROL BUSSES
0091 80         65         ADD    B              ;ADD ACCUMULATORS
0092 06FF       66         MVI    B,11111111B    ;PUT FF INTO B
0094 90         67         SUB    B              ;SUBTRACT B FROM A
0095 CAA000     68         JZ     LAMP           ;AND VECTOR TO LAMP TEST IF CORRECT VAL
0098 3E01       69         MVI    A,01H          ;DISPLAY I.D. # 1 IF FAILED THIS TEST
009A 320084     70         STA    EDIS           ;STORE THE I.D. # AT THE HEX DISPLAY
009D C38000     71         JMP    INIT           ;GO TO INIT TO ALLOW RESTART WITH BUTTON
                72
                73 ;       LAMP TEST:    DISPLAY ALL 16 HEXADECIMAL NUMBERS
                74 ;
00A0 0E00       75 LAMP:   MVI    C,00           ;SET LAMP DISPLAY COUNTER TO 0
00A2 79         76         MOV    A,C            ;TRANSFER (C) TO ACCUMULATOR
00A3 320084     77 LAMP2:  STA    EDIS           ;DISPLAY THIS DIGIT
00A6 C3B600     78         JMP    DELAY          ;DISPLAY FOR 2 SECONDS
00A9 320184     79 L3:     STA    DDIS           ;TURN OFF DISPLAY
00AC 0C         80         INR    C              ;GET NEXT LAMP DIGIT
00AD 79         81         MOV    A,C            ;PUT (COUNTER) IN ACCUM
00AE FE10       82         CPI    10H            ;CHECK TO SEE IF
00B0 C2A300     83         JNZ    LAMP2          ;WE HAVE DISPLAYED ALL 16 VALUES?
00B3 C3CC00     84         JMP    PRPG
                85 ;
                86 ;       DELAY SUBROUTINE TO ALLOW VIEWING FOR TWO SECONDS
                87 ;
00B6 0603       88 DELAY:  MVI    B,03H          ;LOAD 3 INTO ACCUMULATOR B
00B8 116F10     89 LOADDE: LXI    D,106FH        ;LOAD DE PAIR WITH TIME CONSTANT
00BB 1B         90 DLAYDE: DCX    D              ;DECREMENT DE PAIR
00BC AF         91         XRA    A              ;CLEAR ACCUMULATOR
00BD BB         92         CMP    E              ;CHECK IF LOWER HALF OF DE PAIR=0
00BE C2BB00     93         JNZ    DLAYDE
00C1 BA         94         CMP    D              ;CHECK IF UPPER HALF OF DE PAIR=0
00C2 C2BB00     95         JNZ    DLAYDE
00C5 05         96         DCR    B              ;DECREMENT MAJOR LOOP COUNT FOR DISPLAY
00C6 F2B800     97         JP     LOADDE
00C9 C3A900     98         JMP    L3
                99 ;
                100 ;
                101 ;
                102 ;      PRPG TEST: IDEA IS TO CLOCK THE PRPG (256 - 1) TIMES
                103 ;
00CC 3E00       104 PRPG:  MVI    A,00H          ;LOAD ACC WITH BIAS VALUE
00CE 320085     105        STA    SRESET         ; SOFTWARE RESET
00D1 320092     106        STA    SETB           ;SET LOAD-BIAS FLIP FLOP
00D4 320582     107        STA    PRPGCA         ;CLOCK IN BIAS VALUE
00D7 320682     108        STA    CLRB           ;CLEAR LOAD-BIAS FLIP FLOP
00DA 0603       109        MVI    B,03H          ; LOOP COUNTER TO 3 !
00DC 320582     110 LOOP1: STA    PRPGCA         ;CLOCK THE PRPG
00DF 04         111        INR    B              ;INCREMENT LOOP COUNTER
00E0 C2DC00     112        JNZ    LOOP1          ;IF LOOP COUNTER NOT ZERO CONTINUE
00E3 3A0282     113        LDA    PRPGD          ;NOW OBTAIN THE PRPG REGISTER VALUE
00E6 FE7F       114        CPI    07FH           ;CHECK ACC FOR CORRECT FINAL VALUE
00E8 CAF300     115        JZ     SR             ;IF CORRECT GO TO -SR- TEST
00EB 3E02       116        MVI    A,02H          ;NOT CORRECT SO
00ED 320084     117        STA    EDIS           ;DISPLAY ERROR CODE -02-
00F0 C38000     118        JMP    INIT           ; GO BACK TO INIT ROUTINE
                119 ;
                120 ;
                121 ;      SR TEST: IDEA IS TO CLOCK THE SR (256 -1) TIMES ALSO
                122 ;           BUT FIRST TEST PARALLEL INPUT LINES
                123
```

```
00F3 AF          124 SR:    XRA    A                    ;CLEAR A
00F4 210183      125        LXI    H,SRD                ;SET POINTER TO THE SR
00F7 320085      126        STA    SRESET ; CLEAR ALL HARDWARE
00FA BE          127        CMP    M          ; IS THE SR = 0 ?
00FB C23401      128        JNZ    E3
                 129
00FE 3EAA        130        MVI    A,OPER1 ; YES
0100 23          131        INX    H          ; POINT TO SR WRITE ADDRESS
0101 77          132        MOV    M,A        ; SET SR = OPER1
0102 2B          133        DCX    H          ; POINT TO READ ADDRESS
0103 320083      134        STA    SRC        ; CLOCK SR
0106 2F          135        CMA               ; COMPLEMENT A
0107 BE          136        CMP    M          ; IS SR = COMPLEMENT OF OPER1 ?
0108 C23401      137        JNZ    E3
                 138
010B 320085      139        STA    SRESET ; YES, CLEAR HARDWARE AGAIN
010E 3E55        140        MVI    A,OPER2
0110 23          141        INX    H          ; POINT AT WRITE ADDRESS
0111 77          142        MOV    M,A        ; SR := OPER2
0112 2B          143        DCX    H          ; POINT AT READ ADDRESS
0113 320083      144        STA    SRC        ; CLOCK THE SR
0116 2F          145        CMA               ; COMPLEMENT A
0117 BE          146        CMP    M          ; IS SR = COMPLEMENT OF OPER2 ?
0118 C23401      147        JNZ    E3
                 148
011B 3E00        149        MVI    A,00H      ; YES, NOW CLOCK SR 255 TIMES
011D 320085      150        STA    SRESET ; CLEAR HARDWARE THEN LOAD BIAS
0120 320283      151        STA    SRLFD                ;TRANSFER TO THE SR
0123 0602        152        MVI    B,02                 ;SET LOOP COUNTER TO 2 !
                 153                                    ;ONLY DO IT 255 TIMES
0125 320083      154 LOOP2: STA    SRC                  ;NOW CLOCK THE SR
0128 04          155        INR    B                    ;INCREMENT THE LOOP COUNTER
0129 C22501      156        JNZ    LOOP2                ;CONTINUE LOOPING
012C 3A0183      157 CHECK: LDA    SRD                  ;LOAD ACC WITH SIGNATURE REGISTER DATA
012F FE7F        158        CPI    07FH                 ;7F WAS COMPUTED BY USING STATE EQUATION
                                               ;IT CORRESPONDS TO STATE 255.
0131 CA3C01      159        JZ     PROM                 ;IF SO, CHECK PROM NEXT
                 160 ;
0134 3E03        161 E3:    MVI    A,03H                ;SR VALUE INCORRECT SO DISPLAY
0136 320084      162        STA    EDIS                 ;ERROR CODE OF -03- IN DISPLAY
0139 C38000      163        JMP    INIT
                 164 ;
                 165 ;
                 166 ;      PROM TEST
                 167 ;      ASSUME 2048 BYTES OF PROM
                 168 ,
013C AF          169 PROM:  XRA    A
013D 320085      170        STA    SRESET               ;PERFORM SOFTWARE RESET
0140 320283      171        STA    SRLFD                ;CLEAR THE SIGNATURE REGISTER
0143 320083      172        STA    SRC                  ;NOW CLOCK THE SR
0146 210000      173        LXI    H,PROMST             ;POINT TO BEGINNING OF PROM
0149 7E          174 PROMT: MOV    A,M                  ;GET A BYTE FROM PROM
014A 320283      175        STA    SRLFD                ;TRANSFER BYTE TO SR
014D 320083      176        STA    SRC                  ;CLOCK BYTE INTO SR
0150 23          177        INX    H                    ;POINT TO NEXT PROM LOCATION
0151 7D          178        MOV    A,L                  ;MOVE LOWER HALF OF PROM ADDRESS TO ACC
0152 FEFF        179        CPI    0FFH                 ;AND SEE IF IT IS =FF?
0154 C24901      180        JNZ    PROMT                ;NO, SO GET NEXT PROM BYTE
0157 7C          181        MOV    A,H                  ;(L)=0 SO CHECK IF (H)=0
0158 FE07        182        CPI    07H                  ;HAVE WE FINISHED ACCESSING ALL BYTES?
015A C24901      183        JNZ    PROMT                ;NO, SO CONTINUE LOOP
015D 3A0183      184        LDA    SRD                  ;MOVE SIGNATURE REGISTER DATA TO ACC
0160 BE          185        CMP    M                    ; (7FF) CONTAIN SR VALUE FOR THE PROM
```

```
0161 CA6C01   186        JZ     RAM           ;CHECK IF OK
0164 3E04     187        MVI    A,04H         ;INCOREECT SUM SO
0166 320084   188        STA    EDIS          ;DISPLAY -04- ERROR CODE
0169 C38000   189        JMP    INIT
              190 ;
              191 ;
              192 ;      RAM TEST
              193 ;
              194 ;
              195 ;      TRANSFER (PRPG) TO RAM, ONE IMAGE AT A TIME
              196 ;
016C 210040   197 RAM:   LXI    H,MEMST       ;LOAD RAM MEMORY START ADDRESS
016F 54       198        MOV    D,H           ;SAVE THE H-L PAIR
0170 5D       199        MOV    E,L           ;IN THE D-E PAIR
0171 AF       200        XRA    A             ;LOAD 0-BIAS WORD TO ACC AND
0172 320085   201        STA    SRESET        ;PERFORM SOFTWARE RESET
0175 320092   202        STA    SETB          ;LOAD BIAS REGISTER
0178 320582   203        STA    PRPGCA        ;CLOCK IN THE BIAS WORD
017B 320682   204        STA    CLRB          ;CLEAR THE BIAS REGISTER
017E 320582   205 MEMLUP: STA   PRPGCA        ;CLOCK THE PRPG
0181 3A0282   206        LDA    PRPGD         ;LOAD PRPG DATA TO ACC
0184 62       207        MOV    H,D           ;LOAD RAM MEMORY ADDRESS FROM
0185 6B       208        MOV    L,E           ;THE D-E PAIR
0186 84       209        ADD    H             ;COMPUTE A=(A)+(H)
0187 77       210        MOV    M,A           ;STORE ACC TO THIS 1/4 OF RAM
0188 23       211        INX    H             ;POINT TO NEXT RAM LOCATION
0189 54       212        MOV    D,H           ;STORE NEXT RAM DIAGNOSTIC ADDRESS
018A 5D       213        MOV    E,L
018B AF       214        XRA    A             ;CLEAR ACC IN ORDER TO
018C BD       215        CMP    L             ;CHECK IF THIS 1/4 RAM DONE?
018D C27E01   216        JNZ    MEMLUP        ;NO, SO CONTINUE LOOP ON THIS 1/4
0190 7C       217        MOV    A,H           ;THIS 1/4 DONE, CHECK IF WE HAVE
0191 FE44     218        CPI    044H          ;TRAVERSED ALL 4/4?
0193 C27E01   219        JNZ    MEMLUP        ;NO, SO PROCESS NEXT 1/4
              220 ;
              221 ;      TRANSFER (RAM) TO THE SIGNATURE REGISTER
              222 ;
0196 210040   223        LXI    H,MEMST       ;POINT TO START OF RAM
0199 54       224        MOV    D,H           ;AND STORE IT
019A 5D       225        MOV    E,L           ;IN THE D-E PAIR
019B AF       226        XRA    A             ;LOAD ACC WITH 0-BIAS AND
019C 320085   227        STA    SRESET        ;PERFORM SOFTWARE RESET
019F 320283   228        STA    SRLFD         ;STORE (A) IN SR BUFFER
01A2 320083   229        STA    SRC           ;CLOCK THE DATA INTO SR
01A5 62       230 MEMRD: MOV    H,D           ;LOAD INTO H & L
01A6 6B       231        MOV    L,E           ;THE RAM ADDRESS
01A7 7E       232        MOV    A,M           ;LOAD RAM DATA TO ACC
01A8 320283   233        STA    SRLFD         ;STORE (A) IN SR BUFFER
01AB 320083   234        STA    SRC           ;AND CLOCK IT IN TO SR
01AE 23       235        INX    H             ;POINT TO NEXT IN RAM CELL
01AF 54       236        MOV    D,H           ;AND SAVE IT IN THE DE PAIR
01B0 5D       237        MOV    E,L
01B1 AF       238        XRA    A             ;LOAD ACC WITH 0 TO SEE IF
01B2 BD       239        CMP    L             ;THIS 1/4 DONE?
01B3 C2A501   240        JNZ    MEMRD         ;NO, SO CONTINUE VERCHECK ON THIS 1/4
01B6 7C       241        MOV    A,H           ;CHECK TO SEE IF
01B7 FE44     242        CPI    044H          ;ALL 4/4 DONE?
01B9 C2A501   243        JNZ    MEMRD         ;NO, SO PROCESS NEXT 1/4
01BC 3A0183   244        LDA    SRD           ;LOAD ACC WITH SR DATA
01BF FE5E     245        CPI    ANS1          ;CHECK RESULT AGAINST CORRECT VALUE
01C1 CACC01   246        JZ     MPU2
01C4 3E05     247        MVI    A,05H         ;IF NOT CORRECT LOAD ERROR CODE OF -05-
01C6 320084   248        STA    EDIS          ;TO DISPLAY
01C9 C38000   249        JMP    INIT
```

```
                250 ;
                251 ;
                252 ;     MPU II TEST: THE PURPOSE HERE IS TO MAKE SURE THAT OTHER INSTRUCTIONS
                253 ;     CAN ALSO BE EXECUTED CORRECTLY.
                254
                255 ;     THE TEST CONSISTS OF FOUR PARTS.
                256 ;
                257 ;     UNARY AND BINARY INSTRUCTIONS
                258 ;
01CC AF         259 MPU2: XRA   A              ;PREPARE TO CHECK:    ((A)=0)
01CD 2F         260       CMA                  ;COMPLEMENT:          ((A)=FF)
01CE 3C         261       INR   A              ;INCREMENT:           ((A)=0)
01CF 3D         262       DCR   A              ;DECREMENT INSTRUCTIONS:((A)=FF)?
01D0 FEFF       263       CPI   0FFH           ;CHECK IF ACC HAS CORRECT VALUE
01D2 CADD01     264       JZ    DBWD           ;CONTINUE DIAGNOSTIC IF OK
                265
01D5 3E06       266 E6:   MVI   A,06H          ;LOAD ERROR CODE OF -06- TO DISPLAY
01D7 320084     267       STA   EDIS           ;SCREEN AND SHOW INDEFINITELY.
01DA C38000     268       JMP   INIT
                269
01DD AF         270 DBWD: XRA   A              ;CLEAR ACCUMULATOR
01DE 010000     271       LXI   B,0000H        ;INITIALIZE (BC)=0
01E1 0B         272       DCX   B              ;CHECK DOUBLE WORD DECREMENT (BC)=FFFF
01E2 03         273       INX   B              ;ALSO CHECK DOUBLE WORD INCREMENT (BC)=0
01E3 B8         274       CMP   B              ;NOW CHECK THE UPPER HALF TO 0
01E4 C2D501     275       JNZ   E6             ;VECTOR TO DISPLAY -06- IF (.NOT. 0)
01E7 B9         276       CMP   C              ;ALSO CHECK THE LOWER HALF FOR SAME.
01E8 C2D501     277       JNZ   E6             ;SAME ERROR HERE
01EB 37         278       STC                  ;SET THE CARRY FLAG
01EC D2D501     279       JNC   E6             ;AND CHECK STATUS
01EF A8         280       XRA   B              ;CLEAR THE B REGISTER
01F0 37         281       STC                  ;SET THE CARRY FLAG
01F1 78         282       MOV   A,B            ;INITIALIZE THE ACC
01F2 2F         283       CMA                  ;NOW (A)=FF
01F3 88         284       ADC   B              ;COMPUTE (A)+(B)+(CF)
                285                            ;NOTE: (A)=FF, (B)=0, (CF)=1
01F4 B8         286       CMP   B              ;CHECK ACC FOR 0
01F5 C2D501     287       JNZ   E6             ;IF NOT, DISPLAY #6
01F8 AF         288       XRA   A              ;CLEAR THE ACC
01F9 2F         289       CMA                  ;SET (A)=FF
01FA 3D         290       DCR   A              ;A=(A)-1    SO (A)=FE
                291 ;
                292 ;     MEMORY REFERENCE INSTRUCTIONS
                293 ;
01FB 219A03     294       LXI   H,NUMBER       ;LOAD MEMORY ADDRESS OF ADDEND
01FE 86         295       ADD   M              ;NOW CHECK ADD FROM MEMORY INSTRUCTION
01FF 37         296       STC                  ;SET THE CARRY FLAG
0200 8E         297       ADC   M              ;COMPUTE (A)+1 GIVING FE+1
0201 FE01       298       CPI   01H            ;NOW CHECK ACC FOR CORRECT SUM
0203 C2D501     299       JNZ   E6
0206 C6FF       300       ADI   0FFH           ;COMPUTE 1+(-1) SO ACC=0?
0208 C2D501     301       JNZ   E6             ;DISPLAY ERROR ON ACC .NOT. 0
020B EEFF       302       XRI   0FFH           ;NOW SET (A)=FF
020D 2F         303       CMA                  ;AND NOW IT SHOULD BE 0
020E FE00       304       CPI   00H            ;BUT VERIFY IT
0210 C2D501     305       JNZ   E6
0213 AF         306       XRA   A              ;DO THIS TO CLEAR THE CARRY FLAG
0214 0600       307       MVI   B,00H          ;PUT 00 INTO B
0216 3C         308       INR   A              ;(A)=1
0217 04         309       INR   B              ;(B)=1
0218 90         310       SUB   B              ;(A)=0?  FLAG STATUS NOW IS 54H.
0219 37         311       STC                  ;SET THE CARRY FLAG. FLAG BECOMES 55H.
021A 98         312       SBB   B              ;CHECK SUBTRACT WITH BORROW LOGIC
```

```
                313                              ;RESULT NOW IS FEH.
021B 2F         314        CMA                   ;COMPLEMENT A. RESULT IS 01H.
021C FE01       315        CPI    01H            ;AND CHECK IT AGAINST EXPECTED VALUE
021E C2D501     316        JNZ    E6             ;IF DISAGREE, DISPLAY #6.
                317 ;
                318 ;      DOUBLE BYTE INSTRUCTIONS
                319 ;
0221 21FFFF     320        LXI    H,0FFFFH       ;LOAD (HL)=FFFF
0224 01FFFF     321        LXI    B,0FFFFH       ;ALSO INITIALIZE (BC)=FFFF
0227 09         322        DAD    B              ;PERFORM HL=(HL)+(BC). RESULT IS FFFEH.
0228 D2D501     323        JNC    E6             ;CARRY SHOULD BE SET
022B AF         324        XRA    A              ;CLEAR ACC AND CARRY FLAG
022C 23         325        INX    H              ;INCREMENT H AND L. RESULT IS FFH.
022D 23         326        INX    H              ;DO IT AGAIN. RESULT IS 00H.
022E BC         327        CMP    H              ;CHECK UPPER HALF OF HL FOR =0
022F C2D501     328        JNZ    E6             ;(H) .NOT. 0
0232 BD         329        CMP    L              ;CHECK LOWER HALF OF HL =0
0233 C2D501     330        JNZ    E6             ;(L) .NOT. 0
                331 ;
                332 ;      DOUBLE BYTE ADD USING THE STACK POINTER
                333 ;
0236 31FFFF     334        LXI    SP,0FFFFH      ;SET STACK POINTER TO FFFF
0239 21FFFF     335        LXI    H,0FFFFH       ;AND INITIALIZE THE HL PAIR TO FFFF
023C 39         336        DAD    SP             ;PERFORM HL=(HL)+(SP). RESULT IS FFFEH.
023D AF         337        XRA    A              ;CLEAR ACC AND THE CARRY FLAG
023E 23         338        INX    H              ;INCREMENT H AND L. RESULT IS FFFFH.
023F 23         339        INX    H              ;DO IT AGAIN. RESULT IS 0000H.
0240 BC         340        CMP    H              ;CHECK UPPER HALF OF HL=0
0241 C2D501     341        JNZ    E6             ;(H) .NOT. 0
0244 BD         342        CMP    L              ;CHECK LOWER HALF OF HL=0
0245 C2D501     343        JNZ    E6             ;(L) .NOT. 0
0248 C34B02     344        JMP    T8155          ;NEXT, WE WILL CHECK THE 8155 CHIP.
                345 ;
                346 ;
                347 ;
                348 ;      THE 8155 TEST HAS THREE PARTS: RAM, PARALLEL I/O, AND TIMER TESTS
                349
                350 ;
                351 ;      FIRST WE WILL TEST THE 256 BYTES OF THE RAM.
                352 ;
024B AF         353 T8155: XRA    A              ;0 THE ACC TO
024C 320085     354        STA    SRESET         ;PERFORM SOFTWARE RESET
024F 320082     355        STA    SETB           ;SET THE LOAD-BIAS FF AND
0252 320582     356        STA    PRPGCR         ;CLOCK THE PRPG
0255 320682     357        STA    CLRB           ;CLEAR THE LOAD-BIAS FF
0258 21003F     358        LXI    H,BUFRAM       ;START OF 8155 BUFFER RAM ADDRESS
025B 320582     359 LDLUP: STA    PRPGCR         ;CLOCK THE PRPG
025E 3A0282     360        LDA    PRPGD          ;LOAD ACC WITH PRPG DATA
0261 77         361        MOV    M,A            ;STORE PRPG DATA INTO 8155 BUFFER RAM
0262 23         362        INX    H              ;POINT TO NEXT BUFFER RAM CELL
0263 7C         363        MOV    A,H            ;CHECK TO SEE IF WE HAVE
0264 FE40       364        CPI    040H           ;CYCLED THROUGH ALL OF BUFFER RAM?
0266 C25B02     365        JNZ    LDLUP
0269 AF         366        XRA    A              ;CLEAR THE ACC
026A 320283     367        STA    SRLFD          ; IN ORDER TO
026D 320083     368        STA    SRC            ;INITIALIZE THE SR
0270 21003F     369        LXI    H,BUFRAM       ;LOAD 8155 RAM START ADDRESS
0273 7E         370 LDRD:  MOV    A,M            ;TRANSFER (M) INTO A
0274 320283     371        STA    SRLFD          ;STORE CELL DATA IN
0277 320083     372        STA    SRC            ;SR AND CLOCK IT
027A 23         373        INX    H              ;POINT TO NEXT CELL
027B 7C         374        MOV    A,H            ;CHECK TO SEE IF WE HAVE
027C FE40       375        CPI    040H           ;CYCLED THROUGH ALL OF RAM?
```

```
027E C27302    376         JNZ     LDRD
0281 3A0183    377         LDA     SRD             ;PUT (SR) INTO ACC
0284 FEAB      378         CPI     ANS2            ;COMPARE TO CORRECT ANSWER
0286 CA9102    379         JZ      PPORT
               380
0289 3E07      381 E7:     MVI     A,07H           ;DOES NOT AGREE WITH GOOD ANSWER SO
028B 320084    382         STA     EDIS            ;DISPLAY ERROR CODE OF -07-
028E C38000    383         JMP     INIT
               384 ;
               385 ;
               386 ;       NEXT, WE WILL TEST THE PARALLEL PORTS:PA, PB, AND PC.
               387 ;
               388 ;       TEST PORTS AS OUTPUTS
               389 ;
0291 3E0F      390 PPORT:  MVI     A,0FH
0293 D300      391         OUT     COMREG          ;ENABLE ALL PORTS TO BE OUTPUT
0295 3EAA      392         MVI     A,OPER1
0297 D301      393         OUT     PORTA           ;SET PORT A TO OPER1
0299 3E55      394         MVI     A,OPER2
029B D302      395         OUT     PORTB           ;SET PORT B TO OPER2
029D 3E33      396         MVI     A,OPER3
029F D303      397         OUT     PORTC           ;SET PORT C TO OPER3
02A1 AF        398         XRA     A
02A2 3A0486    399         LDA     OUTA            ;EXAMINE THE OUTPUT OF PORT A
02A5 FEAA      400         CPI     OPER1           ;OK?
02A7 C28902    401         JNZ     E7
02AA 3A0586    402         LDA     OUTB            ;EXAMINE THE OUTPUT OF PORT B
02AD FE55      403         CPI     OPER2           ;OK?
02AF C28902    404         JNZ     E7
02B2 3A0686    405         LDA     OUTC            ;EXAMINE THE OUTPUT OF PORT C
02B5 E63F      406         ANI     3FH             ;STRIP LEADING TWO BITS
02B7 FE33      407         CPI     OPER3           ;OK?
02B9 C28902    408         JNZ     E7
02BC 3E55      409         MVI     A,OPER2
02BE D301      410         OUT     PORTA           ;SET PORT A TO OPER2
02C0 3EAA      411         MVI     A,OPER1
02C2 D302      412         OUT     PORTB           ;SET PORT B TO OPER1
02C4 3E0C      413         MVI     A,OPER4
02C6 D303      414         OUT     PORTC           ;SET PORT C TO OPER4
02C8 AF        415         XRA     A
02C9 3A0486    416         LDA     OUTA            ;EXAMINE OUTPUT OF PORT A
02CC FE55      417         CPI     OPER2
02CE C28902    418         JNZ     E7
02D1 3A0586    419         LDA     OUTB            ;EXAMINE OUTPUT OF PORT B
02D4 FEAA      420         CPI     OPER1
02D6 C28902    421         JNZ     E7
02D9 3A0686    422         LDA     OUTC            ;EXAMINE OUTPUT OF PORT C
02DC E63F      423         ANI     3FH             ;STRIP LEADING 2 BITS FOR 6 BIT PORT
02DE FE0C      424         CPI     OPER4
02E0 C28902    425         JNZ     E7
               426 ;
               427 ;       NOW TEST THE PORTS AS INPUTS
               428 ;
02E3 AF        429         XRA     A               ; CLEAR A
02E4 D300      430         OUT     COMREG          ; CONFIGURE ALL PORTS AS INPUTS
02E6 3EAA      431         MVI     A,OPER1         ;LOAD ARBITRARY DATA VALUE TO ACC
02E8 320086    432         STA     DMUXFL          ;AND TRANSFER IT TO 74116
02EB AF        433         XRA     A               ;CLEAR THE ACC TO
02EC DB01      434         IN      PORTA           ; READ THROUGH PORT A
02EE FEAA      435         CPI     OPER1           ;CHECK IF CORRECT VALUE RECEIVED
02F0 C28902    436         JNZ     E7              ;INCORRECT VALUE SO DISPLAY ERROR CODE
02F3 AF        437         XRA     A               ;CLEAR THE ACC TO
02F4 DB02      438         IN      PORTB
```

```
02F6 FEAA       439          CPI    OPER1          ;CHECK IF CORRECT VALUE RECEIVED
02F8 C28902     440          JNZ    E7
02FB 3EAA       441          MVI    A,OPER1
02FD E63F       442          ANI    3FH
02FF 47         443          MOV    B,A
0300 DB03       444          IN     PORTC          ; READ PORT C
0302 E63F       445          ANI    3FH            ; STRIP UPPER 2 BITS
0304 B8         446          CMP    B
0305 C28902     447          JNZ    E7
                448 ;
                449 ;
                450 ;        NEXT WE WILL TEST THE COUNT-DOWN TIMER.
                451 ;
0308 310044     452          LXI    SP,4400H       ; REINITALIZE STACK POINTER
030B 3E18       453          MVI    A,018H
030D 30         454          SIM
030E FB         455          EI                    ; ENABLE INTERUPTS
                456 ;
030F 3E20       457          MVI    A,020H         ;LOAD 32 INTO ACC
0311 D304       458          OUT    TIME1          ;XFER TO LOWER BYTE OF TIMER COUNTER
0313 AF         459          XRA    A
0314 D305       460          OUT    TIME2          ;SET UPPER BYTE OF TIMER COUNTER TO 0
0316 3EC0       461          MVI    A,0C0H         ;PREPARE ACC TO
0318 D300       462          OUT    TIMST          ;START TIMER
031A CD8C03     463          CALL   DELAY1         ;KILL SOME TIME WHILE TIMER COUNTS DOWN
031D 3E07       464          MVI    A,07H          ;IF WE GET HERE, TIMER INTERRUPT HAS FAILED
031F 320084     465          STA    EDIS           ;SO DISPLAY ERROR CODE OF -07-
0322 C38000     466          JMP    INIT
                467 ;
                468 ;
0325 3E0C       469 TIMROK:  MVI    A,0CH          ;RETURN HERE IF TIMER INTERRUPT IS OK
                470                                ;PUT 'C' INTO THE ACCUMULATOR.
0327 320084     471          STA    EDIS           ;DISPLAY 'C' FOR CLOCK/TIMER O.K.
                472
                473 ;        THE FOLLOWING CODES ALLOW A DELAY OF 2 SECONDS
                474 ;        THEY  CAN BE REPLACED BY THE "DELAY" SUBROUTINE IF A HARDWARE CHANGE IS MADE.
                475
032A 0603       476 DELAYC:  MVI    B,03H
032C 116F10     477 LOADDC:  LXI    D,106FH
032F 1B         478 DLAYDC:  DCX    D
0330 AF         479          XRA    A
0331 BB         480          CMP    E
0332 C22F03     481          JNZ    DLAYDC
0335 BA         482          CMP    D
0336 C22F03     483          JNZ    DLAYDC
0339 05         484          DCR    B
033A F22C03     485          JP     LOADDC
                486
                487 ;        AFTER 2 SECONDS , TURN OFF THE DISPLAY.
                488
033D 320184     489          STA    DDIS           ;THIS TURNS OFF THE DISPLAY
                490 ;
                491 ;
                492 ;        SERIAL I/O TEST: SID AND SOD
                493 ;
0340 3EC0       494 SERIAL:  MVI    A,11000000B    ;SET SOD BIT TO A 1 AND ARM SOD.
0342 30         495          SIM                   ;EXECUTE SIM TO SEND OUT THE "1" BIT.
0343 320081     496          STA    ESID           ;ENABLE SID BUFFER MUX
0346 AF         497          XRA    A              ;CLEAR A TO WIPE OUT THE "1" BIT IN SOD
0347 20         498          RIM                   ;EXECUTE RIM TO READ THE BIT AT SID.
0348 17         499          RAL                   ;SHIFT INPUT BIT INTO CARRY
0349 DA5403     500          JC     SERL2          ;PROCEED WITH TEST IF BIT WAS 1
034C 3E08       501 E8:      MVI    A,08H          ;INCORRECT VALUE COMPUTED SO MOVE
034E 320084     502          STA    EDIS           ;ERROR CODE OF -08- TO DISPLAY
```

```
0351 C38000     503           JMP    INIT
0354 3E40       504 SERL2:    MVI    A,01000000B      ;SET SOD BIT TO A 0 AND ARM SOD
0356 30         505           SIM                    ;EXECUTE SIM TO TRANSMIT THE 0 (MSB)
0357 3EFF       506           MVI    A,0FFH          ;LOAD A WITH ALL 1'S TO WIPE OUT
                507                                  ;THE ZERO THAT WE TRANSMITTED.
0359 20         508           RIM                    ;EXECUTE RIM TO READ THE BIT WE SENT OUT
035A 17         509           RAL                    ;SHIFT INPUT BIT INTO CARRY
035B DA4C03     510           JC     E8              ;IF NOT ZERO, GO TO DISPLAY ERROR CODE
                511 ;
035E C36103     512           JMP    BUFR            ; GO TO 8219 TEST IF NO ERROR
                513 ;
                514 ;
                515 ;         8219 MULTIBUS CONTROLLER AND BUS DRIVERS TEST
                516 ;
0361 AF         517 BUFR:     XRA    A               ;INITIALIZE THE ACC TO
0362 320085     518           STA    SRESET          ;PERFORM SYSTEM RESET
0365 320082     519           STA    SETB            ;SET THE LOAD-BIAS FF
0368 320782     520           STA    PRPGEM          ;AND ENABLE 8219 FF
036B 320482     521           STA    PRPGCM          ;NOW CLOCK PRPG VIA MULTIBUS
036E 320682     522           STA    CLRB            ;CLEAR THE LOAD-BIAS FF
0371 3A0182     523           LDA    PRPGM           ;TRANSFER (PRPG) TO ACC VIA MULTIBUS
0374 320882     524           STA    PRPGDM          ;NOW TURN OFF 8219 FF
0377 FEFF       525           CPI    0FFH            ;COMPARE ACC TO CORRECT VALUE
0379 CA8403     526           JZ     STOP            ;IF AGREE, GO TO DISPLAY F FOR FINE
037C 3E09       527           MVI    A,09H           ;INCORRECT VALUE RECEIVED SO
037E 320084     528           STA    EDIS            ;DISPLAY ERROR CODE OF -09-
0381 C38000     529           JMP    INIT
                530
                531
0384 3E0F       532 STOP:     MVI    A,0FH           ;LOAD ACC WITH 'F' FOR FINE
0386 320084     533           STA    EDIS            ;TURN ON THE DISPLAY AND LEAVE IT ON
0389 C38000     534           JMP    INIT            ;THIS IS THE END OF THE TEST. WILL
                535                                  ;GO BACK TO INIT TO ALLOW RESTART.
                536 ;
038C 116F10     537 DELAY1:   LXI    D,106FH         ; TIMER CONSTANT
038F 1B         538 DELAYL:   DCX    D               ; COUNT THE TIMER DOWN
0390 AF         539           XRA    A               ; CLEAR A
0391 BB         540           CMP    E
0392 C28F03     541           JNZ    DELAYL
0395 BA         542           CMP    D
0396 C28F03     543           JNZ    DELAYL          ; TIMED OUT ????
0399 C9         544           RET                    ; YUP
                545 ;
                546 ;   THE FOLLOWING TABLE DEFINES THE CONSTANTS USED IN THE PROGRAM
                547 ;
0000            548 COMREG   EQU    00H              ;8155 COMMAND REGISTER
0000            549 PROMST   EQU    00000H           ;STARTING ADDRESS OF PROM MEMORY
4000            550 MEMST    EQU    04000H           ;STARTING ADDRESS OF RAM MEMORY
8100            551 ESID     EQU    08100H           ;TO ENABLE SID BUFFER MUX
8110            552 DSID     EQU    08110H           ;TO DISABLE SID BUFFER MUX
8200            553 SETB     EQU    08200H           ;TO SET LOAD-BIAS FF
8201            554 PRPGM    EQU    08201H           ;(PRPG) TO DATA BUS BUFFER (MULTIBUS)
8202            555 PRPGD    EQU    08202H           ;(PRPG) TO ON-BOARD DATA BUS
8204            556 PRPGCM   EQU    08204H           ;TO CLOCK PRPG VIA MULTIBUS
8205            557 PRPGCA   EQU    08205H           ;TO CLOCK PRPG VIA ON-BOARD ADDRESS BUS
8206            558 CLRB     EQU    08206H           ;TO CLEAR LOAD-BIAS FF
8207            559 PRPGEM   EQU    08207H           ;TO TURN ON FF FOR ENABLING 8219
8208            560 PRPGDM   EQU    08208H           ;TO TURN OFF FF FOR ENABLING 8219
8300            561 SRC      EQU    08300H           ;TO CLOCK THE SR
8301            562 SRD      EQU    08301H           ;(SR) TO ON-BOARD DATA BUS
8302            563 SRLFD    EQU    08302H           ;(DATA BUS) TO SR (LOADED FROM DATA BUS)
8400            564 EDIS     EQU    08400H           ;TO TURN ON DISPLAY
8401            565 DDIS     EQU    08401H           ;TO TURN OFF DISPLAY
```

```
8500        566 SRESET  EQU   08500H        ;SOFTWARE RESET
8600        567 DMUXFL  EQU   08600H        ;TO LOAD (DATA BUS) INTO 74116 IN 8155 DMUX
            568                              ;FRONT-END LATCH.
8601        569 DMUXA   EQU   08601H        ;TO XFER (74116) INTO PORT A OF 8155
8602        570 DMUXB   EQU   08602H        ;TO XFER (74116) INTO PORT B OF 8155
8603        571 DMUXC   EQU   08603H        ;TO XFER (74116) INTO PORT C OF 8155
8604        572 OUTA    EQU   08604H        ;TO XFER (PORT A) ONTO ON-BOARD DATA BUS
8605        573 OUTB    EQU   08605H        ;TO XFER (PORT B) ONTO ON-BOARD DATA BUS
8606        574 OUTC    EQU   08606H        ;TO XFER (PORT C) ONTO ON-BOARD DATA BUS
3F00        575 BUFRAM  EQU   03F00H        ;STARTING ADDRESS OF 8155 RAM
0004        576 TIME1   EQU   00004H        ;TIMER REGISTER 1:     UPPER BYTE
0005        577 TIME2   EQU   00005H        ;TIMER REGISTER 2:     LOWER BYTE
0000        578 TIMST   EQU   00000H        ;TIMER CONTROL REGISTER
00AA        579 OPER1   EQU   10101010B     ;CHOSEN TO DETECT STUCK-AT FAULTS
0055        580 OPER2   EQU   01010101B
0033        581 OPER3   EQU   00110011B
000C        582 OPER4   EQU   00001100B
039A 01     583 NUMBER: DB    0001B
005E        584 ANS1    EQU   05EH          ;THIS IS NOW BELIEVED TO BO FIXED!
00AB        585 ANS2    EQU   0ABH          ; ANSWER FOR 8155 RAM TEST
0001        586 PORTA   EQU   01H           ;8155 PORT A
0002        587 PORTB   EQU   02H           ;8155 PORT B
0003        588 PORTC   EQU   03H           ;8155 PORT C
            589 ;
07FF        590         ORG   07FFH
07FF E7     591         DB    0E7H          ;PROM TEST SR FINAL CORRECT VALUE
            592         END
```

PUBLIC SYMBOLS

EXTERNAL SYMBOLS

```
USER SYMBOLS
ANS1    A 005E    ANS2    A 00AB    BEGIN   A 008A    BUFR    A 0361    BUFRAM  A 3F00    CHECK   A 012C    CLRB    A 8206
COMREG  A 0000    DBWD    A 0100    DDIS    A 8401    DELAY   A 00B6    DELAY1  A 038C    DELAYC  A 032A    DELAYL  A 038F
DLAYDC  A 032F    DLAYDE  A 00B8    DMUXA   A 8601    DMUXB   A 8602    DMUXC   A 8603    DMUXFL  A 8600    DSID    A 8110
E3      A 0134    E6      A 01D5    E7      A 0289    E8      A 034C    EDIS    A 8400    ESID    A 8100    INIT    A 0080
L3      A 00A9    LAMP    A 00A0    LAMP2   A 00A3    LDLUP   A 025B    LDRD    A 0273    LOADDC  A 032C    LOADDE  A 00B8
LOOP1   A 00DC    LOOP2   A 0125    MEMLUP  A 017E    MEMRD   A 01A5    MEMST   A 4000    MPU2    A 01CC    NUMBER  A 039A
OPER1   A 00AA    OPER2   A 0055    OPER3   A 0033    OPER4   A 000C    OUTA    A 8604    OUTB    A 8605    OUTC    A 8606
PORTA   A 0001    PORTB   A 0002    PORTC   A 0003    PPORT   A 0291    PROM    A 013C    PROMST  A 0000    PROMT   A 0149
PRPG    A 00CC    PRPGCA  A 8205    PRPGCM  A 8204    PRPGD   A 8202    PRPGDM  A 8208    PRPGEM  A 8207    PRPGM   A 8201
RAM     A 016C    SELF    A 0087    SERIAL  A 0340    SERL2   A 0354    SETB    A 8290    SR      A 00F3    SRC     A 8300
SRD     A 8301    SRESET  A 8500    SRLFD   A 8302    STOP    A 0384    T8155   A 024B    TIME1   A 0004    TIME2   A 0005
TIMROK  A 0325    TIMST   A 0000
```

ASSEMBLY COMPLETE,  NO ERRORS

ISIS-II ASSEMBLER SYMBOL CROSS REFERENCE, V2.1        PAGE 1

| Symbol | | | | | | | | | | | | | |
|---|---|---|---|---|---|---|---|---|---|---|---|---|---|
| ANS1   | 245  | 584# | | | | | | | | | | | |
| ANS2   | 378  | 585# | | | | | | | | | | | |
| BEGIN  | 43   | 62#  | | | | | | | | | | | |
| BUFR   | 512  | 517# | | | | | | | | | | | |
| BUFRAM | 358  | 369  | 575# | | | | | | | | | | |
| CHECK  | 157# | | | | | | | | | | | | |
| CLRB   | 108  | 204  | 357  | 522  | 558# | | | | | | | | |
| COMREG | 391  | 430  | 548# | | | | | | | | | | |
| DBWD   | 264  | 270# | | | | | | | | | | | |
| DDIS   | 79   | 489  | 565# | | | | | | | | | | |
| DELAY  | 78   | 88#  | | | | | | | | | | | |
| DELAY1 | 463  | 537# | | | | | | | | | | | |
| DELAYC | 476# | | | | | | | | | | | | |
| DELAYL | 538# | 541  | 543  | | | | | | | | | | |
| DLAYDE | 490# | 491  | 493  | | | | | | | | | | |
| DMUXA  | 569# | | | | | | | | | | | | |
| DMUXB  | 570# | | | | | | | | | | | | |
| DMUXC  | 571# | | | | | | | | | | | | |
| DMUXFL | 432  | 567# | | | | | | | | | | | |
| DSID   | 552# | | | | | | | | | | | | |
| E3     | 128  | 137  | 147  | 161# | | | | | | | | | |
| E6     | 266# | 275  | 277  | 279  | 287  | 299  | 301  | 305  | 316  | 323  | 328  | 330  | 341  | 343 |
| E7     | 381# | 401  | 404  | 408  | 418  | 421  | 425  | 436  | 440  | 447  | | | |
| E8     | 501# | 510  | | | | | | | | | | | |
| EDIS   | 70   | 77   | 117  | 162  | 188  | 248  | 267  | 382  | 465  | 471  | 502  | 528  | 533  | 564# |
| ESID   | 496  | 551# | | | | | | | | | | | |
| INIT   | 41   | 48#  | 71   | 118  | 163  | 189  | 249  | 268  | 383  | 466  | 503  | 529  | 534  |
| L3     | 79#  | 98   | | | | | | | | | | | |
| LAMP   | 68   | 75#  | | | | | | | | | | | |
| LAMP2  | 77#  | 83   | | | | | | | | | | | |
| LDLUP  | 359# | 365  | | | | | | | | | | | |
| LDRD   | 370# | 376  | | | | | | | | | | | |
| LOADDC | 477# | 485  | | | | | | | | | | | |
| LOADDE | 89#  | 97   | | | | | | | | | | | |
| LOOP1  | 110# | 112  | | | | | | | | | | | |
| LOOP2  | 154# | 156  | | | | | | | | | | | |
| MEMLUP | 205# | 216  | 219  | | | | | | | | | | |
| MEMRD  | 230# | 240  | 243  | | | | | | | | | | |
| MEMST  | 197  | 223  | 550# | | | | | | | | | | |
| MPU2   | 246  | 259# | | | | | | | | | | | |
| NUMBER | 294  | 583# | | | | | | | | | | | |
| OPER1  | 63   | 130  | 392  | 400  | 411  | 420  | 431  | 435  | 439  | 441  | 579# | | |
| OPER2  | 64   | 140  | 394  | 403  | 409  | 417  | 580# | | | | | | |
| OPER3  | 396  | 407  | 581# | | | | | | | | | | |
| OPER4  | 413  | 424  | 582# | | | | | | | | | | |
| OUTA   | 399  | 416  | 572# | | | | | | | | | | |
| OUTB   | 402  | 419  | 573# | | | | | | | | | | |
| OUTC   | 405  | 422  | 574# | | | | | | | | | | |
| PORTA  | 393  | 410  | 434  | 586# | | | | | | | | | |
| PORTB  | 395  | 412  | 438  | 587# | | | | | | | | | |
| PORTC  | 397  | 414  | 444  | 588# | | | | | | | | | |
| PPORT  | 379  | 390# | | | | | | | | | | | |
| PROM   | 159  | 169# | | | | | | | | | | | |
| PROMST | 173  | 549# | | | | | | | | | | | |
| PROMT  | 174# | 180  | 183  | | | | | | | | | | |
| PRPG   | 84   | 104# | | | | | | | | | | | |
| PRPGCA | 107  | 110  | 203  | 205  | 356  | 359  | 557# | | | | | | |
| PRPGCM | 521  | 556# | | | | | | | | | | | |
| PRPGD  | 113  | 206  | 360  | 555# | | | | | | | | | |
| PRPGDM | 524  | 560# | | | | | | | | | | | |
| PRPGEM | 520  | 559# | | | | | | | | | | | |

| | | | | | | | | | | |
|---|---|---|---|---|---|---|---|---|---|---|
| PRPGM | 523 | 554# | | | | | | | | |
| RAM | 186 | 197# | | | | | | | | |
| SELF | 53# | 53 | | | | | | | | |
| SERIAL | 494# | | | | | | | | | |
| SERL2 | 500 | 504# | | | | | | | | |
| SETB | 106 | 202 | 355 | 519 | 553# | | | | | |
| SR | 115 | 124# | | | | | | | | |
| SRC | 134 | 144 | 154 | 172 | 176 | 229 | 234 | 368 | 372 | 561# |
| SRD | 125 | 157 | 184 | 244 | 377 | 562# | | | | |
| SRESET | 105 | 126 | 139 | 150 | 170 | 201 | 227 | 354 | 518 | 566# |
| SRLFD | 151 | 171 | 175 | 228 | 233 | 367 | 371 | 563# | | |
| STOP | 526 | 532# | | | | | | | | |
| T8155 | 344 | 353# | | | | | | | | |
| TIME1 | 458 | 576# | | | | | | | | |
| TIME2 | 460 | 577# | | | | | | | | |
| TIMROK | 45 | 469# | | | | | | | | |
| TIMST | 462 | 578# | | | | | | | | |

CROSS REFERENCE COMPLETE

What is claimed is:

1. Apparatus built into a computer system having a microprocessor, said apparatus being adapted for testing the overall functional operation of the system and comprising, in combination:
   memory means, electrically connected to the microprocessor, for storing a sequence of test instructions to be executed by the microprocessor;
   data source means, electrically connected to the microprocessor, for providing test input data to be acted upon by the microprocessor when the microprocessor is under control of the test instructions;
   signature register means, electrically connected to the microprocessor, for acquiring test output data resulting from the functional operation of the microprocessor acting upon said test input data when the microprocessor is under control of the specified test instructions, said signature register producing actual test signatures from said test output data;
   comparator means, connected to receive said actual test signatures, for determining the coincidence or non-coincidence of said actual test signatures with corresponding predicted test signatures representative, respectively, of the test output data that would have been produced if the functional operation of the system were error-free; and
   means, connected to said comparator means, for communicating to outside the system the coincidence or non-coincidence determined by said comparator means.

2. Apparatus as defined in claim 1, wherein the memory means comprises a read-only memory preprogrammed with the sequence of test instructions.

3. Apparatus as defined in claim 1, wherein the data source means comprises a pseudo random number generator.

4. Apparatus as defined in claim 1, wherein the apparatus further comprises means for storing the predicted test signatures and said comparator means is connected to said storage means for receiving the predicted test signatures that are stored in the storage means.

5. Apparatus as defined in claim 1, wherein said communicating means comprises a light emitting diode.

6. Apparatus as defined in claim 1, wherein comparator means further comprises means, connected to receive said actual test signatures, for identifying the part of the system causing a noncoincidence and said communicating means further comprises means for communicating to outside the system the part thus identified.

7. Apparatus as defined in claim 1, wherein said signature register means includes a plurality of bit positions, and wherein said signature register is connected in parallel to said microprocessor.

8. Apparatus as defined in claim 1, further comprising switch means, connected to said microprocessor, for initiating, upon actuation, the execution of said sequence of test instructions.

9. Apparatus as defined in claim 6, wherein said communicating means comprises an alpha/numeric display.

10. A method for testing the overall functional operation of a microprocessor system, comprising the steps of:
    internally specifying a sequence of test instructions to be performed by the system in response to a test initiation signal from the outside world;
    internally providing test input data to be acted upon by the system under control of the test instructions;
    internally acquiring test output data resulting from the functional operation of the system acting upon the generated data under control of the specified test instructions;
    internally processing the test output data to determine the coincidence or disparity of the test output data with reference data representative of the test output data that would have been acquired if the functional operation of the system were error-free; and
    communicating the coincidence or disparity determined to the outside world.

* * * * *